(12) United States Patent
Fujimaki

(10) Patent No.: US 7,455,954 B2
(45) Date of Patent: Nov. 25, 2008

(54) LITHOGRAPHIC PRINTING PLATE PRECURSOR AND POLYMERIZABLE COMPOSITION

(75) Inventor: Kazuhiro Fujimaki, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 10/901,326

(22) Filed: Jul. 29, 2004

(65) Prior Publication Data
US 2005/0026075 A1 Feb. 3, 2005

(30) Foreign Application Priority Data
Jul. 31, 2003 (JP) ............... P. 2003-204915
Jul. 31, 2003 (JP) ............... P. 2003-284335

(51) Int. Cl.
*G03F 7/00* (2006.01)
*G03F 7/004* (2006.01)
(52) U.S. Cl. .............. 430/302; 430/270.1; 430/284.1; 430/945
(58) Field of Classification Search .......... 430/270.1, 430/284.1, 302, 303, 945
See application file for complete search history.

(56) References Cited

U.S. PATENT DOCUMENTS

| | | | |
|---|---|---|---|
| 2,850,445 A | 9/1958 | Oster | |
| 4,708,925 A | 11/1987 | Newman | |
| 5,521,246 A | 5/1996 | Tien et al. | |
| 6,359,025 B1 * | 3/2002 | Snowwhite et al. | 522/64 |

| | | | |
|---|---|---|---|
| 2003/0211420 A1 * | 11/2003 | Oshima | 430/278.1 |

FOREIGN PATENT DOCUMENTS

| | | |
|---|---|---|
| DE | 198 37 601 A1 | 8/1999 |
| EP | 1 136 255 A2 | 9/2001 |
| EP | 1 234 662 A2 | 8/2002 |
| JP | 44-20189 B | 8/1969 |
| JP | 8-276558 A | 10/1996 |
| JP | 11-65105 A | 3/1999 |
| JP | 2000-89455 A | 3/2000 |
| JP | 2002-62648 A | 2/2002 |
| JP | 2002-251008 A | 9/2002 |

OTHER PUBLICATIONS

Partial European Search Report dated Oct. 13, 2004.
European Search Report dated Dec. 30, 2004.

* cited by examiner

*Primary Examiner*—Amanda C. Walke
(74) *Attorney, Agent, or Firm*—Sughrue Mion, PLLC

(57) ABSTRACT

A polymerizable composition containing: (A) a polyurethane compound soluble or swellable in water or an aqueous alkali solution which is obtained by reacting at least one diol compound having an unsaturated bond in a main chain and having a molecular weight of 500 or more with at least one polyisocyanate compound; (B) a radical initiator; and (C) a photothermal converting agent, and a polymerizable composition containing: (A') a polyurethane resin which is soluble or swellable in water or an aqueous alkali solution and has an unsaturated carbon-carbon bond in its side chain; and (B) a radical initiator, wherein the polyurethane resin (A') is obtained by adding an epoxy compound having an unsaturated carbon-carbon bond to a polyurethane resin having carboxyl group.

12 Claims, No Drawings

LITHOGRAPHIC PRINTING PLATE PRECURSOR AND POLYMERIZABLE COMPOSITION

FIELD OF THE INVENTION

This invention relates to a lithographic printing plate precursor and a polymerizable composition. More specifically speaking, it relates to a lithographic printing plate precursor whereby a plate can be directly made using various laser beams from digital signals of a computer or the like, i.e., so-called direct plate making, and a polymerizable composition applicable to image recording materials and the like.

BACKGROUND OF THE INVENTION

In recent years, laser technology has been remarkably advanced. In particular, downsizing and output power up have been made in solid lasers, semiconductor lasers and gas lasers emitting lights in the ultraviolet, visual and infrared ranges of 300 nm to 1200 nm in wavelength. Accordingly, these lasers are highly useful as exposure light sources in direct plate making from digital data available from computers and so on. Studies have been intensively made on recording materials sensitive to these various laser beams. Namely, a positive recording material suitable for infrared lasers which is sensitive to wavelength of 760 nm or longer (see, for example, U.S. Pat. No. 4,708,925) and an acid catalyst-crosslinked negative recording material (see, for example, JP-A-8-276558) are known. Moreover, radical polymerization negative recording materials suitable for ultraviolet lasers or visual lasers are also known (see, for example, U.S. Pat. No. 2,850,445 and JP-B-44-20189).

In general, the recording system employed in such a negative image recording material is as follows. Namely, the material contains a compound emitting radicals by the action of light or heat and a polymerizable compound. Using the radicals emitted by light or heat as an initiator, a polymerization reaction is induced and thus the recording layer in the exposed part is hardened, thereby forming an image part. These negative image recording materials suffer from a problem of being inferior in image forming properties to positive image recording materials in which a recording layer is solubilized by laser irradiation energy.

To elevate the sensitivity, therefore, attempts have been made to employ high-power infrared lasers. In such a case, however, there arises another problem that the recording layer undergoes ablation during laser scanning and thus contaminates the optical system. Furthermore, attempts have been made to employ a chemical amplification recording material (see, for example, JP-A-11-65105) and a recording material with the use of polymerization of a compound having an ethylenic unsaturated bond (see, for example, JP-A-2000-89455). However, these recording materials contains component highly reactive with light or heat. Therefore, undesired reactions frequently occur when handled under a white light lamp or due to a change in the environmental temperature during storage. That is to say, it is feared that these materials are poor in storage stability.

Although a recording material containing a vinyl resin having (meth)acrylate group in its side chain is known as a recording material using polymerization of a polymer compound having an ethylenic unsaturated bond in its side chain (see, for example, JP-A-2002-62648), such a material has only poor printing tolerance. Although a recording material containing a polyurethane resin having (meth)acrylate group in its side chain is also known (see, for example, JP-A-2002-251008), such a material suffers from problems such as having poor development properties in a nonimage part. These problems are seemingly caused by the fact that, since the unsaturated bond is introduced in a large amount into the side chain of the polymer compound for improving sensitivity, interactions between side chain substituents worsens the development properties or interaction between main chains, which closely relates to image strength, is inhibited by steric factor of the side chain substituents, thereby lowering the printing tolerance.

Accordingly, it has been required to develop a lithographic printing plate precursor having well-balanced sensitivity, storage stability, printing tolerance and development properties.

SUMMARY OF THE INVENTION

An object of the present invention which has been completed by considering the problems occurring in the related art is to provide a lithographic printing plate precursor having excellent sensitivity, storage stability, printing tolerance and development properties and a polymerizable composition useful in image recording materials and so on.

As the results of intensive studies, the inventors have found out that the above object an be achieved by using a specific polyurethane compound as a polymer compound acting as a binder in the recording layer of a lithographic printing plate precursor, thereby completing the invention.

Namely, the lithographic printing plate precursor according to the invention is characterized by having a recording layer containing (A) a polyurethane compound soluble or swellable in water or an aqueous alkali solution which is obtained by reacting at least one diol compound having an unsaturated bond in the main chain and having a molecular weight of 500 or more with at least one polyisocyanate compound, and (B) a radical initiator, on a support.

The polymerizable composition according to the invention is characterized by containing (A) a polyurethane compound soluble or swellable in water or an aqueous alkali solution which is obtained by reacting at least one diol compound having an unsaturated bond in the main chain and having a molecular weight of 500 or more with at least one polyisocyanate compound, (B) a radical initiator, and (C) a photothermal converting agent.

It is preferable that the polyurethane compound (A) soluble or swellable in water or an aqueous alkali solution which is obtained by reacting at least one diol compound having an unsaturated bond in the main chain and having a molecular weight of 500 or more with at least one polyisocyanate compound (hereinafter referred to as "specific polyurethane compound") as described herein means compound having one or more unsaturated carbon-carbon bonds in the internal part or a terminal of the main chain direction (i.e., in the repeating unit of the specific polyurethane compound). In the invention, it is preferable that the specific polyurethane compound has the unsaturated carbon-carbon bonds in both of the internal part and a terminal of the main chain. As examples of the unsaturated carbon-carbon bonds, a carbon-carbon double bond, carbon-carbon triple bond and so on can be cited from the viewpoint of radical reactivity.

Taking the removal of a nonimage part (development properties) into consideration, it is preferable that the specific polyurethane compound has a carboxyl group in its side chain.

The term "(meth) acrylic" employed herein means both or either of "acrylic and methacrylic".

Although the mechanism of the invention still remains unclear, the characteristic of the specific polyurethane compound to be used in the invention resides in having an unsaturated carbon-carbon bond at least in the internal part and a terminal of its main chain. Because of having a carbon-carbon double bond or a carbon-carbon triple bond with high radical reactivity in the main polymer chain, this structure has an excellent reactivity and quickly undergoes the formation of a highly dense and rigid crosslinked structure among specific polyurethane compound molecules in response to energy supplied by the exposure. Therefore, it is assumed that a lithographic printing plate precursor containing the specific polyurethane compound as a component of the recording layer can achieve a high sensitivity and excellent printing tolerance.

Because of having an unsaturated bond in the main chain, the specific polyurethane compound according to the invention causes no such problems occurring in the related art using polymer compounds having an unsaturated bond in side chain as described above, i.e., worsening in development properties due to interaction between side chain substituents and inhibition of interaction between main chains due to steric factor of the side chain substituents and, therefore, seemingly provides a lithographic printing plate precursor having well-balanced sensitivity, storage stability, printing tolerance and development properties.

As the results of intensive studies, the inventors have found out as s another embodiment of the invention that the above object can be achieved by adding a specific polyurethane resin as a component of a polymerizable composition, thereby completing the invention.

Accordingly, the polymerizable composition according to the another embodiment of the invention is a polymerizable composition containing a polyurethane resin (A') which is soluble or swellable in water or an aqueous alkali solution and has an unsaturated carbon-carbon bond in its side chain and a radical initiator (B), characterized in that the polyurethane resin (A') is obtained by adding an epoxy compound having an unsaturated carbon-carbon bond to a polyurethane resin having carboxyl group.

In a preferred embodiment, the polymerizable composition according to the another embodiment of the invention further contains a polymerizable compound (D) or an infrared absorbing agent (Photothermal converting agent) (C).

Although the mechanism of the another embodiment of the invention still remains unclear, it is estimated as follows. The polyurethane resin (A') is obtained by the above-described method and, therefore, has a structure carrying both of a hydroxyl group and an unsaturated carbon-carbon bond in its side chain. Owing to this side chain structure, the hydroxyl group is located close to a radical reactive group. When the radical initiator (B) is localized, therefore, the polymer side chain efficiently undergoes polymerization to give a highly strong image. Since the hydroxyl group is located close to a radical reactive group, it appears that the strength of the hardened part is elevated due to hydrogen bond after the completion of the polymerization. Accordingly, it is considered that the polymerizable composition according to the invention has a high sensitivity and, when applied to the recording layer of a lithographic printing plate precursor, enhances the film strength, thereby achieving excellent printing tolerance.

Since the polyurethane resin has a hydroxyl group in its side chain, furthermore, the polymerizable composition according to the another embodiment of the invention applied to the recording layer of a lithographic printing plate precursor results in improvement in developing properties in a non-image part. As a result, it is considered that the polymerizable composition according to the another embodiment of the invention can provide a printing plate having well-balanced printing tolerance and development properties.

According to the another embodiment of the invention, it is possible to provide a polymerizable composition which contains a polyurethane resin having a hydroxyl group and an unsaturated carbon-carbon bond in its side chain and being soluble or swellable in water or an aqueous alkali solution and, therefore, is useful as the recording layer of a lithographic printing plate precursor excellent in sensitivity and printing tolerance.

DETAILED DESCRIPTION OF THE INVENTION

[Lithographic Printing Plate Precursor]

The lithographic printing plate precursor according to the invention is characterized by having a recording layer containing (A) a polyurethane compound soluble or swellable in water or an aqueous alkali solution which is obtained by reacting at least one diol compound having an unsaturated bond in the main chain and having a molecular weight of 500 or more with at least one polyisocyanate compound, and (B) a radical initiator, on a support.

It is preferable that the recording layer according to the invention further contains (D) a polymerizable compound causing the occurrence and progress of a polymerization reaction with the use of radical generated from the above-described radical initiator as an initiator, and (C) a photothermal converting agent which absorbs light at a specific wavelength and converts it into heat energy. Moreover, it may contain (E) a binder polymer for improving film characteristics and so on, if needed.

Next, the components and constituents of the components of the recording layer in lithographic printing plate precursor according to the invention will be described in greater detail.

[(A) Polyurethane compound soluble or swellable in water or an aqueous alkali solution being obtained by reacting at least one diol compound having an unsaturated bond in the main chain and having a molecular weight of 500 or more with at least one polyisocyanate compound]

The specific polyurethane compound to be used in the invention is characterized by being soluble or swellable in water or an aqueous alkali solution of pH 7 or higher. The expression "soluble in water or an aqueous alkali solution" as used in the invention means that a transparent and uniform solution can be obtained by adding the specific polyurethane compound to water or an aqueous alkali solution of pH 7 or higher. The term "swellable" means that, when added to water or an aqueous alkali solution of pH 7 or higher, the specific polyurethane compound absorbs water or the aqueous alkali solution and swells. That is to say, it is preferable that the specific polyurethane compound to be used in the invention is substantially insoluble in water but soluble or swellable in aqueous alkali solution from the viewpoints of the development discrimination between exposed/unexposed parts and printing tolerance.

The specific polyurethane compound to be used in the invention is characterized by having an unsaturated carbon-carbon bond in its main chain, which means having one or more unsaturated carbon-carbon bonds at least in the internal part or a terminal of the main chain direction (i.e., in the repeating unit of the polymer compound). In the invention, it is preferable that the specific polyurethane compound has the unsaturated carbon-carbon bonds in both of the internal part and a terminal of the main chain. As examples of the unsaturated carbon-carbon bonds, a carbon-carbon double bond, carbon-carbon triple bond and so on can be cited from the viewpoint of radical reactivity.

Preferable examples of the unsaturated carbon-carbon bond existing in the internal part of the main polymer chain include those represented by the following formulae (I) to (IV).

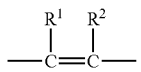

(I)

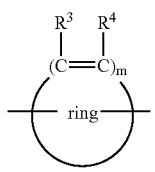

(II)

(III)

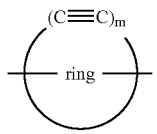

(IV)

In the formulae (I) to (IV), $R^1$ to $R^4$ independently represent each a hydrogen atom or a monovalent organic group. n and m are each an integer of from 1 to 4, provided that the formula (II) represents a nonaromatic group.

Examples of the monovalent organic groups represented by $R^1$ to $R^4$ include alkyl groups and aryl groups. These organic groups may have a substituent.

Among all, it is preferable from the viewpoint of reactivity that $R^1$ to $R^4$ each represents a hydrogen atom, an alkyl group having from about 1 to 4 carbon atoms or an aryl group having from about 6 to 10 carbon atoms. Examples of the substituent which can be introduced into the monovalent organic group include alkyl groups, alkenyl groups, alkynyl groups, aryl groups, alkoxy groups, aryloxy groups, halogen atoms, amino group, alkylamino groups, arylamino groups, carboxy group, alkoxycarbonyl groups, sulfo group, nitro group, cyano group, amido group, alkylsulfonyl groups, arylsulfonyl groups and hydroxyl group.

As the nonaromatic ring represented by the formula (II) or the cyclic structure represented by the formula (IV), an unsaturated cyclic hydrocarbon group, an unsaturated heterocyclic group and a fused polycyclic unsaturated hydrocarbon group having from about 3 to 20 carbon atoms are preferable. These structures may have a substituent. As examples of the substituent, those described above with respect to the substituents which can be introduced into the monovalent organic group in the above formula (I) can be also cited.

Preferable examples of the unsaturated carbon-carbon bond existing at a terminal of the main polymer chain include those represented by the following formulae (V) to (VIII).

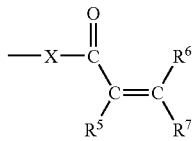

(V)

In the above formula (V), $R^5$ represents a hydrogen atom or a monovalent organic group. Examples of the monovalent organic group represented by $R^5$ include alkyl groups having from about 1 to 4 carbon atoms. These organic groups may have a substituent. Among all, it is preferable that $R^5$ is a hydrogen atom or a methyl group because of having a high radical reactivity.

$R^6$ and $R^7$ independently represent each a hydrogen atom, a halogen atom, an amino group, a carboxyl group, an alkoxycarbonyl group, a sulfo group, a nitro group, a cyano group or a monovalent organic group. Examples of the monovalent organic groups represented by $R^6$ and $R^7$ include alkyl groups, aryl groups, alkoxy groups, aryloxy groups, allkylamino groups, arylamino groups, alkylsulfonyl groups and arylsulfonyl groups having from about 1 to 6 carbon atoms. These organic groups may have a substituent. Among all, it is preferable that $R^6$ and $R^7$ represent each a hydrogen atom, a carboxyl group, an alkoxycarbonyl group, an optionally substituted alkyl group or an optionally substituted aryl group because of having a high radical reactivity.

X represents an oxygen atom, a sulfur atom or —$N(R^{17})$— wherein $R^{17}$ represents a hydrogen atom or a monovalent organic group. Examples of the monovalent organic group represented by $R^{17}$ include alkyl groups having from about 1 to 10 carbon atoms. These organic groups may have a substituent. Among all, it is preferable that $R^{17}$ is a hydrogen atom, a methyl group, an ethyl group or an isopropyl group because of having a high radical reactivity.

Examples of the substituent which can be introduced into the above-described $R^5$ to $R^7$ and $R^{17}$ include alkyl groups, alkenyl groups, alkynyl groups, aryl groups, alkoxy groups, aryloxy groups, halogen atoms, amino group, alkylamino groups, arylamino groups, carboxy group, alkoxycarbonyl groups, sulfo group, nitro group, cyano group, amido group, alkylsulfonyl groups and arylsulfonyl groups.

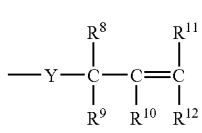

(VI)

In the above formula (VI), $R^8$ to $R^{12}$ represent each a hydrogen atom, a halogen atom, an amino group, a dialkylamino group, a carboxyl group, an alkoxycarbonyl group, a sulfo group, a nitro group, a cyano group or a monovalent organic group. Examples of the monovalent organic group represented by $R^8$ to $R^{12}$ include alkyl groups, aryl groups, alkoxy groups, aryloxy groups, alkylamino groups, arylamino groups, alkylsulfonyl groups and arylsulfonyl groups having from about 1 to 10 carbon atoms. These organic group may have a substituent. Among all, it is preferable that $R^8$ to $R^{12}$ represent each a hydrogen atom, a carboxyl group, an alkoxycarbonyl group, an optionally substituted alkyl group or an optionally substituted aryl group because of having a high reactivity.

Examples of the substituent which can be introduced herein include those cited above with respect to the substituent in the above formula (V).

Y represents an oxygen atom, a sulfur atom or —N($R^{18}$)— wherein $R^{18}$ has the same meaning as $R^{17}$ in the above formula (V) and preferable examples thereof are also the same.

(VII)

In the above formula (VII), $R^{13}$ represents a hydrogen atom or a monovalent organic group. Examples of the monovalent organic group represented by $R^{13}$ include alkyl groups having from about 1 to 4 carbon atoms and these organic groups may have a substituent. Among all, it is preferable that $R^{13}$ is a hydrogen atom or a methyl group because of having a high radical reactivity.

$R^{14}$ and $R^{15}$ independently represent each a hydrogen atom, a halogen atom, an amino group, a dialkylamino group, a carboxyl group, an alkoxycarbonyl group, a sulfo group, a nitro group, a cyano group or a monovalent organic group. Examples of the monovalent organic group represented by $R^{14}$ and $R^{15}$ include alkyl groups, aryl groups, alkoxy groups, aryloxy groups, alkylamino groups, arylamino groups, alkylsulfonyl groups and arylsulfonyl groups having from about 1 to 6 carbon atoms and these organic groups may have a substituent. Among all, it is preferable that $R^{14}$ and $R^{15}$ represent each a hydrogen atom, a carboxyl group, an alkoxycarboxyl group, an optionally substituted alkyl group or an optionally substituted aryl group because of having a high radical reactivity.

Examples of the substituent which can be introduced into $R^{13}$ to $R^{15}$ include those cited above with respect to the substituent in the above formula (V).

Z represents an oxygen atom, a sulfur atom, —N($R^{19}$)— or an optionally substituted phenylene group. $R^{19}$ has the same meaning as $R^{17}$ in the above formula (V) and preferable examples thereof are also the same.

(VIII)

In the above formula (VIII), $R^{16}$ represents a hydrogen atom or a monovalent organic group. Examples of the monovalent organic group represented by $R^{16}$ include alkyl groups having from about 1 to 10 carbon atoms and aromatic groups and these organic groups may have a substituent. Among all, it is preferable that $R^{16}$ is a hydrogen atom, a methyl group or an optionally substituted phenyl group because of having a high radical reactivity. Examples of the substituent which can be introduced herein include those cited above with respect to the substituent in the above formula (V).

A represents an optionally substituted alkylene group or an optionally substituted phenylene group. Among all, a methylene group is preferable therefor because of having a high radical reactivity. Examples of the substituent which can be introduced herein include those cited above with respect to the substituent in the above formula (V).

The specific polyurethane compound according to the invention may have at least one of the unsaturated bonds represented by the above formulae (I) to (IV) in the internal part of its main polymer chain (herein after optionally referred to as "internal unsaturated group") or at least one unsaturated bond represented by the above formulae (VI to (VIII) at a terminal of its main polymer chain (hereinafter optionally referred to as "terminal unsaturated group").

In case of having a plural number of internal unsaturated bonds represented by the formulae (I) to (VII), it may contain a plural number of types of these internal unsaturated bonds at the same time.

In case of having terminal unsaturated bonds represented by the formulae (V) to (VIII) in both terminals of the main polymer chain, these unsaturated bonds may be either the same or different.

It is preferable that the polyurethane compound according to the invention has both of the internal unsaturated group and the terminal unsaturated group as described above at the same time.

The content of the internal unsaturated group and the terminal unsaturated group in the specific polyurethane compound according to the invention is preferably 0.1 meq/g or more, still preferably from 0.5 to 10.0 meq/g and most desirably from 0.5 to 4.0 meq/g. So long as the content thereof falls within this range, excellent sensitivity and storage stability can be established.

The specific polyurethane compound according to the invention can be obtained by reacting at least one diol compound having the above-described unsaturated bond in the main chain and having a molecular weight of 500 or more with at least one polyisocyanate compound. Among polyurethane compounds, it is a common practice to use a triisocyanate compound or a diisocyanate compound and a diisocyanate compound is preferred.

As a particularly preferable fundamental skeleton among these specific polyurethane compounds, a product obtained by reacting at least one diisocyanate compound represented by the following formula (U-1) with at least one diol compound represented by the following formula (U-2) can be cited.

(U-1)

(U-2)

In the above formulae, $X^1$ and $Y^1$ independently represent each a divalent organic group.

Examples of the above diol compound include those having at least one of the unsaturated groups represented by the above formulae (I) to (IV) as $Y^1$ in the formula (U-2). Also, use may be made of compounds having such an unsaturated group as $X^1$ in the above formula (U-1). Thus, a polyurethane resin having an internal unsaturated group introduced thereinto can be formed.

A method of further introducing a terminal unsaturated group represented by the above formula (V) to (VIII) into the polyurethane resin comprises reacting a polyurethane resin, which is a product obtained by reacting a diisocyanate compound represented by the above formula (U-1) with a diol compound represented by the formula (U-2) and has a diisocyanate group or a hydroxyl group at a terminal, with a compound having a group represented by any of the above formulae (V) to (VIII). According to this method, a polyurethane resin further having a terminal unsaturated bond introduced thereinto can be formed.

Now, Particular examples of compounds having groups represented by the above formulae (VI to (VIII) will be presented, though the invention is not restricted thereto.

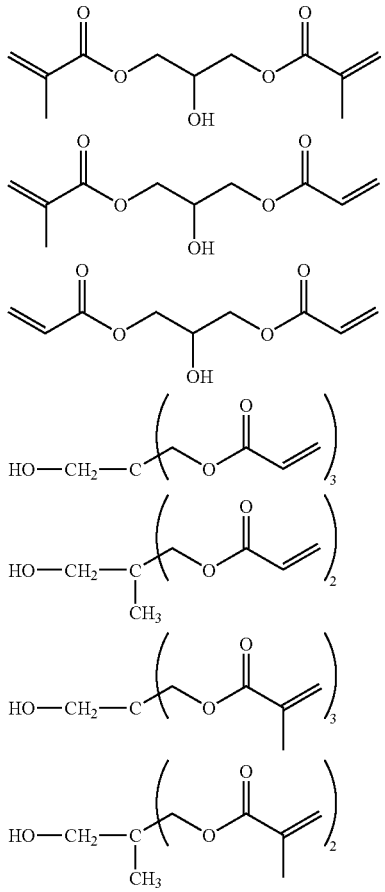

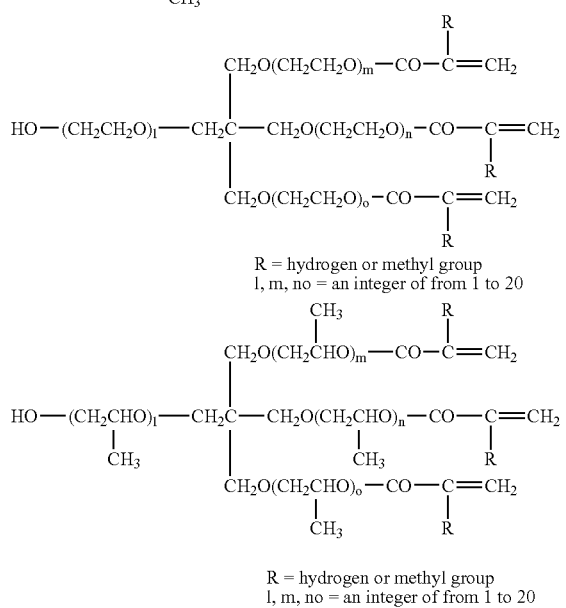

-continued

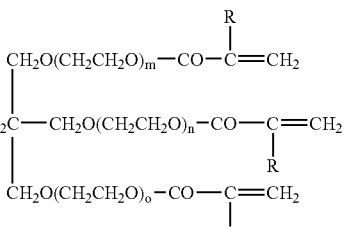

R = hydrogen or methyl group
l, m, no = an integer of from 1 to 20

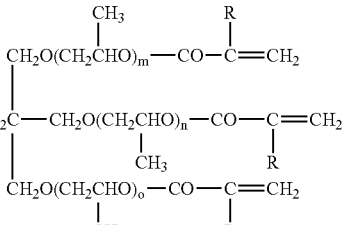

R = hydrogen or methyl group
l, m, no = an integer of from 1 to 20

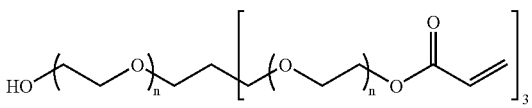

n = an integer of from 1 to 20

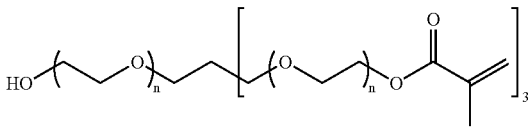

n = an integer of from 1 to 20

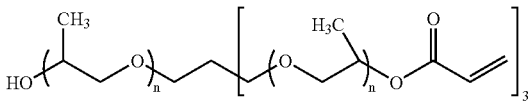

n = an integer of from 1 to 20

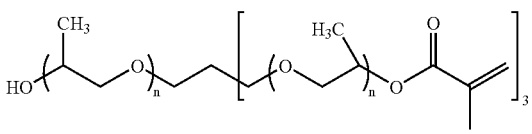

n = an integer of from 1 to 20

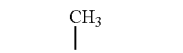

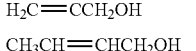

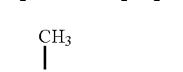

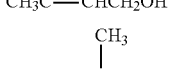

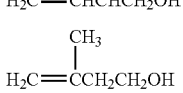

-continued

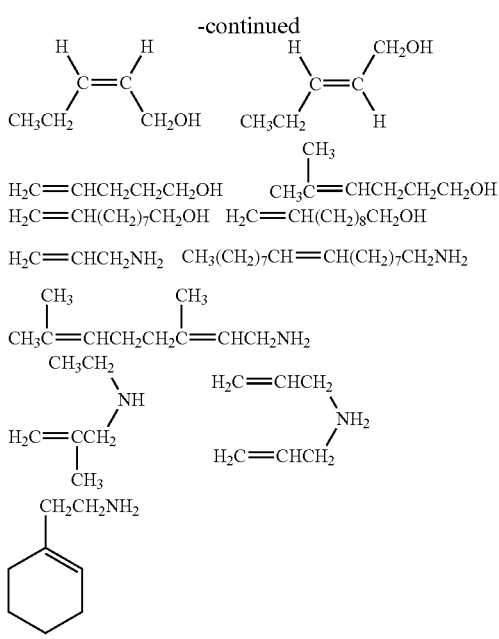

(Isocyanate Compound Having Unsaturated Group Represented by Formulae (I) to (IV))

The diisocyanate compound to be used in the present invention having an unsaturated group represented by the formulae (I) to (IV) (hereinafter optionally referred to as "specific diisocyanate compound") is not particularly restricted so long as it has at least one unsaturated group represented by any of the formulae (I) to (IV). Examples of such compounds are as follows:

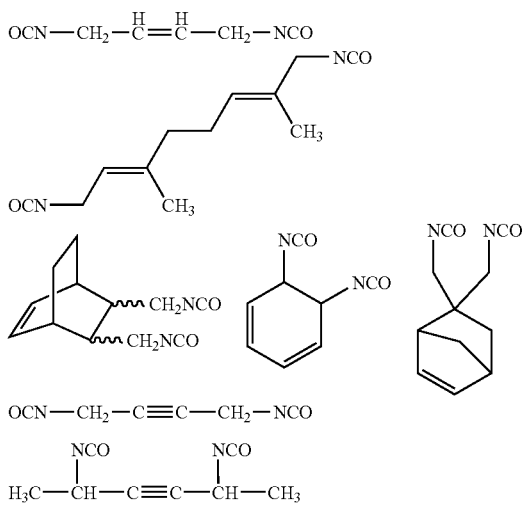

(Other Polyisocyanate Compounds)

In the polyurethane resin to be used in the invention, polyisocyanate compound(s) other than the specific diisocyanate compound can be copolymerized depending on purposes such as elevating the compatibility with other components in the recording layer and improving the storage stability.

As other polyisocyanate compounds, diisocyanate compounds represented by the above formula (U-1) wherein $X^1$ is an optionally substituted divalent aliphatic or aromatic hydrocarbon group are preferred. If necessary, $X^1$ may carry another functional group not reacting with the isocyanate groups such as an ester, urethane, amido or ureido group.

Particular examples of other polyisocyanate compounds include the following ones.

Diisocyanate compounds including aromatic diisocyanate compounds such as 1,3-bis(isocyanatemethyl)benzene, 1,2-bis(isocyanatemethyl)benzene, 1,4-bis(isocyanatemethyl) benzene, 1,3-bis(1-isocyanate-1-methylethyl)benzene, 1,2-bis(1-isocyanate-1-methylethyl)benzene, 1,4-bis(1-isocyanate-1-methylethyl)benzene, 4,4'-methylenebis (phenylisocyanate), 1,3-phenylenediisocyanate, 1,4-phenylenediisocyanate, 1,2-phenylenediisocyanate, tolylene-2,4-diisocyanate, tolylene-2,6-diisocyanate, 4,4'-methylenebis(2,6-diethylphenylisocyanate), 4,4'-methylenebis(2,6-dimethylphenylisocyanate), 4,4'-oxybis(phenylisocyanate) and 1,5-naphthylenediisocyanate;

aliphatic disiocyanate compounds such as 1,4-diisocyanate butane, 1,6-diisocyanate hexane, 1,8-diisocyanate octane, 1,12-diisocyanate decane, 1,5-diisocyanate-2-methylpentane, trimethylhexamethylene diisocyanate, lysine diisocyanate and dimeric acid diisocyanate; and alicyclic diisocyanate compounds such as isophorone diisocyanate, 1,3-bis(isocyanatemethyl)cyclohexane, 1,2-bis (isocyanatemethyl)cyclohexane, 1,4-cyclehexyelene diisocyanate, 1,2-cyclehexyelene diisocyanate, 1,3-cyclehexyelene diisocyanate, 4,4'-methylenebis(cyclohexylisocyanate) and 4,4'-oxybis(cyclohexylisocyanate).

Moreover, citation may be made of triisocyanates such as 4,4',4''-triphenylmethane triisocyanate and tetraisocyanates such as 4,4'-diphenylmethane-2,2',5,5'-tetraisocyanate.

It is also possible to simultaneously use two or more these polyisocyanate compounds.

(Diol Compound Having Unsaturated Group Represented by Formulae (I) to (IV))

The diol compound to be used in the present invention having an unsaturated group represented by the formulae (I) to (IV) (hereinafter optionally referred to as "specific diol compound") is not particularly restricted so long as it has at least one unsaturated group represented by any of the formulae (I) to (IV) as $Y^1$ in the above-described formula (U-2). Examples thereof are as follows.

Preferable examples thereof include unsaturated polyether diol compounds, unsaturated polysulfide diol compounds, unsaturated polyester diol compounds, unsaturated polyamide diol compounds, unsaturated polycarbonate diol compounds, unsaturated polysulfonate diol compounds, unsaturated polyketone diol compounds, unsaturated polysulfone diol compounds and unsaturated polyolefin diol compounds. Among all, polymeric diol compounds such as unsaturated polyester diol compounds, unsaturated polycarbonate diol compounds and polyolefin diol compounds are still preferable.

It is preferable that such a polymeric specific diol compound has a molecular weight of 500 or more, still preferably from 700 to 5,000. In the case where its molecular weight is less than 500, the sensitivity is liable to be lowered. In the case where its molecular weight exceeds 5,000, it is feared that the stability is worsened.

From the viewpoints of sensitivity and printing tolerance, it is preferred that the content of the polymeric specific diol compound in the specific polyurethane resin is 5% by mass (weight) or more, still preferably 10% by mass or more and still preferably 20% by mass or more.

<Unsaturated Polyester Diol Compound>

The unsaturated polyester diol compound which is a preferred embodiment of the specific diol compound to be used in the present invention is not particularly restricted so long as it has at least one unsaturated group represented by any of the above formulae (I) to (IV). Among all, an unsaturated polyester diol compound having, as the fundamental skeleton, a structural unit represented by a product of a reaction between at least one dicarboxylic acid or carboxylic acid derivative compound represented by the following formula (U-3) with at least a diol compound represented by the following formula (U-4).

$$X\text{—CO-}L^1\text{-CO—}X \quad (U\text{-}3)$$

$$HO\text{-}L^2\text{-}OH \quad (U\text{-}4)$$

In the formulae (U-3) and (U-4), X represents a hydroxyl group, a halogen atom or an alkoxy group having from 1 to 4 carbon atoms, and $L^1$ and $L^2$ independently represent each a divalent organic group.

In the case where at least one of the dicarboxylic acid or carboxylic acid derivative compound represented by the formula (U-3) and the diol compound represented by the formula (U-3) has at least one unsaturated group represented by any of the above-described formulae (I) to (IV), an unsaturated polyester diol compound having an internal unsaturated group introduced thereinto is formed as the product of the reaction between the dicarboxylic acid or carboxylic acid derivative compound and the diol compound.

Preferable examples of the unsaturated polyester diol compound include the following compounds (PE-1) to (PE-14), though the invention is not restricted thereto. Each of the unsaturated polyester diol compounds is a mixture of compounds having n in the following formula of 1 or more and the weight-average molecular weight (Mw) is as given in the table.

$$HO\text{—}A^1\text{—}(B^1)_n\text{—}A^1\text{—}OH$$

| | —$A^1$— | —$B^1$— | Mw |
|---|---|---|---|
| PE-1 | —$(CH_2)_4$— | —O—$(CH_2)_4$—O—CO—CH=CH—CO— | 1,500 |
| PE-2 | —$(CH_2)_2$— | —O—$(CH_2)_2$—O—CO—CH=CH—CO— | 1,500 |
| PE-3 | —$CH_2$—CH=CH—$CH_2$— | —O—$CH_2$—CH=CH—$CH_2$—O—CO—$(CH_2)_4$—CO— | 1,000 |
| PE-4 | —$CH_2$—CH=CH—$CH_2$— |  | 1,000 |
| PE-5 |  |  | 2,000 |
| PE-6 | —$CH_2$–CH=C($CH_3$)–$C_2H_4$-CH=C($CH_3$)–$CH_2$— | —O—$CH_2$–CH=C($CH_3$)–$C_2H_4$-CH=C($CH_3$)–$CH_2$—O—CO—CH=CH—CO— | 900 |
| PE-7 | —$CH_2$—C≡C—$CH_2$— | —O—$CH_2$—C≡C—$CH_2$—O—CO—$(CH_2)_4$—CO— | 1,200 |
| PE-8 | —$CH_2$—CH=CH—$CH_2$— | —O—$CH_2$—CH=CH—$CH_2$—O—CO—CH=CH—CO— | 1,500 |
| PE-9 | —$(CH_2)_2$— | 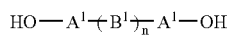  —(O—$(CH_2)_2$—O—CO—CH=CH—CO—)$_m$ | 2,000 | l and m represent each an integer of 1 or more.

| | | | |
|---|---|---|---|
| PE-10 | —$CH_2$—CH=CH—$CH_2$— | 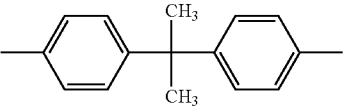 | 1,500 |
| PE-11 | (bisphenol A structure) | (bisphenol A structure)—O—CO—CH=CH—CO— | 2,500 |
| PE-12 | —$CH_2$—C≡C—$CH_2$— | —O—$CH_2$—C≡C—$CH_2$—O—CO—CH=CH—CO— | 1,000 |

-continued $$HO-A^1+B^1\!\!\to_n A^1-OH$$

| | —A¹— | —B¹— | Mw |
|---|---|---|---|
| PE-13 | —(CH₂)₄— | —(O—(CH₂)₄—O—CO—CH=CH—CO)₁— | 3,000 |
| | |  | |
| | | l and m represent each an integer of 1 or more. | |
| PE-14 |  (cyclohexyl) | —O—(cyclohexyl)—O—CO—CH=CH—CO— | 1,500 |

<Unsaturated Polycarbonate Diol Compound>

The unsaturated polycarbonate diol compound which is a preferred embodiment of the specific diol compound to be used in the present invention is not particularly restricted so long as it is an unsaturated polycarbonate diol compound having at least one unsaturated group represented by any of the above formulae (I) to (IV). Among all, an unsaturated polycarbonate diol compound having, as the fundamental skeleton, a structural unit represented by a product of a reaction between at least one diol compound represented by the following formula (U-5) and phosgene or a carbonic acid ester.

$$HO\text{-}L^3\text{-}OH \quad (U\text{-}5)$$

$$HO\text{-}L^2\text{-}OH \quad (U\text{-}4)$$

In the formula (U-5), $L^3$ represents a divalent organic group.

In the case where at least one of the diol compound represented by the formula (U-5) and phosgene or a carbonic acid ester has at least one unsaturated group represented by any of the above-described formulae (I) to (IV), an unsaturated polycarbonate diol compound having an internal unsaturated group introduced thereinto is formed.

Preferable examples of the unsaturated polycarbonate diol compound include the following compounds (PC-1) to (PC-15), though the invention is not restricted thereto. Each of the unsaturated polycarbonate diol compounds is a mixture of compounds having n in the following formula of 1 or more and the weight-average molecular weight (Mw) is as given in the table. Although the following compounds are given by way of example, the invention is not restricted thereto.

$$HO-A^1+B^1\!\!\to_n A^1-OH$$

| | —A²— | —B²— | Mw |
|---|---|---|---|
| PC-1 | —CH₂CH=CH—CH₂— | —O—CH₂—CH=CH—CH₂—O—CO— | 1,500 |
| PC-2 | —C₂H₄— | —O—CH₂—CH=CH—CH₂—O—CO— | 1,500 |
| PC-3 | —CH₂—CH=C(CH₃)—C₂H₄—CH=C(CH₃)—CH₂— | —O—CH₂—CH=C(CH₃)—C₂H₄—CH=C(CH₃)—CH₂—O—CO— | 800 |
| PC-4 | —C₄H₈(n)— | —O—CH₂—CH=C(CH₃)—C₂H₄—CH=C(CH₃)—CH₂—O—CO— | 1,200 |
| PC-5 | —CH₂—C≡C—CH₂— | —O—CH₂—C≡C—CH₂—O—CO— | 1,000 |
| PC-6 | —C₄H₈(n)— | —O—CH₂—C≡C—CH₂—O—CO— | 1,000 |
| PC-7 | —CH(CH₃)—C≡C—CH(CH₃)— | —O—CH(CH₃)—C≡C—CH(CH₃)—O—CO— | 800 |
| PC-8 | —CH₂—C(Br)=C(Br)—CH₂— | —O—CH₂—C(Br)=C(Br)—CH₂—O—CO— | 800 |

| | $-A^2-$ | $-B^2-$ | Mw |
|---|---|---|---|
| | | HO—A¹—(B¹)ₙ—A¹—OH (-continued) | |
| PC-9 | —C₄H₈(n)— | —(O—CH₂—CH═CH—CH₂—O—CO)ₗ—<br>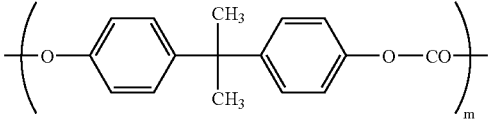<br>l and m represent each an integer of 1 or more. | 1,200 |
| PC-10 | —CH₂—CH═CH—CH₂— |  | 1,500 |
| PC-11 | —C₄H₈(n)— | —(O—(CH₂)₄—O—CO)ₗ—<br>—(O—CH₂—CH═CH—CH₂—O—CO)ₘ—<br>l and m represent each an integer of 1 or more. | 1,000 |
| PC-12 | —CH₂—CH═CH—CH₂— | —O—(CH₂)₄—O—CO— | 2,000 |
| PC-13 | —CH₂—C≡C—CH₂— | 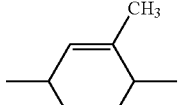 | 800 |
| PC-14 | (cyclohexene ring) | (cyclohexene with —O— and —O—CO—) | 900 |
| PC-15 | (methyl cyclohexadiene) | (methyl-substituted ring with —O— and —O—CO—) | 800 |

<Polyolefin Diol Compound>

Preferable examples of the polyolefin diol compound which is a preferred embodiment of the specific diol compound to be used in the invention include polybutadiene diols and polyiroprene diols. Among all, polybutadiene diols are preferable. Particularly preferably examples of the polybutadiene diols are as follows.

(BD-2)

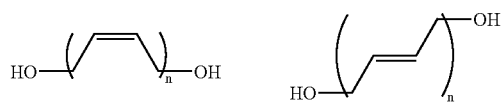

(n is an integer of 2 or more.)

(BD-3)

(BD-4)

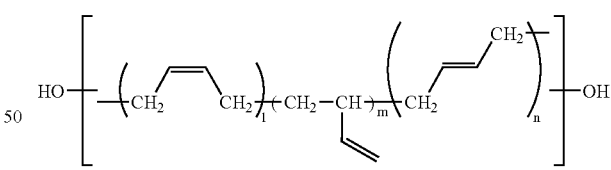

(Random or block polymer modified with hydroxyl groups at both terminals. l, m and n represent each an integer of 1 or more.)

As the specific diol compound as described above, 2 or more types thereof may be employed at the same time.

(Specific Polyurethane Resin Having Carboxy Group)

It is preferable that the specific polyoxy resin to be used in the invention further has a carboxyl group in its structure. Examples of such a specific polyurethane resin include those having a structural unit represented by at least one of the diol compounds of the following formulae (U-6) to (U-8) and/or a structural unit derived from a compound obtained by ring-opening a tetracarboxylic acid dianhydride with a diol compound.

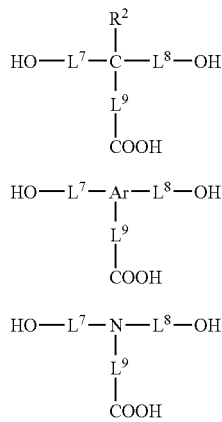

(U-6)

(U-7)

(U-8)

In the formula (U-6), $R^2$ represents a hydrogen atom or an alkyl group, an aralkyl group, an aryl group, an alkoxy group or an aryloxy group each optionally having a substituent (for example, a cyano group, a nitro group, a halogen atom such as —F, —Cl, —Br or —I, —$CONH_2$, —$COOR^3$, —$OR^3$, —$NHCONHR^3$, —$NHCOOR^3$, —$NHCOR^3$, —$OCONHR^3$ (wherein $R^3$ represents an alkyl group having from 1 to 10 carbon atoms or an aralkyl group having from 6 to 15 carbon atoms) or the like). It preferably represents a hydrogen atom, an alkyl group having from 1 to 8 carbon atoms or an aryl group having from 6 to 15 carbon atoms.

In the formulae (U-6) to (U-8), $L^7$, $L^8$ and $L^9$ may be the same or different and each represents a single bond or a divalent aliphatic or aromatic hydrocarbon group optionally having a substituent (preferably being, for example, an alkyl, aralkyl, aryl, alkoxy or halogeno group). These groups preferably represent each an alkylene group having from 1 to 20 carbon atoms or an arylene group having form 6 to 15 carbon atoms, still preferably an alkylene group having form 1 to 8 carbon atoms. If necessary, $L^7$, $L^8$ and $L^9$ may further have another functional group not reacting with the isocyanate group such as a carbonyl, ester, urethane, amido, ureido or ether group. Furthermore, two or three members of $R^2$, $L^7$, $L^8$ and $L^9$ may form together a ring.

In the formula (U-7), Ar represents an optionally substituted trivalent aromatic hydrocarbon group. It preferably represents an aromatic group having from 6 to 15 carbon atoms.

Particular examples of the diol compounds having carboxyl group represented by the formulae (U-6) to (U-8) areas follows.

For example, citation may be made of 3,5-dihydroxybenzoic acid, 2,2-bis(hydorxymethyl)propionic acid, 2,2-bis(2-hydorxyethyl)propionic acid, 2,2-bis(3-hydorxypropyl)propionic acid, bis(hydroxymethyl)acetic acid, bis(4-hydroxyphenyl)acetic acid, 2,2-bis(hydroxymethyl)butyric acid, 4,4-bis(4-hydroxyphenyl)pentanoic acid, tartaric acid, N,N-dihydroxyethylglycine, N,N-bis(2-hydroxyethyl)-3-carboxy-propionamide and compounds having the following structures.

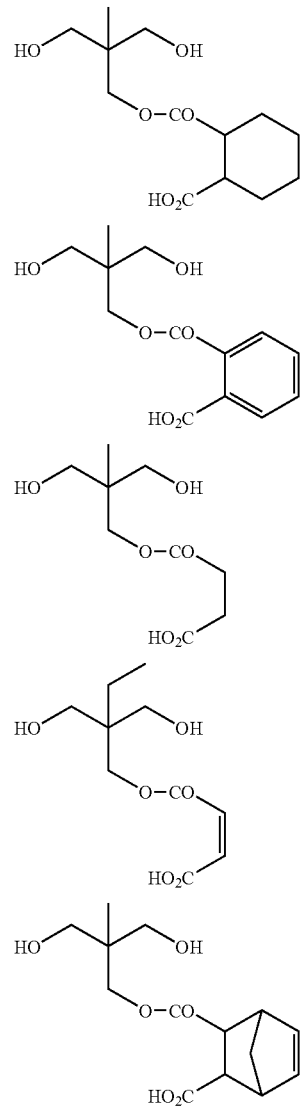

As examples of the tetracarboxylic acid dihydride appropriately usable in synthesizing the specific polyurethane resin according to the invention, compounds represented by the following formulae (U-9) to (U-11) may be cited.

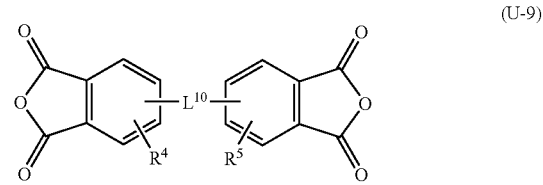

(U-9)

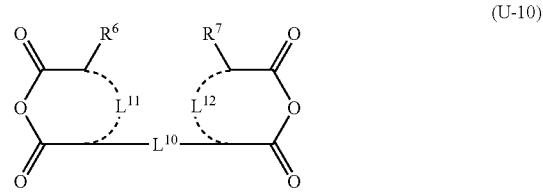

(U-10)

-continued

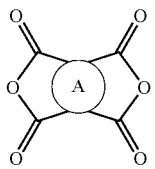
(U-11)

In the formulae (U-9) and (U-10), $L^{10}$ represents a single bond, a divalent aliphatic or aromatic hydrocarbon group optionally having a substituent (preferably being, for example, an alkyl, aralkyl, aryl, alkoxy or halogeno group), —CO—, —SO—, —SO$_2$—, —O— or —S—. It preferably represents a single bond, a divalent aliphatic group having from 1 to 15 carbon atoms, —CO—, —SO$_2$—, —O— or —S—.

In the formula (U-9), $R^4$ and $R^5$ may be the same or different and each represents a hydrogen atom, an alkyl group, an aralkyl group, an aryl group, an alkoxy group or a halogeno group, preferably a hydrogen atom, an alkyl group having from 1 to 8 carbon atoms, an aryl group having from 6 to 15 carbon atoms, an alkoxy group having form 1 to 8 carbon atoms or a halogeno atom. Furthermore, two members of $L^{10}$, $R^4$ and $R^5$ may be bonded to each other to form a ring.

In the formula (U-10), $R^6$ and $R^7$ may be the same or different and each represents a hydrogen atom, an alkyl group, an aralkyl group, an aryl group or a halogeno group, preferably a hydrogen atom, an alkyl group having from 1 to 8 carbon atoms or an aryl group having from 6 to 15 carbon atoms. Furthermore, two members of $L^{10}$, $R^6$ and $R^7$ may be bonded to each other to form a ring. $L^{11}$ and $L^{12}$ may be the same or different and each represents a single bond, a double bond or a divalent aliphatic hydrocarbon group, preferably a single bond, a double bond or a methylene group.

In the formula (U-11), A represents a mononuclear or multinuclear aromatic ring, preferably an aromatic ring having from 6 to 18 carbon atoms.

Particular examples of the compounds represented by the formulae (U-9) to (U-11) are as follows.

For example, aromatic tetracarbxylic dianhydrides such as pyromelitic dianhydride, 3,3',4,4'-benzophenone tetracarboxylic dianhydride, 3,3',4,4'-diphenyltetracarboxylic dianhydride, 2,3,6,7-naphthalene tetracarboxylic dianhydride, 1,4,5,8-naphthalene tetracarboxylic dianhydride, 4,4'-sulfonyl diphthalic dianhydride, 2,2-bis(3,4-dicarboxyphenyl) propane dianhydride, bis(3,4-dicarboxyphenyl)ehterdianhydride, 4,4'-[3,3'-(alkylphosphoryldiphenylene)-bis(iminocarbonyl)]diphthalic dianhydride, an adduct of hydroquinone diacetate to trimelitic anhydride and an adduct of diacetyldiamine to trimelitic anhydride; alicyclic tetracarboxylic dianhydrides such as 5-(2,5-dioxotetrahydrofuryl)-3-methyl-3-cyclohexene-1,2-di carboxylic acid anhydride (EPICLON B-4400 manufactured by Dainippon Ink and Chemicals Inc.) 1,2,3,4-cyclopentane tetracarboxylic dianhydride, 1,2,4,5-cyclohexane tetracarboxylic dianhydride and tetrahydrofuran tetracarboxylic dianhydride; and aliphatic tetracarboxylic dianhydrides such as 1,2,3,4-butane tetracarbocylic dianhydride and 1,2,4,5-pentane tetracarboxylic dianhydride.

A structural unit derived from a compound prepared by ring-opening such a tetracarboxylic dianhydride by a diol compound can be introduced into the polyurethane resin by, for example, the following methods.

a) A method wherein a compound having an alcholic terminal, which is obtained by ring-opening a tetracarboxylic dianhydride by a diol compound, is reacted with a diisocyanate compound.

b) A method wherein a urethane compound having an alcoholic terminal, which is obtained by reacting a diisocyanate compound in the presence of a diol compound in excess, is reacted with a tetracarboxylic dianhydride.

Particular examples of the diol compound to be used herein are as follows.

For example, ethylene glycol, diethylene glycol, triethylene glycol, tetraethylene glycol, propylene glycol, dipropylene glycol, polyethylene glycol, polypropylene glycol, neopentyl glycol, 1,3-butylene glycol, 1,6-heanediol, 2-butene-1,4-diol, 2,2,4-trimethyl-1,3-pentanediol, 1,4-bis-β-hydroxyethoxycyclohexane, cyclohexane dimethanol, tricyclodecane dimethanol, hydrogenated bisphenol A, hydrogenated bisphenol F, ethylene oxide adduct of bisphenol A, propylene oxide adduct of bisphenol A, ethylene oxide adduct of bisphenol F, propylene oxide adduct of bisphenol F, ethylene oxide adduct of hydrogenated bisphenol A, propylene oxide adduct of hydrogenated bisphenol A, hydroquinone dihydroxy ethyl ether, p-xylylene glycol, dihydroxyethyl sulfone, bis(2-hydroxyethyl)-2,4-tolylene dicarbamate, 2,4-tolylene-bis(2-hydroxyethylcarbamide), bis(2-hydroxyethyl)-m-xylylene dicarbamate and bis(2-hydroxyethyl) isophthalate may be cited.

(Other Diol Compounds)

In the specific polyurethane resin according to the invention, diol compounds other than the specific diol compound as described above and the diol compound having a carboxy group can be copolymerized in order to, for example, improve compatibility with other components in the recording layer and improve storage stability. Such a diol compound may have another substituent not reacting with isocyanate. Preferable examples of the diol compound include, in a broad meaning, polyether diol compounds, polyester diol compounds and polycarbonate diol compounds.

<Low-Molecular Weight Diol Compound Having Unsaturated Group>

Particular examples of the low-molecular weight diol compound having an unsaturated group which can be used together with the specific polymer diol compound are as follows.

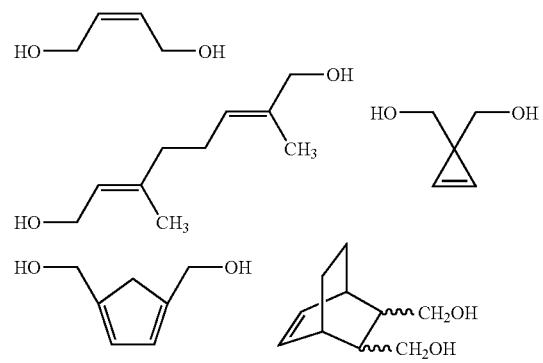

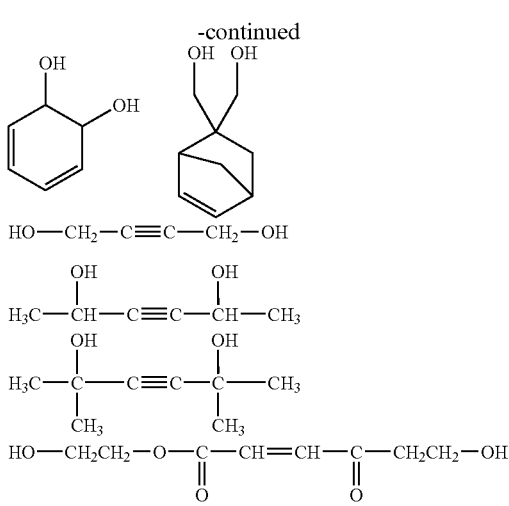

<Polyether Diol Compound>

Examples of the polyether diol compounds preferable as other diol compounds include compounds represented by the following formulae (U-12), (U-13), (U-14), (U-15) and (U-16) and random copolymers of ethylene oxide with propylene oxide having a hydroxyl group at the terminal.

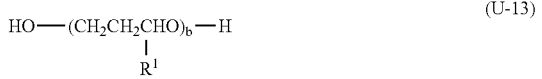
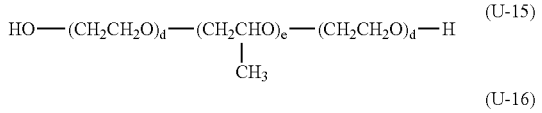

In the above formulae (U-12) to (U-16), $R^1$ represents a hydrogen atom or a methyl group, and X represents one of the following groups.

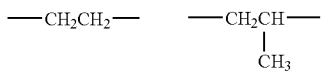

a, b, c, d, e, f and g represent each an integer of 2 or more, preferably an integer of from 2 to 100.

Particular examples of polyether diol compounds represented by the formulae (U-12) and (U-13) are as follows.

For example, diethylene glycol, triethylene glycol, tetraethylene glycol, pentaethylene glycol, hexaethylene glycol, heptaethylene glycol, octaethylene glycol, di-1,2-propylene glycol, tri-1,2-propylene glycol, tetra-1,2-propylene glycol, hexa-1,2-propylene glycol, di-1,3-propylene glycol, tri-1,3-propylene glycol, tetra-1,3-propylene glycol, di-1,3-butylene glycol, tri-1,3-butylene glycol, tetra-1,3-butylene glycol, polyethylene glycol having a weight-average molecular weight of 1000, polyethylene glycol having a weight-average molecular weight of 1500, polyethylene glycol having a weight-average molecular weight of 2000, polyethylene glycol having a weight-average molecular weight of 3000, polyethylene glycol having a weight-average molecular weight of 7500, polypropylene glycol having a weight-average molecular weight of 400, polypropylene glycol having a weight-average molecular weight of 700, polypropylene glycol having a weight-average molecular weight of 1000, polypropylene glycol having a weight-average molecular weight of 2000, polypropylene glycol having a weight-average molecular weight of 3000 and polypropylene glycol having a weight-average molecular weight of 4000 may be cited.

Particular examples of the polyether diol compound represented by the formula (U-14) are as follows.

For example, PTMG650, PTMG1000, PTMC2000, PTMG3000 (each being trade name manufactured by SANYO KASEI Co., Ltd.) and so on.

Particular examples of the polyether diol compound represented by the formula (U-15) are as follows.

For example, NEWPOL PE-61, NEWPOL PE-62, NEWPOL PE-64, NEWPOL PE-68, NEWPOL PE-71, NEWPOL PE-74, NEWPOL PE-75, NEWPOL PE-78, NEWPOL PE-108, NEWPOL PE-128 (each being trade name manufactured by SANYO KASEI Co., Ltd.) and so on.

Particular examples of the polyether diol compound represented by the formula (U-16) are as follows.

For example, NEWPOL BPE-20, NEWPOL BPE-20F, NEWPOL BPE-20NK, NEWPOL BPE-20T, NEWPOL BPE-20G, NEWPOL BPE-40, NEWPOL BPE-60, NEWPOL BPE-100, NEWPOL BPE-180, NEWPOL BPE-2P, NEWPOL BPE-23P, NEWPOL BPE-3P, NEWPOL BPE-5P (each being trade name manufactured by SANYO KASEI Co., Ltd.) and so on.

Particular examples of the random copolymers of ethylene oxide with propylene oxide having a hydroxyl group at the terminal are as follows.

For example, NEWPOL 50HB-100, NEWPOL 50HB-260, NEWPOL 50HB-400, NEWPOL 50HB-660, NEWPOL 50HB-2000, NEWPOL 50HB-5100 (each being trade name manufactured by SANYO KASEI Co., Ltd.) and so on.

<Polyester Diol Compound>

Examples of the polyester diol compounds preferable as other diol compounds include compounds represented by the following formulae (U-17) and (U-18).

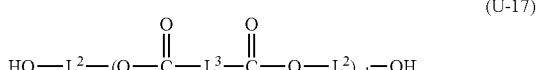
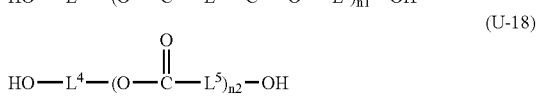

In the formulae (U-17) and (U-18), $L^2$, $L^3$ and $L^4$ may be the same or different and each represents a divalent aliphatic or aromatic hydrocarbon group, and $L^5$ represents a divalent aliphatic hydrocarbon group. It is preferable that $L^2$, $L^3$ and $L^4$ each represents an alkylene group, an alkenylene group or an arylene group, while $L^5$ represents an alkylene group. $L^2$, $L^3$, $L^4$ and $L^5$ may each further have another functional group not reacting with isocyanate group such as an ether, carbonyl, ester, cyano, olefin, urethane, amido or ureido group or a halogen atom. n1 and n2 are each an integer of 2 or more, preferably an integer of from 2 to 100.

<Polycarbonate Diol Compound>

Examples of the polycarbonate diol compounds preferable as other diol compounds include compounds represented by the following formula (U-19).

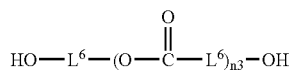
(U-19)

In the formula, $L^6$'s may be the same or different and each represents a divalent aliphatic or aromatic hydrocarbon group. It is preferable that $L^6$ represents an alkylene group, an alkenylene group or an arylene group. $L^6$ may further have another functional group not reacting with isocyanate group such as an ether, carbonyl, ester, cyano, olefin, urethane, amido or ureido group or a halogen atom. n3 is an integer of 2 or more, preferably an integer of from 2 to 100.

Particular examples of the diol compounds represented by the formulae (U-17), (U-18) and (U-19) include the following Example Compound No. 1) to (Example Compound No. 12) wherein n is an integer of 2 or more.

(No. 1)

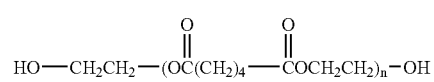
(No. 2)

(No. 3)

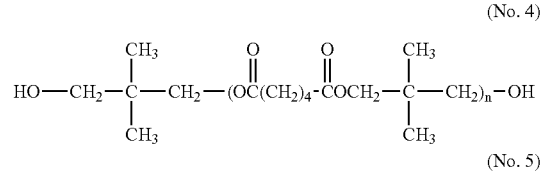
(No. 4)

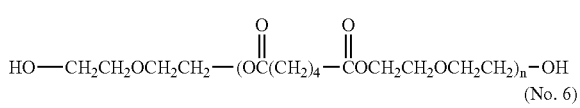
(No. 5)

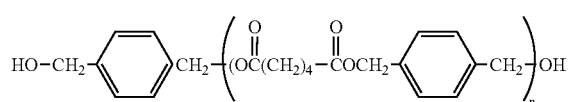
(No. 6)

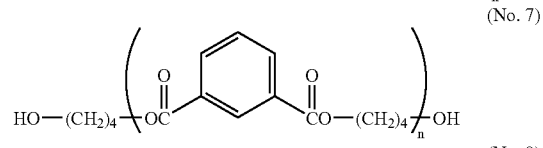
(No. 7)

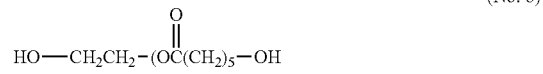
(No. 8)

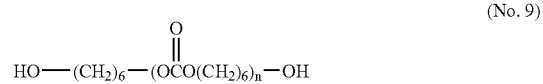
(No. 9)

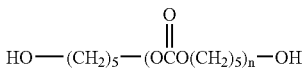
(No. 10)

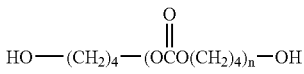
(No. 11)

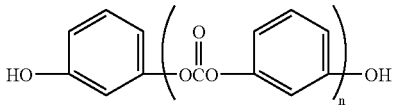
(No. 12)

In addition to the polyether diol compounds, polyester diol compounds and polycarbonate diol compounds as described above, further examples of other diol compounds include the following diol compounds.

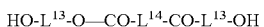
(U-20)

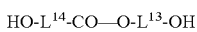
(U-21)

In the formulae (U-20) and (U-21), $L^{13}$ and $L^{14}$ may be the same or different and each represents a divalent aliphatic or aromatic hydrocarbon group or a heterocyclic group optionally having a substituent (for example, an alkyl group, an aralkyl group, an aryl group, an alkoxy group, an aryloxy group, a halogen atom such as —F, —Cl, —Br or —I or the like). If needed, $L^{13}$ and $L^{14}$ may each further have another functional group not reacting with isocyanate group such a carbonyl, ester, urethane, amido or ureido group. $L^{13}$ and $L^{14}$ may form a ring together.

Particular examples of the compounds represented by the formula (U-20) and (U-21) are as follows.

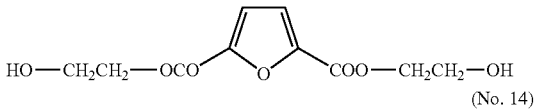
(No. 13)

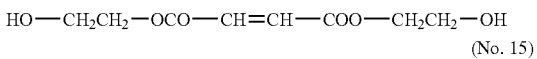
(No. 14)

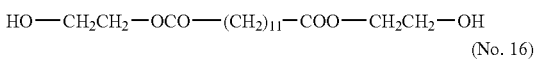
(No. 15)

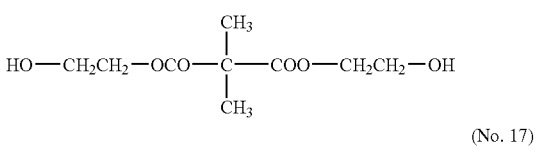
(No. 16)

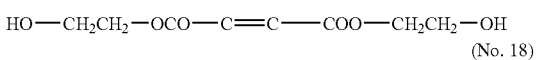
(No. 17)

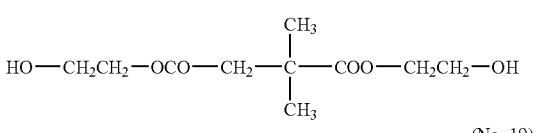
(No. 18)

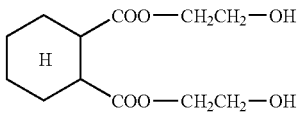
(No. 19)

-continued

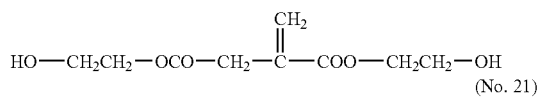
(No. 20)

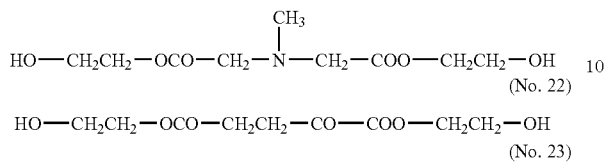
(No. 21)

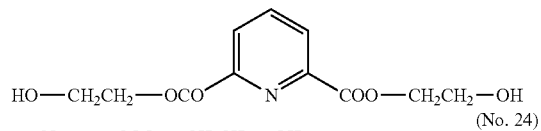
(No. 22)

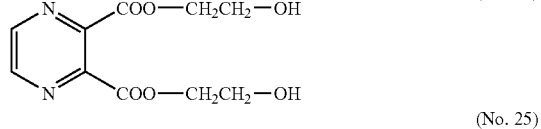
(No. 23)

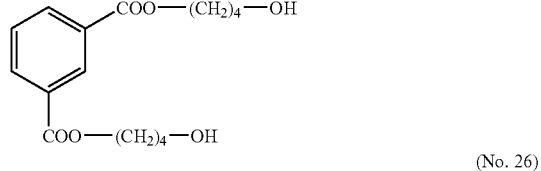
(No. 24)

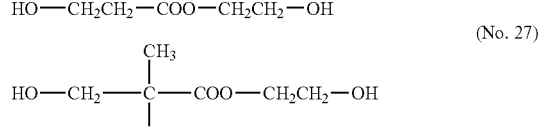
(No. 25)

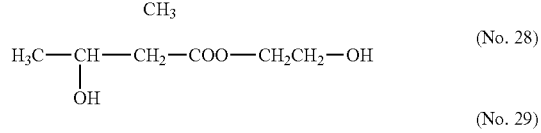
(No. 26)

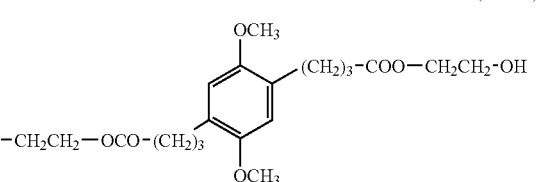
(No. 27)

(No. 28)

(No. 29)

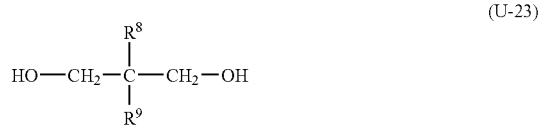

Moreover, use can be appropriately made of diol compounds represented by the following formulae (U-22) and (U-23).

$$HO(CH_2)_cOH \quad (U-22)$$

$$\text{(U-23)}$$

(image of U-23 structure with R$^8$ and R$^9$)

In the formulae (U-22) and (U-23), R$^8$ and R$^9$ may be the same or different and each represents an optionally substituted alkyl group and c is an integer of 2 or more, preferably an integer of from 2 to 100.

Particular examples of the diol compounds represented by the formulae (U-22) and (U-23) are as follows.

Examples of the compound of the formula (U-22) include ethylene glycol, 1,3-propanediol, 1,4-butanediol, 1,5-pentanediol, 1,6-hexanediol, 1,7-heptanediol and 1,8-octanediol.

Examples of the compound of the formula (U-22) include the following compounds.

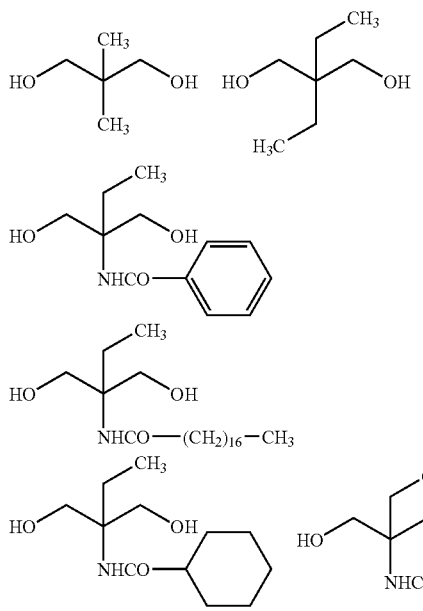

Moreover, use can be appropriately made of diol compounds represented by the following formulae (U-24) and (U-25).

$$HO\text{-}L^{15}\text{-}NH\text{—}CO\text{-}L^{16}\text{-}CO\text{—}NH\text{-}L^{15}\text{-}OH \quad (U\text{-}24)$$

$$HO\text{-}L^{16}\text{-}CO\text{—}NH\text{-}L^{15}\text{-}OH \quad (U\text{-}25)$$

In the formulae (U-24) and (U-25), $L^{15}$ and $L^{16}$ may be the same or different and each represents a divalent aliphatic or aromatic hydrocarbon group or a heterocyclic group optionally having a substituent (for example, an alkyl, aralkyl, aryl, alkoxy or aryloxy group, a halogen atom such as —F, —Cl, —Br or —I or the like). If needed, $L^{15}$ and $L^{16}$ may each further have another functional group not reacting with isocyanate group such a carbonyl, ester, urethane, amido or ureido group. $L^{15}$ and $L^{16}$ may form a ring together.

Particular examples of the compounds represented by the formula (U-24) and (U-25) are as follows.

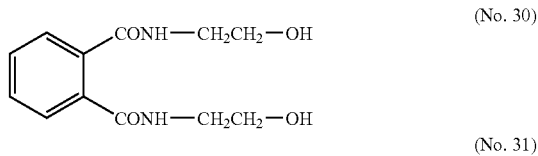
(No. 30)

(No. 31)

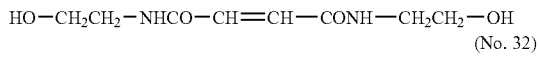
(No. 32)

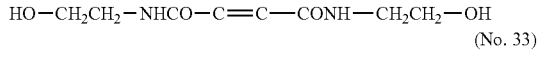
(No. 33)

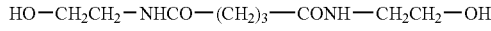

-continued

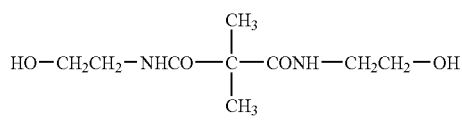
(No. 34)

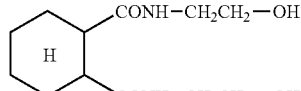
(No. 35)

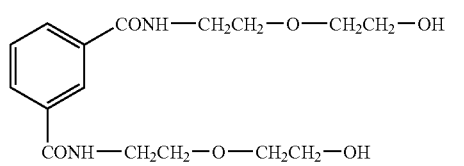
(No. 36)

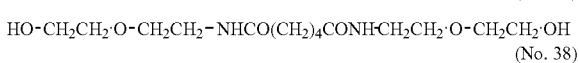
(No. 37)

HO-CH₂CH₂·O·CH₂CH₂-NHCO(CH₂)₄CONH-CH₂CH₂·O·CH₂CH₂·OH
(No. 38)

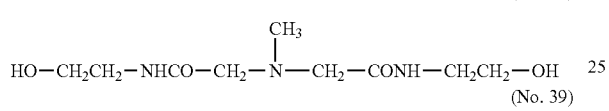
(No. 39)

HO—CH₂CH₂—NHCO—CH₂—S—CH₂—CONH—CH₂CH₂—OH

Moreover, use can be appropriately made of diol compounds represented by the following formulae (U-26) and (U-27).

$$HO—Ar^2-(L^{17}-Ar^3)_n—OH \qquad (U-26)$$

$$HO—Ar^2-L^{17}-OH \qquad (U-27)$$

In the formulae (U-26) and (U-27), $L^{17}$ represents a divalent aliphatic hydrocarbon group optionally having a substituent (preferable examples including alkyl, aralkyl, aryl, alkoxy, aryloxy and halogeno groups). If needed, $L^{17}$ may further have another functional group not reacting with isocyanate group such an ester, urethane, amido or ureido group. $Ar^2$ and $Ar^3$ may be the same or different and each represents an optionally substituted divalent aromatic hydrocarbon group, preferably an aromatic group having from 6 to 1 carbon atoms, and n represents an integer of from 0 to 10.

Particular examples of the diol compounds represented by the above formulae (U-26) and (U-27) are as follows.

For example, catechol, resorcin, hydroquinone, 4-methylcatechol, 4-t-butylcatechol, 4-acetylcatechol, 3-methoxycatechol, 4-phenylcatechol, 4-methylresorcin, 4-ethylresorcin, 4-t-butylresorcin, 4-hexylresorcin, 4-chlororesorcin, 4-benzylresorcin, 4-acetylresorcin, 4-carbomethoxyresorcin, 2-methylresorcin, 5-methylresorcin, t-butylhydroquinone, 2,5-d-t-butylhydroquinone, 2,5-di-t-amylhydroquinone, tetramethylhydroquinone, tetrachlorohydroquinone, methylcarboaminohydroquinone, methylureidohydroquinone, methylthiohydroquinone, benzonorbornene-3,6-diol, bisphenol A, bisphenol S, 3,3'-dichlorobisphenol S, 4,4'-dihydroxybenzophenone, 4,4'-dihydroxybiphenyl, 4,4'-thiodiphenol, 2,2'-dihydroxydiphenylmethane, 3,4-bis(p-hydroxyphenyl)hexane, 1,4-bis(2-(p-hydroxyphenyl)propyl) benzene, bis(4-hydroxyphenyl)methylamine, 1,3-dihydroxynaphthalene, 1,4-dihydroxynaphthalene, 1,5-dihydroxynaphthalene, 2,6-dihydroxynaphthalene, 1,5-dihydroxyanthraquinone, 2-hydroxybenzyl alcohol, 4-hydroxybenzyl alcohol, 2-hydroxy-3,5-di-t-butylbenzyl alcohol, 4-hydroxy-3,5-di-t-butylbenzyl alcohol, 4-hydroxyphenethyl alcohol, 2-hydroxyethyl-4-hydroxybenzoate, 2-hydroxyethyl-4-hydroxyphenyl acetate, resorcin mono-2-hydroxyethyl ether and so on.

Moreover, use can be appropriately made of diol compounds represented by the following formulae (U-28) to (U-30).

(U-28)

(U-29)

(U-30)

In the formulae (U-28) to (U-30), $R^{10}$ represents a hydrogen atom, or an alkyl, aralkyl, aryl, alkoxy or aryloxy group optionally having a substituent (for example, cyano, nitro, a halogen atom (—F, —Cl, —Br or —I), —CONH₂, —COOR¹¹, —OR¹¹, —NHCONHR¹¹, —NHCOOR¹¹, —NHCOR¹¹, —OCONHR¹¹ or —CONHR¹¹ (wherein $R^{11}$ represents an alkyl group having from 1 to 10 carbon atoms or an aralkyl group having from 7 to 15 carbon atoms)), preferably a hydrogen atom, an alkyl group having from 1 to 8 carbon atoms or an aryl group having from 6 to 15 carbon atoms. $L^{18}$, $L^{19}$ and $L^{20}$ may be the same or different and each represents a single bond or a divalent aliphatic or aromatic hydrocarbon group optionally having a substituent (preferable examples including alkyl, aralkyl, aryl, alkoxy, aryloxy and halogeno groups), preferably an alkylene group having from 1 to 20 carbon atoms or an arylene group having from 6 to 15 carbon atoms, and still preferably an alkylene group having from 1 to 8 carbon atoms. If needed, $L^{18}$, $L^{19}$ and $L^{20}$ may further have another functional group not reacting with isocyanate group such a carbonyl, ester, urethane, amido, ureido or ether group. Two or three members of $L^{18}$, $L^{19}$ and $L^{20}$ may form a ring. Ar represents an optionally substituted trivalent aromatic hydrocarbon group, preferably an aromatic group having from 6 to 15 carbon atoms. $Z_0$ represents the following group.

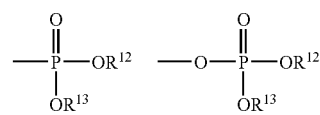

In the above formulae, $R^{12}$ and $R^{13}$ may be the same or different and each represents a hydrogen atom, sodium, potassium, an alkyl group or an aryl group, preferably a hydrogen atom, an alkyl group having from 1 to 8 carbon atoms or an aryl group having from 6 to 15 carbon atoms.

The diol compounds having phosphonic acid, phosphoric acid and/or esters thereof represented by the above formulae (U-28) to (U-30) can be synthesized by, for example, the following method.

Hydroxy group of a halogen compound represented by any of the following formulae (U-31) to (U-33) is protected if necessary. Then the compound is converted into a phosphonate ester by Michaelis-Arbuzov reaction represented by the following formula (U-34) followed by, if necessary, hydrolysis with the use of hydrogen bromide or the like.

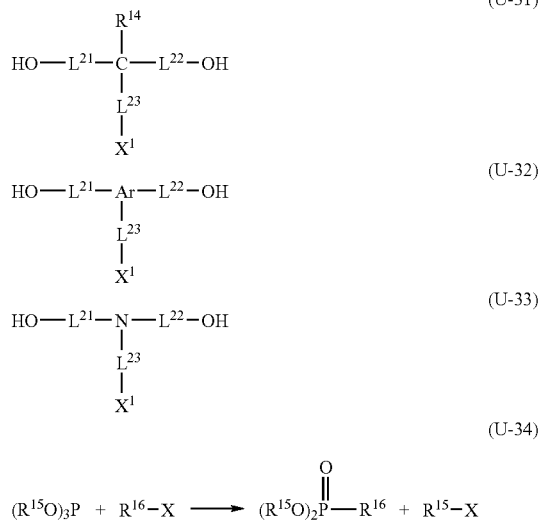

In the formulae (U-31) to (U-33), $R^{14}$ has the same meaning as $R^{10}$ defined in the formulae (U-28) to (U-30). $L^{21}$, $L^{22}$ and $L^{23}$ have each the same meaning as $L^{18}$, $L^{19}$ and $L^{20}$ and Ar also has the same meaning. $X^1$ represents a halogen atom.

In the formula (U-34), $R^{15}$ represents an alkyl group or an aryl group, preferably an alkyl group having from 1 to 8 carbon atoms or an aryl group having from 6 to 15 carbon atoms. $R^{16}$ is a residue obtained by removing X from a compound of any of the formulae (U-31) to (U-33), while X represents a halogen atom, preferably Cl, Br or I.

Alternatively, the synthesis can be made by a method of reacting with an phosphorus oxychloride represented by the following formula (U-35) followed by hydrolysis.

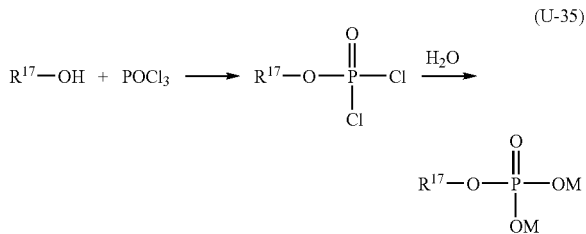

In the above formula, $R^{17}$ has the same meaning as $R^{16}$ defined in the formula (U-34), and M represents a hydrogen atom, sodium or potassium.

In the case of introducing a phosphonate group into the specific polyurethane resin according to the invention, synthesis can be also made by reacting any of the above-described diisocyanate compounds with a diol compound having a phosphonic acid ester group represented by any of the formulae (28) to (30) to thereby form a polyurethane resin followed by hydrolysis with the use of hydrogen bromide or the like.

Furthermore, the following amino group-containing compound may be reacted with various diisocyanate compounds as described above, similar to the diol compound, to form a urea structure which is incorporated into the polyurethane resin.

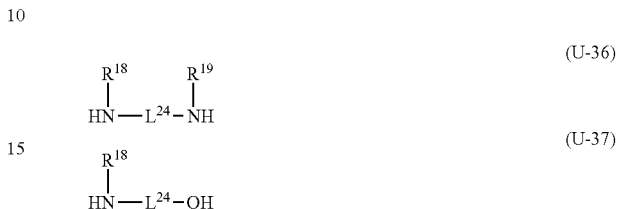

In the formulae (U-36) and (U-37), $R^{18}$ and $R^{19}$ may be the same or different and each represents a hydrogen atom or an alkyl, aralkyl or aryl group optionally having a substituent (for example, alkoxy, a halogen atom (—F, —Cl, —Br or —I), ester or carboxy), preferably a hydrogen atom, an alkyl group having from 1 to 8 carbon atoms or an aryl group having from 6 to 15 carbon atoms optionally having a carboxyl group as a substituent. $L^{24}$ represents a divalent aliphatic hydrocarbon group, an aromatic hydrocarbon group or a heterocyclic group optionally having a substituent (for example, alkyl, aralkyl, aryl, alkoxy, aryloxy, a halogen atom (—F, —Cl, —Br or —I) or carboxy). If necessary, L 24 may have another functional group not reacting with the isocyanate group such as a carbonyl, ester, urethane or amido group. Two members of $R^{18}$, $L^{24}$ and $R^{19}$ may form a ring.

Particular examples of the compounds represented by the above formulae (U-36) and (U-37) are as follows.

For example, aliphatic diamine compounds such as ethylenediamine, propylenediamine, tetramethylenediamine, pentamethylenediamine, hexamethylenediamine, heptamethylenediamine, octamethylenediamine, dodecamethylenediamine, propane-1,2-diamine, bis(3-aminoprpyl)methylamine, 1,3-bis(3-aminopropy)tetramethylsiloxane, piperazine, 2,5-dimethylpiperazine, N-(2-aminoethyl)piperazine, 4-amino-2,2-6,6-tetramethylpiperidine, N,N-dimethylethylenediamine, lysine, L-cysteine and isophoronediamine; aromatic diamine compounds such as o-phenylenediamine, m-phenylenediamine, p-phenylenediamine, 2,4-tolylenediamine, benzidine, o-ditolydine, o-dianinsidine, 4-nitrom-phenylenediamine, 2,5-dimethoxyp-phenylenediamine, bis(4-aminophenyl)sulfone, 4-carboxy-o-phenylenediamine, 3-carboxy-m-phenylenediamine, 4,4'-diaminophenyl ether and 1,8-naphthalenediamine; heterocyclic amine compounds such as 2-aminoimidazole, 3-aminoimidazole, 5-amino-1H-tetrazole, 4-aminopyrazole, 2-aminobenzimidazole, 2-amino-5-carbxy-triazole, 2,4-diamino-6-methyl-S-triazine, 2,6-diaminopyridine, L-histidine, DL-tryptophan and adenine; aminoalcohol or aminophenol compounds such as ethanolamine, N-methylethanolamine, N-ethylethanolamine, 1-amino-2-propanol, 1-amino-3-propanol, 2-aminoethoxyethanol, 2-aminothioethoxyethanol, 2-amino-2-methyl-1-propanol, p-aminophenol, m-aminophenol, o-aminophenol, 4-methyl-2-aminophenol, 2-chloro-4-aminophenol, 4-methoxy-3-aminophenol, 4-hydroxybenzylamine, 4-amino-1-naphthol, 4-aminosalicylic acid, 4-hydroxy-N-phenyglycine, 2-aminobenzyl alcohol, 4-aminophenethyl alcohol, 2-carboxy-5-ammo-1-naphthol and L-tyrosine; and so on.

The specific polyurethane resin according to the invention is synthesized by, to such an isocyanate compound and such a diol compound respectively as described above, adding a publicly known catalyst which has an activity appropriate for the reactivties of these compound and heating in an aprotic solvent. The isocyanate compound and the diol compound are employed preferably at a molar ratio of from 0.8:1 to 1.2:1. In the case where isocyanate group remains at the polymer terminal, the product is treated with an alcohol or an amine so as to give a final product free from isocyanate group.

From the viewpoint of printing tolerance, a preferred embodiment of the specific polyurethane resin according to the invention is a polyurethane resin containing 10% by mass or more, still preferably 20% by mass or more, of an aromatic moiety, in particular, an aromatic diisocyanate.

From the viewpoint of development properties, it is preferable that the specific polyurethane resin has an acid value of 0.4 meq/g or more. From the viewpoint of sensitivity, it is preferable that the specific polyurethane resin contains 0.1 meq/g or more, still preferably 0.4 meq/g or more, of an unsaturated carbon-carbon bond in the main chain.

From the viewpoints of storage stability and sensitivity, it is also preferable that the specific polyurethane resin has a glass transition temperature (Tg) of 20° C. or higher, still preferably 30° C. or higher.

Moreover, the weight-average molecular weight of the specific polyurethane resin is preferably 5,000 or more, still preferably from 10,000 to 300,000. Its number-average molecular weight is preferably 10,000 or more and still preferably form 30,000 to 200,000. The polydispersion degree (weight-average molecular weight/number-average molecular weight) is preferably 1 or more, still preferably from 1.1 to 10.

As the specific polyurethane resin, either one resin or a mixture of two or more may be used. In addition to (A) the specific polyurethane resin, use can be also made of (E) a binder polymer, so long as the advantages of the invention are not worsened thereby. In this case, it is preferable to use (E) the binder polymer in an amount of 90% by mass or less, still preferably 70% by mass or less, based on the total polymer compounds involving (A) the specific polyurethane resin.

The content of (A) the specific polyurethane resin in the recording layer of the lithographic printing plate precursor according to the invention ranges from about 5 to 95% by mass, in terms of solid matter, still preferably from about 10 to 85% by mass. In the case where the addition level thereof is less than 5% by mass, the image part has only an insufficient strength after forming an image. In the case where the addition level thereof exceeds 95% by mass, image forming properties are liable to be worsened.

The polymerizable composition according to the another embodiment of the invention is a polymerizable composition characterized by containing a polyurethane resin (A') which is soluble or swellable in water or an aqueous alkali solution and has a hydroxyl group and an unsaturated carbon-carbon bond in its side chain and a radical initiator (B). In a preferred embodiment, the polymerizable composition according to the another embodiment of the invention further contains a sensitization dye (C) having a function of absorbing light at a definite wavelength and converting into heat and a polymerizable compound (D) for elevating the strength of an image part.

Now each of the compounds constituting the polymerizable composition according to the another embodiment of the invention will be illustrated.

[(A') Polyurethane resin being soluble or swellable in water or aqueous alkali solution and having hydroxyl group and unsaturated carbon-carbon bond in its side chain]

The polyurethane resin (A') to be used in the another embodiment of the invention (hereinafter optionally referred to as the specific polyurethane resin) is characterized by being obtained by adding an epoxy compound having an unsaturated carbon-carbon bond to a polyurethane resin having carboxyl group.

First, the polyurethane resin having carboxyl group to be used in synthesizing the specific polyurethane resin according to the another embodiment of the invention will be described.

[Polyurethane Resin Having Carboxyl Group]

The polyurethane resin according to the another embodiment of the invention has, as its fundamental skeleton, a structural unit represented by a product of a reaction between at least one isocyanate group and at least one diol compound and carries carboxyl group in its side chain. Among all, polyurethane resins having at least one of the structural units derived from diol compounds represented by the following formulae (1), (2) and (3) and structural units derived from compounds prepared by ring-opening tetracarboxylic dianhydrides with a diol compound.

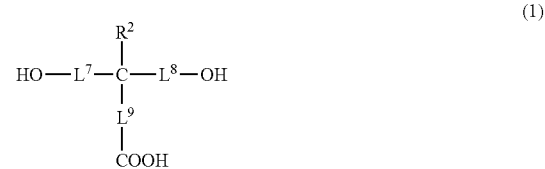

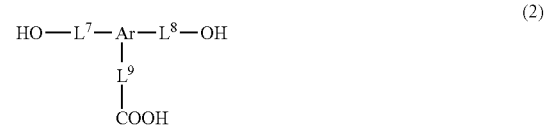

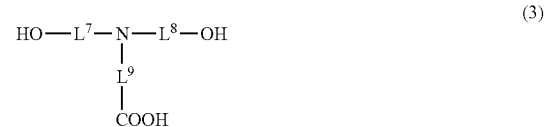

In the above formulae, $R^2$ represents a hydrogen atom or an alkyl group, an aralkyl group, an aryl group, an alkoxy group or an aryloxy group each optionally having a substituent (for example, a cyano group, a nitro group, a halogen atom such as —F, —Cl, —Br or —I, —CONH$_2$, —COOR$^3$, —OR$^3$, —NHCONHR$^3$, —NHCOOR$^3$, —NHCOR$^3$, —OCONHR$^3$ (wherein $R^3$ represents an alkyl group having from 1 to 10 carbon atoms or an aralkyl group having from 6 to 15 carbon atoms) or the like). It preferably represents a hydrogen atom, an alkyl group having from 1 to 8 carbon atoms or an aryl group having from 6 to 15 carbon atoms. $L^7$, $L^8$ and $L^9$ may be the same or different and each represents a single bond or a divalent aliphatic or aromatic hydrocarbon group optionally having a substituent (preferably being, for example, an alkyl, aralkyl, aryl, alkoxy or halogeno group). These groups preferably represent each an alkylene group having from 1 to 20 carbon atoms or an arylene group having form 6 to 15 carbon atoms, still preferably an alkylene group having from 1 to 8 carbon atoms. If necessary, $L^7$, $L^8$ and $L^9$ may further have another functional group not reacting with the isocyanate group such as a carbonyl, ester, urethane, amido, ureido or ether group. Furthermore, two or three members of $R^2$, $L^7$, $L^8$ and $L^9$ may form together a ring.

Ar represents an optionally substituted trivalent aromatic hydrocarbon group. It preferably represents an aromatic group having from 6 to 15 carbon atoms.

Particular examples of the diol compounds having carboxyl group represented by the formulae (1), (2) and (3) areas follows.

For example, citation may be made of 3,5-dihydroxybenzoic acid, 2,2-bis(hydorxymethyl)propionic acid, 2,2-bis(2-hydorxyethyl)propionic acid, 2,2-bis(3-hydorxypropyl)propionic acid, bis(hydroxymethyl)acetic acid, bis(4-hydroxyphenyl)acetic acid, 2,2-bis(hydroxymethyl)butyric acid, 4,4-bis(4-hydroxyphenyl)pentanoic acid, tartaric acid, N,N-dihydroxyethylglycine and N,N-bis(2-hydroxyethyl)-3-carboxy-propionamide.

As examples of the tetracarboxylic acid dihydride, compounds represented by the following formulae (4), (5) and (6) may be cited.

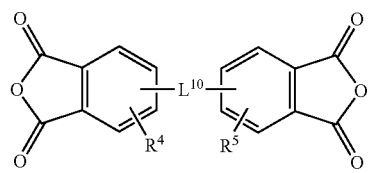 (4)

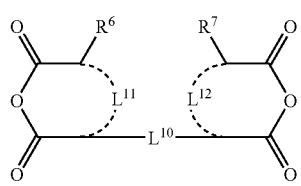 (5)

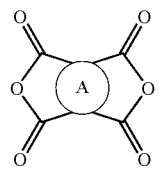 (6)

In the above formulae, $L^{10}$ represents a single bond, a divalent aliphatic or aromatic hydrocarbon group optionally having a substituent (preferably being, for example, an alkyl, aralkyl, aryl, alkoxy, halogeno, ester or amido group), —CO—, —SO—, —SO$_2$—, —O— or —S—. It preferably represents a single bond, a divalent aliphatic group having from 1 to 15 carbon atoms, —CO—, —SO$_2$—, —O— or —S—. $R^4$ and $R^5$ may be the same or different and each represents a hydrogen atom, an alkyl group, an aralkyl group, an aryl group, an alkoxy group or a halogeno group, preferably a hydrogen atom, an alkyl group having from 1 to 8 carbon atoms, an aryl group having from 6 to 15 carbon atoms, an alkoxy group having form 1 to 8 carbon atoms or a halogeno atom. Furthermore, two members of $L^{10}$, $R^4$ and $R^5$ may be bonded to each other to form a ring.

$R^6$ and $R^7$ may be the same or different and each represents a hydrogen atom, an alkyl group, an aralkyl group, an aryl group or a halogeno group, preferably a hydrogen atom, an alkyl group having from 1 to 8 carbon atoms or an aryl group having from 6 to 15 carbon atoms. Furthermore, two members of $L^{10}$, $R^6$ and $R^7$ may be bonded to each other to form a ring. $L^{11}$ and $L^{12}$ may be the same or different and each represents a single bond, a double bond or a divalent aliphatic hydrocarbon group, preferably a single bond, a double bond or a methylene group. A represents a mononuclear or multinuclear aromatic ring, preferably an aromatic ring having from 6 to 18 carbon atoms.

Particular examples of the compounds represented by the formulae (4), (5) or (6) are as follows.

For example, aromatic tetracarbxylic dianhydrides such as pyromelitic dianhydride, 3,3',4,4'-benzophenone tetracarboxylic dianhydride, 3,3',4,4'-diphenyltetracarboxylic dianhydride, 2,3,6,7-naphthalene tetracarboxylic dianhydride, 1,4,5,8-naphthalene tetracarboxylic dianhydride, 4,4'-sulfonyl diphthalic dianhydride, 2,2-bis(3,4-dicarboxyphenyl) propane dianhydride, bis(3,4-dicarboxyphenyl) ether dianhydride, 4,4'-[3,3'-(alkylphosphoryldiphenylene)-bis (iminocarbonyl) ]diphthalic dianhydride, an adduct of hydroquinone diacetate to trimelitic anhydride and an adduct of diacetyldiamine to trimelitic anhydride; alicyclic tetracarboxylic dianhydrides such as 5-(2,5-dioxotetrahydrofuryl)-3-methyl-3-cyclohexene-1,2-dicarboxylic acid anhydride (EPICLON B-4400 manufactured by Dainippon Ink and Chemicals Inc.) 1,2,3,4-cyclopentane tetracarboxylic dianhydride, 1,2,4,5-cyclohexane tetracarboxylic dianhydride and tetrahydrofuran tetracarboxylic dianhydride; and aliphatic tetracarboxylic dianhydrides such as 1,2,3,4-butane tetracarbocylic dianhydride and 1,2,4,5-pentane tetracarboxylic dianhydride.

A structural unit derived from a compound prepared by ring-opening such a tetracarboxylic dianhydride by a diol compound can be introduced into the polyurethane resin by, for example, the following methods.

a) A method wherein a compound having an alcholic terminal, which is obtained by ring-opening a tetracarboxylic dianhydride by a diol compound, is reacted with a diisocyanate compound.

b) A method wherein a urethane compound having an alcoholic terminal, which is obtained by reacting a diisocyanate compound in the presence of a diol compound in excess, is reacted with a tetracarboxylic dianhydride.

Particular examples of the diol compound to be used herein are as follows.

For example, ethylene glycol, diethylene glycol, triethylene glycol, tetraethylene glycol, propylene glycol, dipropylene glycol, polyethylene glycol, polypropylene glycol, neopentyl glycol, 1,3-butylene glycol, 1,6-heanediol, 2-butene-1,4-diol, 2,2,4-trimethyl-1,3-pentanediol, 1,4-bis-β-hydroxyethoxycyclohexane, cyclohexane dimethanol, tricyclodecane dimethanol, hydrogenated bisphenol A, hydrogenated bisphenol F, ethylene oxide adduct of bisphenol A, propylene oxide adduct of bisphenol A, ethylene oxide adduct of bisphenol F, propylene oxide adduct of bisphenol F, ethylene oxide adduct of hydrogenated bisphenol A, propylene oxide adduct of hydrogenated bisphenol A, hydroquinone dihydroxy ethyl ether, p-xylylene glycol, dihydroxyethyl sulfone, bis(2-hydroxyethyl)-2,4-tolylene dicarbamate, 2,4-tolylene-bis(2-hydroxyethylcarbamide), bis(2-hydroxyethyl)-m-xylylene dicarbamate and bis(2-hydroxyethyl) isophthalate may be cited.

[Isocyanate Compound]

As the isocyanate compound which is reacted with the diol compound having carboxyl group or a compound prepared by ring-opening tetracarboxylic dianhydrides with a diol compound as described above, isocyanate compounds represented by the following formula (7) are preferred.

OCN—X$^0$—NCO    (7)

wherein X$^0$ represents a divalent organic group.

Preferable examples of the above diisocyanate compounds are diisocyanate compounds represented by the following formula (8).

$$OCN-L^1-NCO \tag{8}$$

In the formula, $L^1$ represents an optionally substituted divalent aliphatic or aromatic hydrocarbon group. If needed, $L^1$ may further have another functional group not reacting with the isocyanate group such as an ester, urethane, amido or ureido group.

Particular examples of the diisocyanate compounds represented by the above formula (8) are as follows.

Namely, aromatic diisocyanate compounds such as 2,4-tolylene-diisocyanate, 2,4-tolylene-diisocyanate dimer, 2,6-tolylene-diisocyanate, p-xylylene diisocyanate, m-xylylene diisocyanate, 4,4'-diphenylmethane diisocyanate, 1,5-naphthylene and diisocyanate3,3'-dimethylphenyl-4,4'-diisocyanate; aliphatic diisocyanate compounds such as hexamethylene diisocyanate, trimethylhexane diisocyanate, lysine diisocyanate and dimeric acid diisocyanate; alicyclic diisocyanate compounds such as isophorone diisocyanate, 4,4'-methylelnebis(cyclohexyl isocyanate), methylcyclohexane-2,4 (or 2,6) diisocyanate and 1,3-(isocyanatemethyl) cyclohexane; diisocyanate compounds which are reaction product of diol with diisocyanate such as 1,3-butylene glycol (1 mol) and tolylene diisocyanate (2 mol) adduct; and so on.

[Other Diol Compounds]

In synthesizing the polyurethane resin having carboxyl group according to the another embodiment of the invention, other diols as will be described hereinafter can be also employed so long as the advantages of the another embodiment of the invention are not deteriorated thereby.

As other diol compounds, diol compounds represented by the following formula (9) are preferable.

$$HO-Y^0-OH \tag{9}$$

wherein $Y^0$ represents a divalent organic group.

Examples of these diol compounds include, in a broad meaning, polyether diol compounds, polyester diol compounds and polycarbonate diol compounds.

Examples of the polyether diol include compounds represented by the following formulae (10), (11), (12), (13) and (14) and random copolymers of ethylene oxide with propylene oxide having a hydroxyl group at the terminal.

(10)

(11)

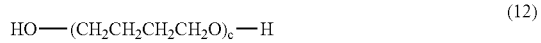
(12)

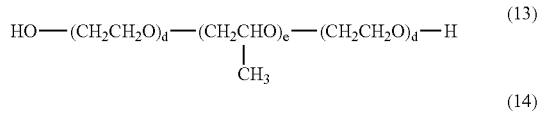
(13)

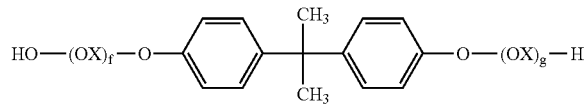
(14)

In the above formulae, $R^1$ represents a hydrogen atom or a methyl group, and X represents one of the following groups.

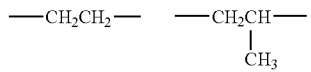

a, b, c, d, e, f and g represent each an integer of 2 or more, preferably an integer of from 2 to 100.

Particular examples of polyether diol compounds represented by the formulae (10) and (11) are as follows.

For example, diethylene glycol, triethylene glycol, tetraethylene glycol, pentaethylene glycol, hexaethylene glycol, heptaethylene glycol, octaethylene glycol, di-1,2-propylene glycol, tri-1,2-propylene glycol, tetra-1,2-propylene glycol, hexa-1,2-propylene glycol, di-1,3-propylene glycol, tri-1,3-propylene glycol, tetra-1,3-propylene glycol, di-1,3-butylene glycol, tri-1,3-butylene glycol, tetra-1,3-butylene glycol, polyethylene glycol having a weight-average molecular weight of 1000, polyethylene glycol having a weight-average molecular weight of 1500, polyethylene glycol having a weight-average molecular weight of 2000, polyethylene glycol having a weight-average molecular weight of 3000, polyethylene glycol having a weight-average molecular weight of 7500, polypropylene glycol having a weight-average molecular weight of 400, polypropylene glycol having a weight-average molecular weight of 700, polypropylene glycol having a weight-average molecular weight of 1000, polypropylene glycol having a weight-average molecular weight of 2000, polypropylene glycol having a weight-average molecular weight of 3000 and polypropylene glycol having a weight-average molecular weight of 4000 may be cited.

Particular examples of the polyether diol compound represented by the formula (12) are as follows.

For example, PTMG650, PTMG1000, PTMC2000, PTMG3000 (each being trade name manufactured by SANYO KASEI Co., Ltd.) and so on.

Particular examples of the polyether diol compound represented by the formula (13) are as follows.

For example, NEWPOL PE-61, NEWPOL PE-62, NEWPOL PE-64, NEWPOL PE-68, NEWPOL PE-71, NEWPOL PE-74, NEWPOL PE-75, NEWPOL PE-78, NEWPOL PE-108, NEWPOL PE-128 (each being trade name manufactured by SANYO KASEI Co., Ltd.) and so on.

Particular examples of the polyether diol compound represented by the formula (U-16) are as follows.

For example, NEWPOL BPE-20, NEWPOL BPE-20F, NEWPOL BPE-20NK, NEWPOL BPE-20T, NEWPOL BPE-20G, NEWPOL BPE-40, NEWPOL BPE-60, NEWPOL BPE-100, NEWPOL BPE-180, NEWPOL BPE-2P, NEWPOL BPE-23P, NEWPOL BPE-3P, NEWPOL BPE-5P (each being trade name manufactured by SANYO KASEI Co., Ltd.) and so on.

Particular examples of the random copolymers of ethylene oxide with propylene oxide having a hydroxyl group at the terminal are as follows.

For example, NEWPOL 50HB-100, NEWPOL 50HB-260, NEWPOL 50HB-400, NEWPOL 50HB-660, NEWPOL 50HB-2000, NEWPOL 50HB-5100 (each being trade name manufactured by SANYO KASEI Co., Ltd.) and so on.

Examples of the polyester diol compounds include compounds represented by the following formulae (15) and (16).

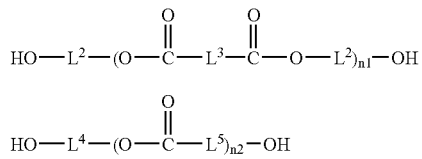 (15)

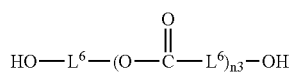 (16)

In the formulae, $L^2$, $L^3$ and $L^4$ may be the same or different and each represents a divalent aliphatic or aromatic hydrocarbon group, and $L^5$ represents a divalent aliphatic hydrocarbon group. It is preferable that $L^2$, $L^3$ and $L^4$ each represents an alkylene group, an alkenylene group or an arylene group, while $L^5$ represents an alkylene group. $L^2$, $L^3$, $L^4$ and $L^5$ may each further have another functional group not reacting with isocyanate group such as an ether, carbonyl, ester, cyano, olefin, urethane, amido or ureido group or a halogen atom. n1 and n2 are each an integer of 2 or more, preferably an integer of from 2 to 100.

Examples of the polycarbonate diol compounds include compounds represented by the following formula (17).

(17)

HO—$L^6$—(O—C(=O)—$L^6$)$_{n3}$—OH

In the formula, $L^6$'s may be the same or different and each represents a divalent aliphatic or aromatic hydrocarbon group. It is preferable that $L^6$ represents an alkylene group, an alkenylene group or an arylene group. $L^6$ may further have another functional group not reacting with isocyanate group such as an ether, carbonyl, ester, cyano, olefin, urethane, amido or ureido group or a halogen atom. n3 is an integer of 2 or more, preferably an integer of from 2 to 100.

Particular examples of the diol compounds represented by the formulae (15), (16) or (17) include the following Example Compound No. 1) to (Example Compound No. 18) wherein n is an integer of 2 or more.

(No. 1)

(No. 2)

(No. 3)

(No. 4)
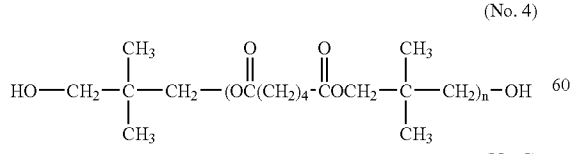

(No. 5)
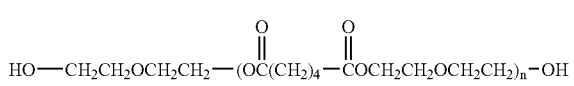

-continued (No. 6)
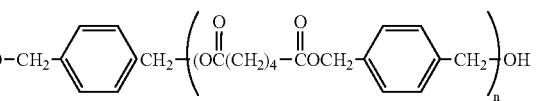

(No. 7)
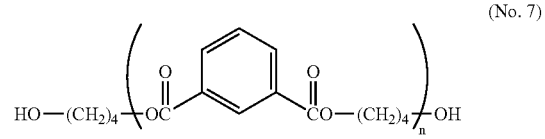

(No. 8)
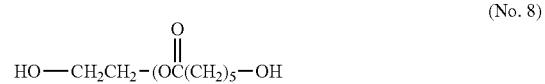

(No. 9)
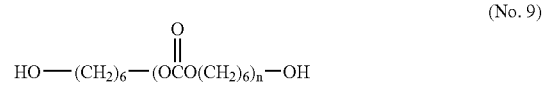

(No. 10)
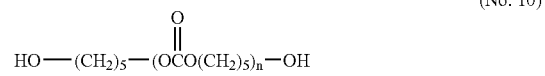

(No. 11)
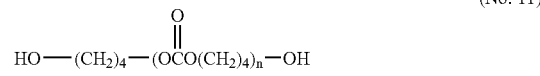

(No. 12)
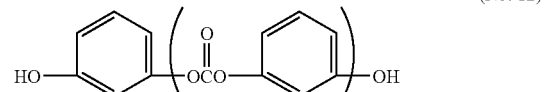

(No. 13)

(No. 14)
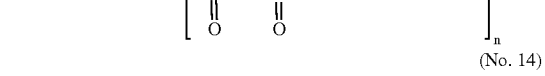

(No. 15)
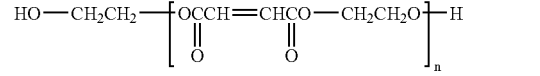

(No. 16)
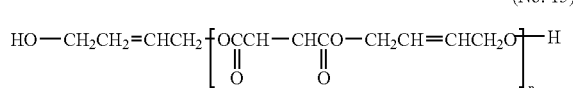

(No. 17)

(No. 18)
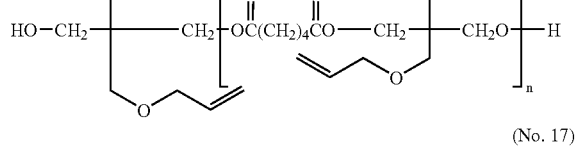

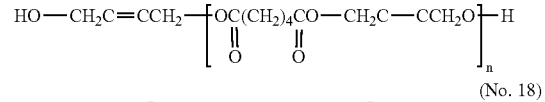

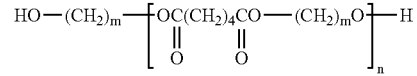

m = 2, 4

To synthesize the polyurethane resin having carboxyl group, use can be also made of diol compounds (as other diol compounds) which have no carboxyl group but another functional group not reacting with isocyanate.

Examples of such diol compound are as follows.

$$HO-L^{13}-O-CO-L^{14}-CO-L^{13}-OH \tag{18}$$

$$HO-L^{14}-CO-O-L^{13}-OH \tag{19}$$

In the formulae, $L^{13}$ and $L^{14}$ may be the same or different and each represents a divalent aliphatic or aromatic hydrocarbon group or a heterocyclic group optionally having a substituent (for example, an alkyl group, an aralkyl group, an aryl group, an alkoxy group, an aryloxy group, a halogen atom such as —F, —Cl, —Br or —I or the like). If needed, $L^{13}$ and $L^{14}$ may each further have another functional group not reacting with isocyanate group such a carbonyl, ester, urethane, amido or ureido group. $L^{13}$ and $L^{14}$ may form a ring together.

Particular examples of the compounds represented by the above formula (18) or (19) include the following (Example Compound No. 19) to (Example Compound No. 35).

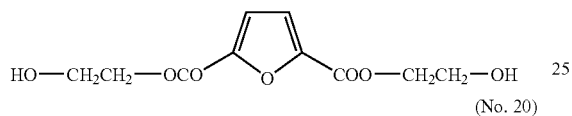
(No. 19)

HO—CH$_2$CH$_2$—OCO—CH=CH—COO—CH$_2$CH$_2$—OH (No. 20)

HO—CH$_2$CH$_2$—OCO—(CH$_2$)$_{11}$—COO—CH$_2$CH$_2$—OH (No. 21)

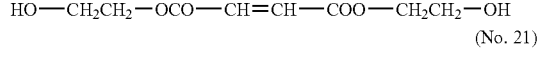
(No. 22)

HO—CH$_2$CH$_2$—OCO—C≡C—COO—CH$_2$CH$_2$—OH (No. 23)

(No. 24)

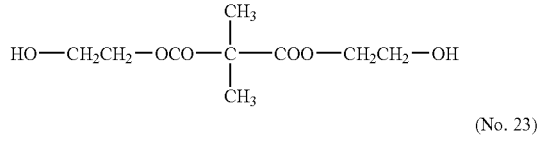
(No. 25)

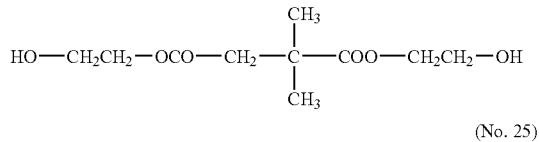
(No. 26)

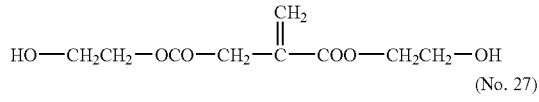
(No. 27)

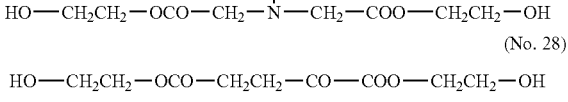
(No. 28)

HO—CH$_2$CH$_2$—OCO—CH$_2$CH$_2$—CO—COO—CH$_2$CH$_2$—OH (No. 29)

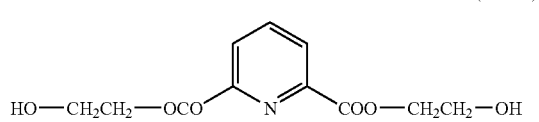

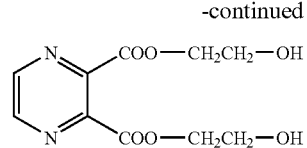
(No. 30)

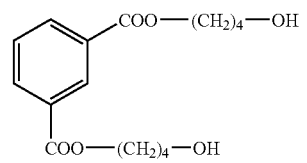
(No. 31)

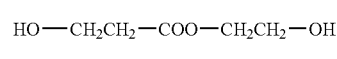
(No. 32)

HO—CH$_2$CH$_2$—COO—CH$_2$CH$_2$—OH (No. 33)

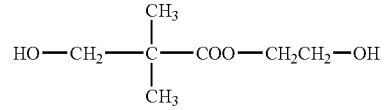
(No. 34)

H$_3$C—CH—CH$_2$—COO—CH$_2$CH$_2$—OH  
      |  
     OH (No. 35)

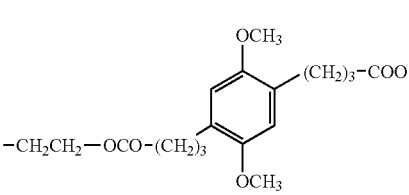

Moreover, use can be appropriately made of diol compounds represented by the following formulae (20) and (21).

$$HO(CH_2)_cOH \tag{20}$$

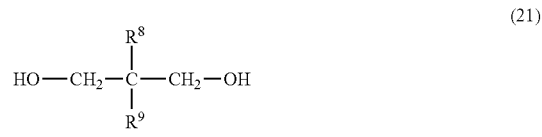
(21)

In the formulae, $R^8$ and $R^9$ may be the same or different and each represents an optionally substituted alkyl group and c is an integer of 2 or more, preferably an integer of from 2 to 100.

Particular examples of the diol compounds represented by the formulae (20) and (21) are as follows.

Examples of the compound of the formula (20) include ethylene glycol, 1,3-propanediol, 1,4-butanediol, 1,5-pentanediol, 1,6-hexanediol, 1,7-heptanediol and 1,8-octanediol. Examples of the compound of the formula (21) include the following compounds.

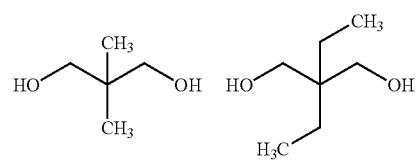

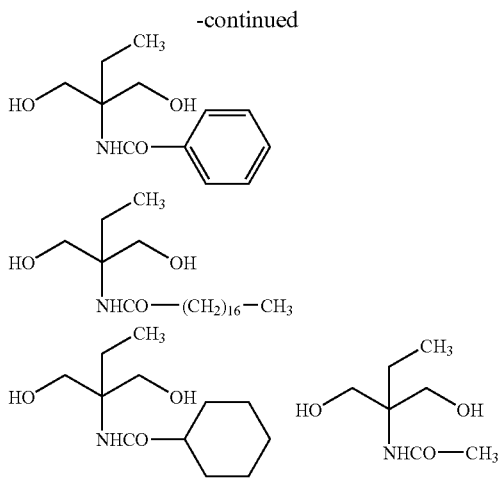

Moreover, use can be appropriately made of diol compounds represented by the following formulae (22) and (23).

$$HO\text{-}L^{15}\text{-}NH\text{—}CO\text{-}L^{16}\text{-}CO\text{—}NH\text{-}L^{15}\text{-}OH \quad (22)$$

$$HO\text{-}L^{16}\text{-}CO\text{—}NH\text{-}L^{15}\text{-}OH \quad (23)$$

In the formulae, $L^{15}$ and $L^{16}$ may be the same or different and each represents a divalent aliphatic or aromatic hydrocarbon group or a heterocyclic group optionally having a substituent (for example, an alkyl, aralkyl, aryl, alkoxy or aryloxy group, a halogen atom such as —F, —Cl, —Br or —I or the like). If needed, $L^{15}$ and $L^{16}$ may each further have another functional group not reacting with isocyanate group such a carbonyl, ester, urethane, amido or ureido group. $L^{15}$ and $L^{16}$ may form a ring together.

Particular examples of the compounds represented by the formula (22) and (23) include the following (Example Compound No. 36) to (Example Compound No. 45).

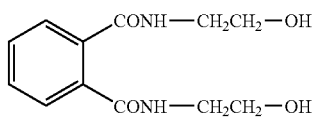
(No. 36)

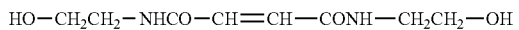
(No. 37)

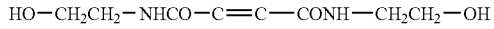
(No. 38)

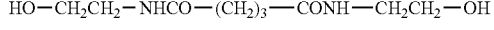
(No. 39)

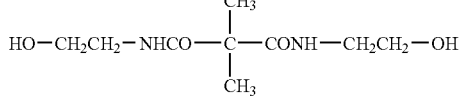
(No. 40)

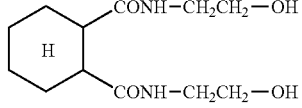
(No. 41)

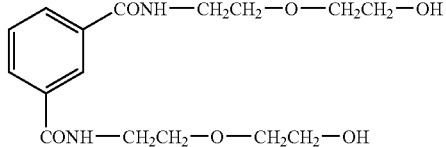
(No. 42)

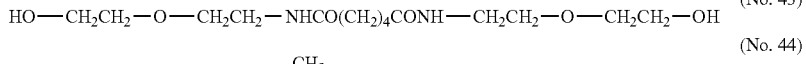
(No. 43)

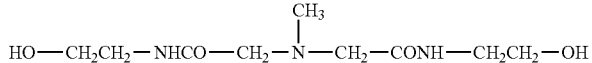
(No. 44)

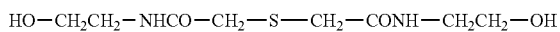
(No. 45)

Moreover, use can be appropriately made of diol compounds represented by the following formulae (24) and (25).

In the formulae, $L^{17}$ represents a divalent aliphatic hydrocarbon group optionally having a substituent (preferable examples including alkyl, aralkyl, aryl, alkoxy, aryloxy and halogeno groups). If needed, $L^{17}$ may further have another functional group not reacting with isocyanate group such an ester, urethane, amido or ureido group. $Ar^2$ and $Ar^3$ may be the same or different and each represents an optionally substituted divalent aromatic hydrocarbon group, preferably an aromatic group having from 6 to 1 carbon atoms, and n represents an integer of from 0 to 10.

Particular examples of the diol compounds represented by the above formulae (24) and (25) are as follows.

For example, catechol, resorcin, hydroquinone, 4-methylcatechol, 4-t-butylcatechol, 4-acetylcatechol, 3-methoxycatechol, 4-phenylcatechol, 4-methylresorcin, 4-ethylresorcin, 4-t-butylresorcin, 4-hexylresorcin, 4-chlororesorcin, 4-benzylresorcin, 4-acetylresorcin, 4-carbomethoxyresorcin, 2-methylresorcin, 5-methylresorcin, t-butylhydroquinone, 2,5-d-t-butylhydroquinone, 2,5-di-t-amylhydroquinone, tetramethylhydroquinone, tetrachlorohydroquinone, methylcarboaminohydroquinone, methylureidohydroquinone, methylthiohydroquinone, benzonorbornene-3,6-diol, bisphenol A, bisphenol S, 3,3'-dichlorobisphenol S, 4,4'-dihydroxybenzophenone, 4,4'-dihydroxybiphenyl, 4,4'-thiodiphenol, 2,2'-dihydroxydiphenylmethane, 3,4-bis(p-hydroxyphenyl)hexane, 1,4-bis(2-(p-hydroxyphenyl)propyl) benzene, bis(4-hydroxyphenyl)methylamine, 1,3-dihydroxynaphthalene, 1,4-dihydroxynaphthalene, 1,5-dihydroxynaphthalene, 2,6-dihydroxynaphthalene, 1,5-dihydroxyanthraquinone, 2-hydroxybenzyl alcohol, 4-hydroxybenzyl alcohol, 2-hydroxy-3,5-di-t-butylbenzyl alcohol, 4-hydroxy-3,5-di-t-butylbenzyl alcohol, 4-hydroxyphenethyl alcohol, 2-hydroxyethyl-4-hydroxybenzoate, 2-hydroxyethyl-4-hydroxyphenyl acetate, resorcin mono-2-hydroxyethyl ether and so on.

Moreover, use can be appropriately made of diol compounds represented by the following formulae (26), (17) and (28).

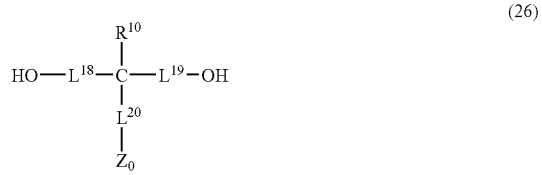

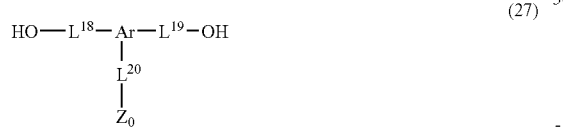

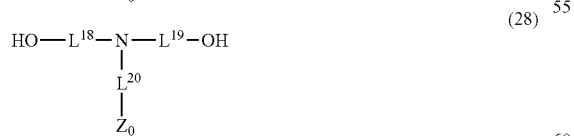

In the formulae, $R^{10}$ represents a hydrogen atom, or an alkyl, aralkyl, aryl, alkoxy or aryloxy group optionally having a substituent (for example, cyano, nitro, a halogen atom (—F, —Cl, —Br or —I), —CONH$_2$, —COOR$^{11}$, —OR$^{11}$, —NHCONHR$^{11}$, —NHCOOR$^{11}$, —NHCOR$^{11}$, —OCONHR$^{11}$ or —CONHR$^{11}$ (wherein $R^{11}$ represents an alkyl group having from 1 to 10 carbon atoms or an aralkyl group having from 7 to 15 carbon atoms)), preferably a hydrogen atom, an alkyl group having from 1 to 8 carbon atoms or an aryl group having from 6 to 15 carbon atoms. $L^{18}$, $L^{19}$ and $L^{20}$ may be the same or different and each represents a single bond or a divalent aliphatic or aromatic hydrocarbon group optionally having a substituent (preferable examples including alkyl, aralkyl, aryl, alkoxy, aryloxy and halogeno groups), preferably an alkylene group having from 1 to 20 carbon atoms or an arylene group having from 6 to 15 carbon atoms, and still preferably an alkylene group having from 1 to 8 carbon atoms. If needed, $L^{18}$, $L^{19}$ and $L^{20}$ may further have another functional group not reacting with isocyanate group such a carbonyl, ester, urethane, amido, ureido or ether group. Two or three members of $L^{18}$, $L^{19}$ and $L^{20}$ may form a ring. Ar represents an optionally substituted trivalent aromatic hydrocarbon group, preferably an aromatic group having from 6 to 15 carbon atoms. $Z_0$ represents the following group.

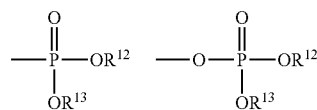

In the above formulae, $R^{12}$ and $R^{13}$ may be the same or different and each represents a hydrogen atom, sodium, potassium, an alkyl group or an aryl group, preferably a hydrogen atom, an alkyl group having from 1 to 8 carbon atoms or an aryl group having from 6 to 15 carbon atoms.

The diol compounds having phosphonic acid, phosphoric acid and/or esters thereof represented by the above formulae (26), (27) and (28) can be synthesized by, for example, the following method.

Hydroxy group of a halogen compound represented by any of the following formulae (29), (30) and (31) is protected if necessary. Then the compound is converted into a phosphonate ester by Michaelis-Arbuzov reaction represented by the following formula (32) followed by, if necessary, hydrolysis with the use of hydrogen bromide or the like.

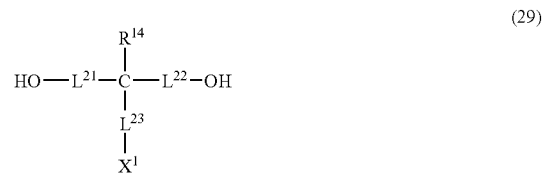

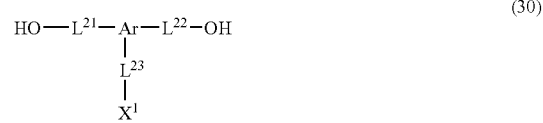

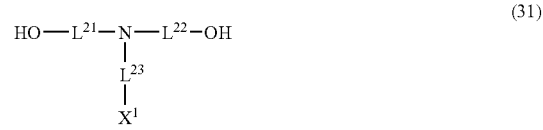

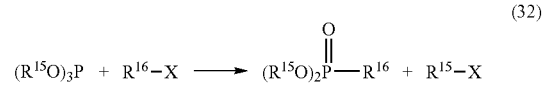

In the formulae, $R^{14}$, $L^{21}$, $L^{22}$ and $L^{23}$ have each the same meaning as in the formulae (26), (27) and (28). $R^{15}$ represents an alkyl group or an aryl group, preferably an alkyl group having from 1 to 8 carbon atoms or an aryl group having from 6 to 15 carbon atoms. $R^{16}$ is a residue obtained by removing X from a compound of any of the formulae (39), (30) and (31), while $X^1$ represents a halogen atom, preferably Cl, Br or I.

Alternatively, the synthesis can be made by a method of reacting with an phosphorus oxychloride represented by the following formula (33) followed by hydrolysis.

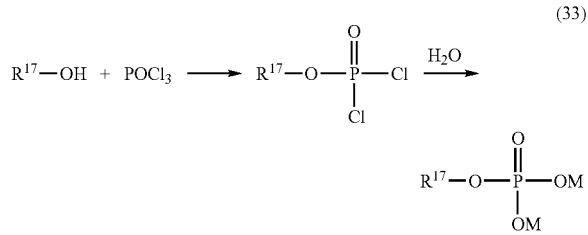

(33)

In the formula, $R^{17}$ has the same meaning as in the formula (32), and M represents a hydrogen atom, sodium or potassium.

In the case where the polyurethane resin according to the another embodiment of the invention having carboxyl group has further a phosphonate group, synthesis can be also made by reacting a diisocyanate compound represented by the above formula (8) with a diol compound having a phosphonic acid ester group represented by any of the formulae (26), (27) and (28) to thereby form a polyurethane resin followed by hydrolysis with the use of hydrogen bromide or the like.

Furthermore, an amino group-containing compound represented by the following formula (34) or (35) may be reacted with the diisocyanate compound represented by the above formula (8), similar to the diol compound, to form a urea structure which is incorporated into the polyurethane resin.

(34)

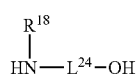

(35)

In the formulae, $R^{18}$ and $R^{19}$ may be the same or different and each represents a hydrogen atom or an alkyl, aralkyl or aryl group optionally having a substituent (for example, alkoxy, a halogen atom (—F, —Cl, —Br or —I), ester or carboxy), preferably a hydrogen atom, an alkyl group having from 1 to 8 carbon atoms or an aryl group having from 6 to 15 carbon atoms optionally having a carboxyl group as a substituent. $L^{24}$ represents a divalent aliphatic hydrocarbon group, an aromatic hydrocarbon group or a heterocyclic group optionally having a substituent (for example, alkyl, aralkyl, aryl, alkoxy, aryloxy, a halogen atom (—F, —Cl, —Br or —I) or carboxy). If necessary, $L^{24}$ may have another functional group not reacting with the isocyanate group such as a carbonyl, ester, urethane or amido group. Two members of $R^{18}$, $L^{24}$ and $R^{19}$ may form a ring.

Particular examples of the compounds represented by the formulae (34) and (35) are as follows.

For example, aliphatic diamine compounds such as ethylenediamine, propylenediamine, tetramethylenediamine, pentamethylenediamine, hexamethylenediamine, heptamethylenediamine, octamethylenediamine, dodecamethylenediamine, propane-1,2-diamine, bis(3-aminoprpyl)methylamine, 1,3-bis(3-aminopropy)tetramethylsiloxane, piperazine, 2,5-dimethylpiperazine, N-(2-aminoethyl)piperazine, 4-amino-2,2-6,6-tetramethylpiperidine, N,N-dimethylethylenediamine, lysine, L-cysteine and isophoronediamine; aromatic diamine compounds such as o-phenylenediamine, m-phenylenediamine, p-phenylenediamine, 2,4-tolylenediamine, benzidine, o-ditolydine, o-dianinsidine, 4-nitrom-phenylenediamine, 2,5-dimethoxyp-phenylenediamine, bis(4-aminophenyl)sulfone, 4-carboxy-o-phenylenediamine, 3-carboxy-m-phenylenediamine, 4,4'-diaminophenyl ether and 1,8-naphthalenediamine; heterocyclic amine compounds such as 2-aminoimidazole, 3-aminoimidazole, 5-amino-1H-tetrazole, 4-aminopyrazole, 2-aminobenzimidazole, 2-amino-5-carbxy-triazole, 2,4-diamino-6-methyl-S-triazine, 2,6-diaminopyridine, L-histidine, DL-tryptophan and adenine; aminoalcohol or aminophenol compounds such as ethanolamine, N-methylethanolamine, N-ethylethanolamine, 1-amino-2-propanol, 1-amino-3-propanol, 2-aminoethoxyethanol, 2-aminothioethoxyethanol, 2-amino-2-methyl-1-propanol, p-aminophenol, m-aminophenol, o-aminophenol, 4-methyl-2-aminophenol, 2-chloro-4-aminophenol, 4-methoxy-3-aminophenol, 4-hydroxybenzylamine, 4-amino-1-naphthol, 4-aminosalicylic acid, 4-hydroxy-N-phenyglycine, 2-aminobenzyl alcohol, 4-aminophenethyl alcohol, 2-carboxy-5-amino-1-naphthol and L-tyrosine; and so on.

The polyurethane resin having carboxyl group according to the another embodiment of the invention is synthesized by, to such an isocyanate compound and such a diol compound (including a compound prepared by ring-opening a tetracarboxylic dianhydride by a diol compound) respectively as described above, adding a publicly known catalyst which has an activity appropriate for the reactivties of these compound and heating in an aprotic solvent. Next, carboxyl group is introduced in the case of no or little carboxyl group exists.

The isocyanate compound and the diol compound are employed preferably at a molar ratio of from 0.8:1 to 1.2:1. In the case where isocyanate group remains at the polymer terminal, the product is treated with an alcohol or an amine so as to give a final product free from isocyanate group.

[Epoxy Compound Having Unsaturated Carbon-Carbon Bond]

Examples of the epoxy compound having unsaturated carbon-carbon bond according to the another embodiment of the invention include epoxy compounds such as allyl glycidyl ether, 2-butenyl glycidyl ether, 1-phenyl-propenyl glycidyl ether, glycidyl acrylate, glycidyl methacrylate, glycidyl cinnamate, propalgyl glycidyl ether and the following compounds.

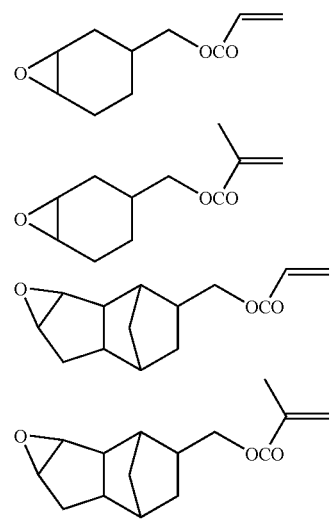

-continued

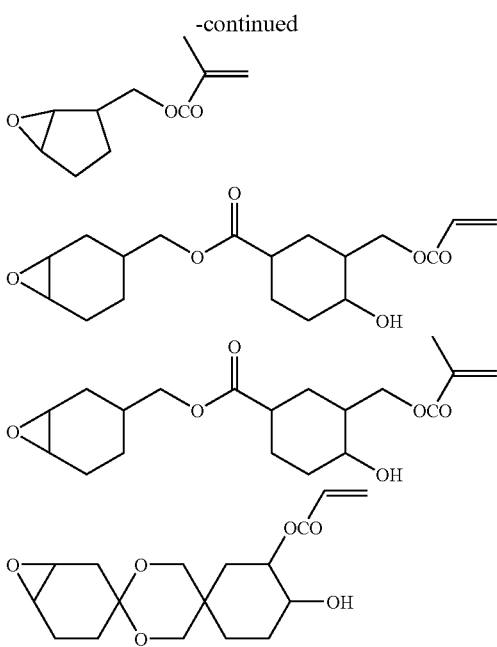

By adding such an epoxy compound having unsaturated carbon-carbon bond to the polyurethane resin having carboxyl group as described above, the specific polyurethane resin according to the another embodiment of the invention can be synthesized.

The introduction of the epoxy compound having unsaturated carbon-carbon bond to the polyurethane resin having carboxyl group can be carried out by reacting in an organic solvent at a reaction temperature of from 50 to 150° C. for several to several ten hours with the use of a catalyst, for example, a tertiary amine such as triethylamine or benzylmethylamine; a quaternary ammonium salt such as dodecyltrimethylammonium chloride, tetramethylammonium chloride or tetraethylammonium chloride; pyridine, triphenylphosphine, etc.

Examples of the organic solvent to be used in this addition reaction include acetone, acetonitrile, tetrahydrofuran, 2-butanone, 1-methoxy-2-propanol, 2-propanol, methanol, ethanol, 1-butanol, cyclohexanone, N,N-dimethylacetamide, N,N-dimethylformamide, dimethyl sulfoxide, ethylene glycol, ethylene glycol dimethyl ether, ethylene glycol monomethyl ether, 2-methoxyethyl acetate, 1-methoxy-2-propyl acetate, methyl lactate, ethyl lactate, ethyl acetate, tetramethyl urea, N-methylpyrrolidone, γ-butyrolactone and so on.

In the specific polyurethane resin according to the another embodiment of the invention, the content of the unsaturated carbon-carbon bond is preferably 0.1 meq/g or more, still preferably form 0.5 meq/g to 3.0 meq/g, per gram of the polyurethane resin. In the case where its content is less than 0.1 meq/g, only insufficient effect of improving printing tolerance can be achieved by introducing the unsaturated carbon-carbon bond. In the case where its content exceeds 3.0 mg/eq, the storage stability would be lowered.

In the specific polyurethane resin according to the another embodiment of the invention, the content of the carboxyl group (remaining carboxyl group) is preferably 0.4 meq/g or more, still preferably form 0.8 meq/g to 2.0 meq/g, per gram of the polyurethane resin. In the case where its content is less than 0.4 meq/g, only insufficient development properties can be achieved. In the case where its content exceeds 2.0 mg/eq, the printing tolerance would be lowered.

In a preferred embodiment, the specific polyurethane resin according to the another embodiment of the invention contains, from the viewpoints of sensitivity and development properties, 5% by mass or more (preferably 10% by mass or more and still preferably 25% by mass or more) of at least one member selected from among polyether diol compound units, polyester diol compound units and polycarbonate diol compound units each having weight-average molecular weight of 700 or more, in the specific polyurethane resin. Among all, it is preferable that polypropylene glycol diol and polytetramethylene glycol diol are contained.

From the viewpoint of printing tolerance, a preferred embodiment of the specific polyurethane resin according to the another embodiment of the invention is a polyurethane resin containing 5% by mass or more (preferably 10% by mass or more and still preferably 20% by mass or more) of an aromatic group in the specific polyurethane resin.

From the viewpoints of printing tolerance and development properties, the weight-average molecular weight of the specific polyurethane resin is preferably 5,000 or more, still preferably from 40,000 to 180,000. Its number-average molecular weight is preferably 10,000 or more and still preferably from 30,000 to 120,000. The polydispersion degree (weight-average molecular weight/number-average molecular weight) is preferably 1 or more, still preferably from 1.1 to 10.

As the specific polyurethane resin, either one resin or a mixture of two or more may be used. In addition to (A') the specific polyurethane resin, use can be also made of another polymer compound (a binder polymer), so long as the advantages of the another embodiment of the invention are not worsened thereby. In this case, it is preferable to use the other polymer in an amount of 90% by mass or less, still preferably 60% by mass or less, based on the total polymer compounds involving (A') the specific polyurethane resin.

The content of (A') the specific polyurethane resin in the polymerizable composition according to the another embodiment of the invention ranges from about 10 to 95% by mass, in terms of solid matter, still preferably from about 30 to 85% by mass.

In addition to the specific polyurethane resin (A'), the polymerizable composition according to the another embodiment of the invention may contain another polymer compound (a binder polymer) so long as the advantages of the another embodiment of the invention are not deteriorated thereby. As the binder polymer, it is preferable to use a linear organic polymer. As such a "linear organic polymer", use can be made of an arbitrary one known in public. It is preferable to select a linear organic polymer which is soluble or swellable in water or a weakly alkaline aqueous solution and, therefore, usable in development with water or a weakly alkaline aqueous solution. A linear organic polymer is appropriately selected and employed not only as a film-forming agent in the composition but also as a developing agent with water, a weakly alkaline aqueous solution or an organic solvent. In case of using a water-soluble organic polymer, for example, development can be performed with water. Examples of such linear organic polymer include addition polymers having a carboxylate group in a side chain such as those described in JP-A-59-44615, JP-B-54-34327, JP-B-58-12577, JP-B-54-25957, JP-A-54-92723, JP-A-59-53836 and JP-A-59-71048, namely, methacrylic acid copolymers, acrylic acid copolymers, itaconic acid copolymers, crotonic acid copolymers, maleic acid copolymers, partly esterified maleic acid copolymers and so on. Similarly, acidic cellulose derivatives having a carboxylate group in a side chain may be cited. Moreover, products obtained by adding cyclic acid anhydrides to addition polymers having hydroxyl groups are useful too.

Among the binder polymers as described above, (meth) acrylic resins having a benzyl group or an allyl group and a carboxyl group in side chain and alkali-soluble resins having a double bond in side chain, which are described in JP-A-2000-187322, JP-A-2002-62648, Japanese Patent Application 2001-253217, Japanese Patent Application 2002-287920, JP-A-2002-62648, etc., are excellent in the balance among film strength, sensitivity and development characteristics and, therefore, adequately usable.

As other examples of the binder polymer, urethane-based binder polymers having an acid group described in JP-B-7-12004, JP-B-7-120041, JP-B-7-120042, JP-B-8-12424, JP-A-63-287944, JP-A-63-287947, JP-A-1-271741, Japanese Patent Application 10-116232, etc. are excellent in strength and, therefore, advantageous in printing tolerance and exposure suitability at low doses.

In addition, polyvinylpyrrolidone, polyethylene oxide, etc. are useful as a water-soluble linear organic polymer. To elevate the strength of a hardened film, alcohol-soluble nylons, 2,2-bis-(4-hydroxyphenyl)-propane/epichlorohydrin polyether, etc. are also useful.

The weight-average molecular weight of the polymer to be used in the another embodiment of the invention is preferably 5,000 or more, still preferably from 10,000 to 300,000. Its number-average molecular weight is preferably 1,000 or more and still preferably form 2,000 to 2,500,000. The polydispersion degree (weight-average molecular weight/number-average molecular weight) is preferably 1 or more, still preferably from 1.1 to 10.

Although such a polymer may be a random polymer, a block polymer, a graft polymer or the like, a random polymer is preferred.

The polymer to be used in the another embodiment of the invention can be synthesized by a conventionally known method. Examples of the solvent to be used in the synthesis include tetrahydrofruan, ethylene dichloride, cyclohexanone, methyl ethyl ketone, acetone, methanol, ethanol, ethylene glycol monomethyl ether, ethylene glycol monoethyl ether, 2-methoxyethyl acetate, diethylene glycol dimethyl ether, 1-methoxy-2-propanol, 1-methoxy-2-propyl acetate, N,N-dimethylformamide, N,N-dimethylacetamide, toluene, ethyl acetate, methyl lactate, ethyl lactate, dimethyl sulfoxide and water. Either one of these solvents or a mixture of two or more thereof may be used.

As a radical polymerization initiator for synthesizing the polymer to be used in the another embodiment of the invention, use can be made of publicly known compounds such as azo initiators and peroxide initiators.

[(B) Radical Initiator]

The lithographic printing plate precursor according to the invention is characterized by containing a radical initiator in the recording layer. The term "radical initiator" means a compound emitting radicals by the action of light and/or heat and thus initiates and promotes the polymerization reaction of (C) a polymerizable compound as will be discussed herienafter.

Preferable examples of the radical initiator in the invention include (a) aromatic ketones, (b) onium salt compounds, (c) organic peroxides, (d) thio compounds, (e) hexaarylbiimidazole compounds, (f) ketooxime ester compounds, (g) borate compounds, (h) azinium compounds, (i) metallocene compounds, (j) active ester compounds and (k) compounds having a carbon-halogen bond. Now, particular examples of the compounds (a) to (k) will be presented, though the invention is not restricted thereto.

(a) Aromatic Ketones

As examples of the aromatic ketones (a) preferably employed as the radical initiator in the invention include compounds having a benzophenone skeleton or a thioxanthone skeleton as described in RADIATION CURING IN POLYMER SCIENCE AND TECHNOLOGY, J. P. Fouassier, J. F. Rabek (1993), p. 77-117, e.g., the following compounds.

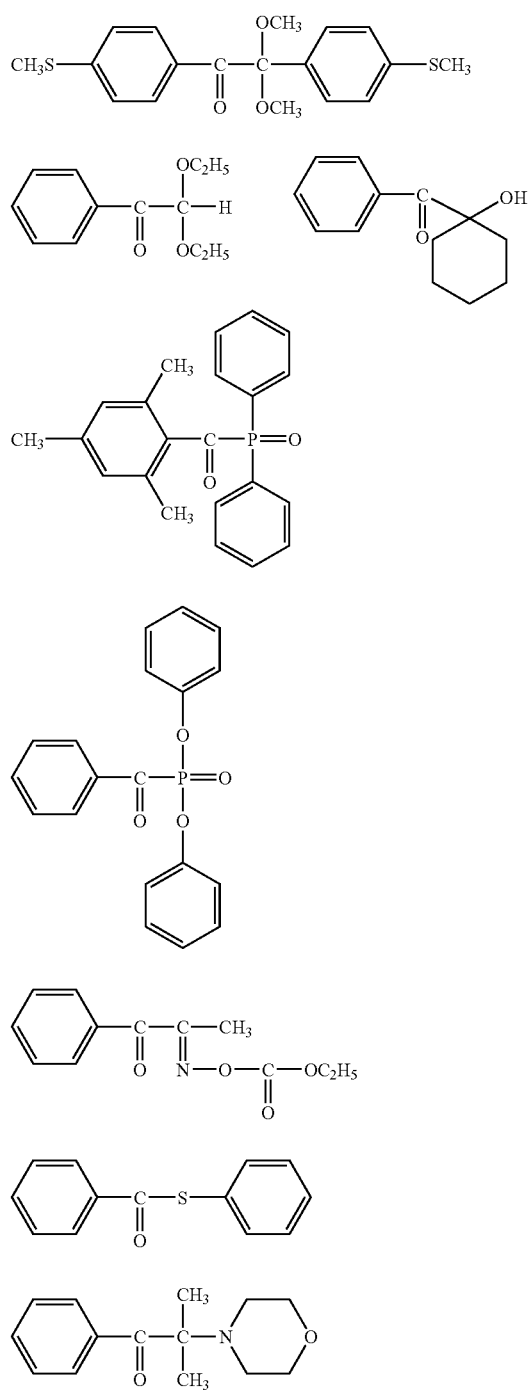

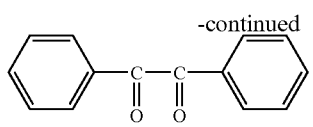

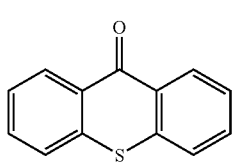

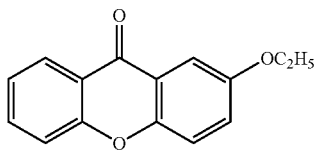

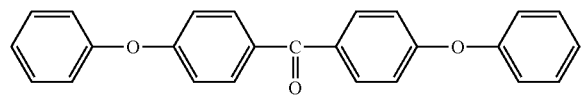

Among these compounds, particularly preferable examples of the aromatic ketones (a) include α-thiobenzophenone compounds described in JP-B-47-6416 and benzoin ether compounds described in JP-B-47-3981, e.g., the following compounds.

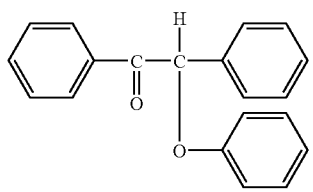

α-Substituted benzoin compounds described in JP-B-47-22326, e.g., the following compounds.

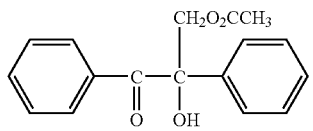

Benzoin derivatives described in JP-B-47-23664, aroyl phosphonic acid esters described in JP-A-57-30704 and dialkoxybenzophenones described in JP-B-60-26483, e.g., the following compounds.

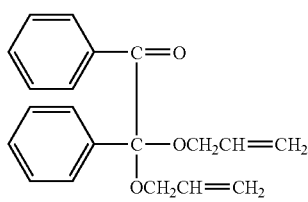

Benzoin ethers described in JP-B-60-26403 and JP-A-62-81345, e.g., the following compounds.

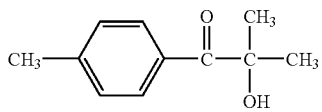

α-Aminobenzophenones described in JP-B-1-34242, U.S. Pat. No. 4,318,791 and EP 0284561 A1, e.g., the following compounds.

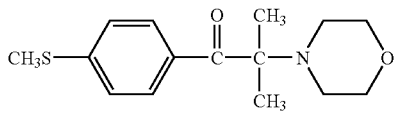

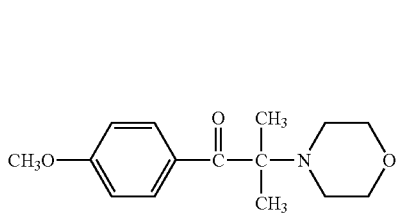

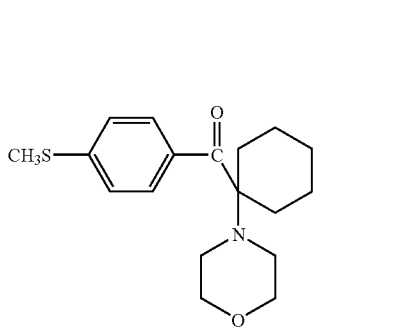

p-Di(dimethylaminobenzoyl)benzene described in JP-A-2-211452, e.g., the following compounds.

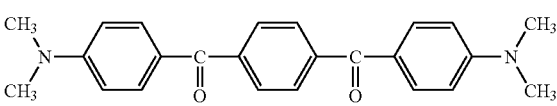

Thio-substituted aromatic ketones described in JP-A-61-194062, e.g., the following compounds.

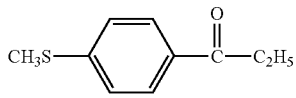

Acylphosphine sulfides described in JP-B-2-9597, e.g., the following compounds.

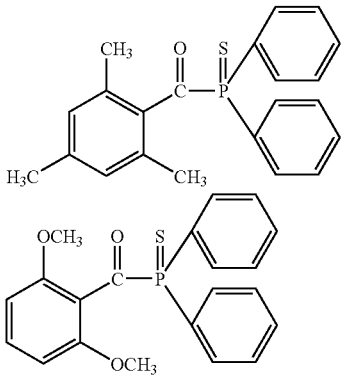

Acylphosphines described in JP-B-2-9596, e.g., the following compounds.

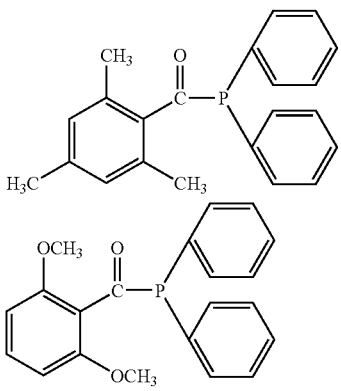

Moreover, thioxanthones described in JP-B-63-61950 and coumarines described in JP-B-59-42864 may be cited (b) Onium Salt Compounds As examples of the onium salt compounds (b) preferably employed as the radical initiator in the invention include compounds represented by the following formulae (a) to (3).

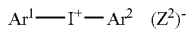   Formula (1)

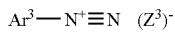   Formula (2)

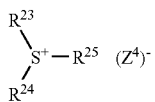   Formula (3)

In the formula (1), $Ar^1$ and $Ar^2$ independently represent each an optionally substituted aryl group having not more than 20 carbon atoms. In the case where the aryl group has a substituent, preferable examples of the substituent include halogen atoms, a nitro group, alkyl groups having not more than 12 carbon atoms, alkoxy groups having not more than 12 carbon atoms and aryloxy groups having not more than 12 carbon atoms. $(Z^2)^-$ represents a counter ion selected from the group consisting of halogen ions, a perchlorate ion, a carboxylate ion, a tetrafluoroborate ion, a hexafluorophosphate ion and sulfonate ions. It preferably represents a perchlorate ion, a hexafluorophosphate ion or an arylsulfonate ion.

In the formula (2), $Ar^3$ represents an optionally substituted aryl group having not more than 20 carbon atoms. Preferable examples of the substituent include halogenatoms, a nitro group, alkyl groups having not more than 12 carbon atoms, alkoxy groups having not more than 12 carbon atoms, aryloxy groups having not more than 12 carbon atoms, alkylamino groups having not more than 12 carbon atoms, dialkylamino groups having not more than 12 carbon atoms, arylamino groups having not more than 12 carbon atoms and diarylamino groups having not more than 12 carbon atoms. $(Z^3)^-$ represents the same counter ion as $(Z^2)^-$.

In the formula (3), $R^{23}$, $R^{24}$ and $R^{25}$ may be the same or different and each represents an optionally substituted hydrocarbon group having not more than 20 carbon atoms. Examples of the substituent include halogen atoms, a nitro group, alkyl groups having not more than 12 carbon atoms, alkoxy groups having not more than 12 carbon atoms and aryloxy groups having not more than 12 carbon atoms. $(Z^4)^-$ represents the same counter ion as $(Z^2)^-$.

Particular examples of the onium salt appropriately usable in the invention include the compounds described in Japanese Patent Application 11-310623, paragraphs [0030] to [0033] and Japanese Patent Application 2000-16032, paragraphs [0015] to [0046] having been filed by the present applicant and specific aromatic sulfonium salt compounds described in Japanese Patent Application 2000-266797, Japanese Patent Application 2001-177150, Japanese Patent Application 2000-160323, Japanese Patent Application 2000-184603, Japanese Patent Application 2000-310808, Japanese Patent Application 2002-265467 and Japanese Patent Application 2002-366539

It is preferable that the onium salt to be used in the invention has a maximum absorption wavelength of 400 nm or less, still preferably 360 nm or less. By thus controlling the maximum absorption wavelength within the ultraviolet region, the lithographic printing plate precursor can be handled under white light.

(c) Organic Peroxide

Preferable examples of the organic peroxide (c) to be used as the radical initiator in the invention include most organic compounds having one or more oxygen-oxygen bonds in molecule, for example, methyl ethyl ketone peroxide, cyclohexanone peroxide, 3,3,5-tirmethylcyclohexanone peroxide, methylcyclohexanone peroxide, acetyl acetone peroxide, 1,1-bis(tertiary-butylperoxy)-3,3,5-trimethylcyclohexane, 1,1-bis(tertiary-butylperoxy)cyclohexane, 2,2-bis(tertiary-butylperoxy)butane, tertiary-butyl hydroperoxide, cumene hydroperoxide, diisopropylbenzene hydroperoxide, paramethane hydroperoxide, 2,5-dimethylhexane-2,5-dihydroperoxide, 1,1,3,3-tetramethylbutyl hydroperoxide, di-tertiary-butyl peroxide, tertiary-butylcumyl peroxide, dicumyl peroxide, bis(tertiary-butylperoxyisopropyl)benzene, 2,5-dimethyl-2,5-di(tertiary-butylperoxy) hexane, 2,5-xanoyl peroxide, succinic peroxide, benzoyl peroxide, 2,4-dichlorobenzoyl peroxide, meta-toluoyl peroxide, diisopropyl peroxydicarbonate, di-2-tehylhexyl peroxydicarbonate, di-2-ethoxyethyl peroxydicarbonate, dimethoxyisopropyl peroxycarbonate, di(3-methyl-3-methoxybutyl)peroxydicarbonate, tertiary-butyl peroxyacetate, tertiary-butyl peroxypivalate, tertiary-butyl peroxyneodecanoate, tertiary-butyl peroxyoctanoate, tertiary-butyl peroxy-3,5,5-trimethylhexanoate, tertiary-butyl peroxylaurate, tertiary-carbonate, 3,3', 4,4'-tetra-(t-butylperoxycarbonyl)benzophenone, 3,3',4,4'- tetra-(t-amylperoxycarbonyl)benzophenone, 3,3',4,4'-tetra-(t-hexylperoxycarbonyl)benzophenone, 3,3',4,4'-tetra-(t-octylperoxycarbonyl)benzophenone, 3,3',4,4'-tetra-(cumylperoxycarbonyl)benzophenone, 3,3',4,4'-tetra-(p-isopropylcumylperoxycarbonyl)benzophenone, carbonyldi (t-butylperoxy dihydrogen diphthalate), carbonyldi(t-hexylperoxy dihydrogen diphthalate) and so on.

Among all, it is preferable to employ ester peroxides such as 3,3',4,4'-tetra-(t-butylperoxycarbonyl) benzophenone, 3,3',4,4'-tetra-(t-amylperoxycarbonyl)benzophenone, 3,3',4,4'-tetra-(t-hexylperoxycarbonyl)benzophenone, 3,3',4,4'-tetra-(t-octylperoxycarbonyl)benzophenone, 3,3',4,4'-tetra-(cumylperoxycarbonyl)benzophenone, 3,3',4,4'-tetra-(p-isopropylcumylperoxycarbonyl)benzophenone and di-t-butyldiperoxy isophthalate.

(d) Thio Compound

Preferable examples of the thio compound (c) to be used as the radical initiator in the invention include compounds represented by the following formula (4).

Formula (4)

In the above formula, $R^{26}$ represents an alkyl group, an aryl group or a substituted aryl group, and $R^{27}$ represents a hydrogen atom or an alkyl group. $R^{26}$ and $R^{27}$ represent nonmetal atom groups required in binding to each other to form a 5- to 7-membered ring optionally containing a hetero atom selected from among oxygen, sulfur and nitrogen atoms.

As the alkyl group in the above formula (4), those having 1 to 4 carbon atoms are preferable. As the aryl group, those having from 6 to 10 carbon atoms such as phenyl and naphthyl are preferable. Examples of the substituted aryl group include the above-described aryl groups substituted by a halogen atom such as a chlorine atom, an alkyl group such as a methyl group or an alkoxy group such as a methoxy or ethoxy group. It is preferable that $R^{27}$ is an alkyl group having from 1 to 4 carbon atoms. Particular examples of the thio compound represented by the formula (4) are as follows.

| No. | $R^{26}$ | $R^{27}$ |
|---|---|---|
| 1 | —H | —H |
| 2 | —H | —CH₃ |
| 3 | —CH₃ | —H |
| 4 | —CH₃ | —CH₃ |
| 5 | —C₆H₅ | —C₂H₅ |
| 6 | —C₆H₅ | —C₄H₉ |
| 7 | —C₆H₄Cl | —CH₃ |
| 8 | —C₆H₄Cl | —C₄H₉ |
| 9 | —C₆H₄—CH₃ | —C₄H₉ |
| 10 | —C₆H₄—OCH₃ | —CH₃ |
| 11 | —C₆H₄—OCH₃ | —C₂H₅ |
| 12 | —C₆H₄—OC₂H₅ | —CH₃ |
| 13 | —C₆H₄—OC₂H₅ | —C₂H₅ |
| 14 | —C₆H₄—OCH₃ | —C₄H₉ |
| 15 | —(CH₂)₂— | |
| 16 | —(CH₂)₂—S— | |
| 17 | —CH(CH₃)—CH₂—S— | |
| 18 | —CH₂—CH(CH₃)—S— | |
| 19 | —C(CH₃)₂—CH₂—S— | |
| 20 | —CH₂—C(CH₃)₂—S— | |
| 21 | —(CH₂)₂—O— | |
| 22 | —CH(CH₃)—CH₂—O— | |
| 23 | —C(CH₃)₂—CH₂—O— | |
| 24 | —CH=CH—N(CH₃)— | |
| 25 | —(CH₂)₃—S— | |
| 26 | —(CH₂)₂—CH(CH₃)—S— | |
| 27 | —(CH₂)₃—O— | |
| 28 | —(CH₂)₅— | |
| 29 | —C₆H₄—O— | |
| 30 | —N=C(SCH₃)—S— | |
| 31 | —C₆H₄—NH— | |
| 32 | 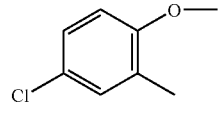 | |

(e) Hexaarylbiimidazole Compound

Preferable examples of the hexaarylbiimidazole compound (e) to be used as the radical initiator in the invention include lophine dimers described in JP-B-45-37377 and JP-B-44-86516 such as 2,2'-bis(o-chlorophenyl)-4,4',5,5'-tetraphenylbiimidazole, 2,2'-bis(o-bromophenyl)-4,4',5,5'-tetraphenylbiimidazole, 2,2'-bis(o,p-dichlorophenyl)-4,4',5,5'-tetraphenylbiimidazole, 2,2'-bis(o-chlorophenyl)-4,4',5,5'-tetra(m-methoxyphenyl)biimidazole, 2,2'-bis(o,o'-dichlorophenyl)-4,4',5,5'-tetraphenylbiimidazole, 2,2'-bis(o-nitrophenyl)-4,4',5,5'-tetraphenylbiimidazole, 2,2'-bis(o-methylphenyl)-4,4',5,5'-tetraphenylbiimidazole and 2,2'-bis (o-trifluorophenyl)-4,4',5,5'-tetraphenylbiimidazole.

(f) Ketooxime Ester Compound

Preferable examples of the ketooxime compound (f) to be used as the radical initiator in the invention include 3-benzoyloxyiminobutan-2-one, 3-acetoxyiminobutan-2-one, 3-propionyloxyiminobutan-2-one, 2-acetoxyiminopentan-3-one, 2-acetoxyimino-1-phenylpropan-1-one, 2-benzoyloxyimino-1-phenylpropan-1-one, 3-p-toluenesulfonyloxyiminobutan-2-one and 2-ethoxycarbonyloxyimino-1-phenylpropan-1-one.

(g) Borate Compound

Preferable examples of the borate compound (g) to be used as the radical initiator in the invention include compounds represented by the following formula (5).

$$R^{28}-\underset{\underset{R^{30}}{|}}{\overset{\overset{R^{29}}{|}}{B^{-}}}-R^{31} \quad (Z^5)^+$$

Formula (5)

In the above formula, $R^{28}$, $R^{29}$, $R^{30}$ and $R^{31}$ may be the same or different and each represents a substituted or unsubstituted alkyl group, a substituted or unsubstituted aryl group, a substituted or unsubstituted alkenyl group, a substituted or unsubstituted alkynyl group or a substituted or unsubstituted heterocyclic group. Two or more members of $R^{28}$, $R^{29}$, $R^{30}$ and $R^{31}$ may be bonded to form a cyclic structure together, provided that at least one of $R^{28}$, $R^{29}$, $R^{30}$ and $R^{31}$ is a substituted or unsubstituted alkyl group. $(Z^5)^+$ represents an alkali metal cation or a quaternary ammonium cation.

The alkyl groups represented by $R^{28}$ to $R^{31}$ as described above include linear, branched and cyclic ones preferably having from 1 to 18 carbon atoms. Particular examples thereof include methyl, ethyl, propyl, isopropyl, butyl, pentyl, hexyl, octyl, stearyl, cyclobutyl, cyclopentyl and cyclohexyl. Examples of the substituted alkyl groups include the above-described alkyl groups having a substituent such as a halogen atom (for example, —Cl, —Br and so on), a cyano group, a nitro group, an aryl group (preferably a phenyl group), —COOR$^{32}$ (wherein R$^{32}$ represents a hydrogen atom, an alkyl group or an aryl group having from 1 to 14 carbon atoms), —OCOR$^{33}$ or —OR$^{34}$ (wherein R$^{33}$ and R$^{34}$ represent each an alkyl group or an aryl group having from 1 to 14 carbon atoms) or groups represented by the following formula.

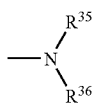

In the above formula R$^{35}$ and R$^{36}$ represent each a hydrogen atom or an alkyl group or an aryl group having from 1 to 14 carbon atoms.

Examples of the aryl groups represented by R$^{28}$ and R$^{31}$ as described above include 1- to 3-membered aryl groups such as a phenyl group and a naphthyl group. Examples of the substituted aryl groups include the above-described aryl groups having the same substituent as in the substituted alkyl groups as described above or an alkyl group having from 1 to 14 carbon atoms. Examples of the alkenyl groups represented by R$^{28}$ and R$^{31}$ as described above include linear, branched and cyclic alkenyl groups having from 2 to 28 carbon atoms. Examples of the substituent in the substituted alkenyl groups include the substituents as described above with respect to the substituted alkyl groups. Examples of the alkynyl groups represented by R$^{28}$ and R$^{31}$ as described above include linear, branched and cyclic alkynyl groups having from 2 to 28 carbon atoms. Examples of the substituent in the substituted alkynyl groups include the substituents as described above with respect to the substituted alkyl groups. Examples of the heterocyclic groups represented by R$^{28}$ and R$^{31}$ as described above include 5- or more membered (preferably 5- to 7-membered) heterocyclic groups containing at least one of N, S and O. These heterocyclic groups may also have fused rings. Further, these heterocyclic groups may have the same substituent as described above with respect to the substituted aryl groups. Particular examples of the compounds represented by the formula (5) include compounds described in U.S. Pat. No. 3,567,453, U.S. Pat. No. 4,343,891, EP 109,772 and EP 109,773 a well as the following compounds.

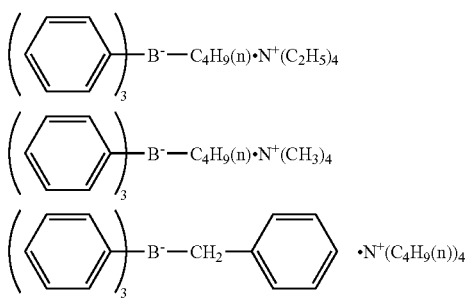

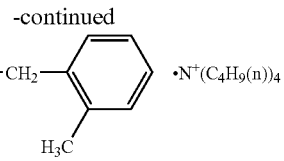

(h) Azinium Compound

Preferable examples of the azinium salt compound (h) to be used as the radical initiator in the invention include compounds having an N—O bond described in JP-A-63-138345, JP-A-63-142345, JP-A-63-142346, JP-A-63-143537 and JP-B-46-42363.

(i) Metallocene Compound

Preferable examples of the metallocene compound (i) to be used as the radical initiator in the invention include titanocene compounds described in JP-A-59-152396, JP-A-61-151197, JP-A-63-41484, JP-A-2-249 and JP-A-2-4705 and iron-arene complexes described in JP-A-1-304453 and JP-A-1-152109.

Particular examples of the above-described titanocene compounds include di-cyclopentadienyl-Ti-dichloride, di-cyclopentadienyl-Ti-bis-phenyl, di-cyclopentadienyl-Ti-bis-2,3,4,5,6-pentafluorophen-1-yl, di-cyclopentadienyl-Ti-bis-2,3,5,6-tetrafluorophen-1-yl, di-cyclopentadienyl-Ti-bis-2,4,6-trifluorophen-1-yl, di-cyclopentadienyl-Ti-bis-2,6-difluorophen-1-yl, di-cyclopentadienyl-Ti-bis-2,4-difluorophen-1-yl, di-methylcyclopentadienyl-Ti-bis-2,3,4,5,6-pentafluorophen-1-yl, di-methylcyclopentadienyl-Ti-bis-2,3,5,6-tetrafluorophen-1-yl, di-methylcyclopentadienyl-Ti-bis-2,4-difluorophen-1-yl, bis (cyclopentadienyl)-bis(2,6-difluoro-3-(pyr-1yl)phenyl)titanium, bis(cyclopentadienyl)bis[2,6-difluoro-3-(methylsulfonamido)phenyl]titanium, bis(cyclopentadienyl)bis[2,6-difluoro-3-(N-butylbiaroyl-am ino)phenyl]titanium, bis (cyclopentadienyl)bis[2,6-difluoro-3-(N-butyl(4-chlorobenzoyl)amino)phenyl]titanium, bis (cyclopentadienyl)bis[2,6-difluoro-3-(N-benzyl-2,2-dimethylpentanoylamino)phenyl]titanium, bis (cyclopentadienyl)bis[2,6-difluoro-3-(N-(2-ethylhexyl)-4-tolyl-sulfonyl)amino]phenyl]titanium, bis(cyclopentadienyl) bis[2,6-difluoro-3-(N-(3-oxaheptyl)benzyolamino)phenyl] titanium, bis(cyclopentadienyl)bis[2,6-difluoro-3-(N-(3,6-dioxadecyl)benzoylamino)phenyl]titanium, bis (cyclopentadienyl)bis[2,6-difluoro-3-(trifluoromethylsulfonyl)amino]phenyl]titanium, bis (cyclopentadienyl)bis[2,6-difluoro-3-(trifluoroacetylamino) phenyl]titanium, bis(cyclopentadienyl)bis[2,6-difluoro-3-(2-chlorobenzoyl)amino]phenyl]titanium, bis (cyclopentadienyl)bis[2,6-difluoro-3-(4-chlorobenzoyl) amino]phenyl]titanium, bis(cyclopentadienyl)bis[2,6-difluoro-3-(N-(3,6-dioxadecyl)-2,2-dimethylpentanoylamino)phenyl]titanium, bis (cyclopentadienyl)bis[2,6-difluoro-3-(N-(3,7-dimethyl-7-methoxyoctyl)benzoylamino)phenyl]titanium and bis (cyclopentadienyl)bis[2,6-difluoro-3-(N-cyclohexylbenzoylamino)phenyl]titanium.

(j) Active Ester Compound

Preferable examples of the active ester compound (j) to be used as the radical initiator in the invention include imidosulfonate compounds described in JP-B-62-622 and active sulfonate compounds described in JP-B-63-14340 and JP-A-59-174831.

(k) Compound Having Carbon-Halogen Bond

Preferable examples of the compound having a carbon-halogen bond (k) to be used as the radical initiator in the invention include compounds represented by the following formulae (6) to (12).

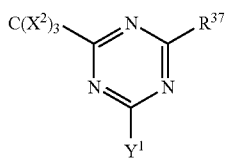

Formula (6)

In the above formula, $X^2$ represents a halogen atom, and $Y^1$ represents —$C(X^2)_3$—, —$NH_2$, —$NHR^{38}$, —$NR^{38}$ or —$OR^{38}$, wherein $R^{38}$ represents an alkyl group, a substituted alkyl group, an aryl group or a substituted aryl group. $R^{37}$ represents —$C(X^2)_3$—, an alkyl group, a substituted alkyl group, an aryl group, a substituted aryl group or a substituted alkenyl group.

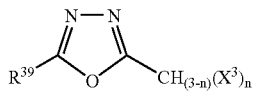

Formula (7)

In the above formula, $R^{39}$ represents an alkyl group, a substituted alkyl group, an alkenyl group, a substituted alkenyl group, an aryl group, a substituted aryl group, a halogen atom, an alkoxy group, a substituted alkoxy group, a nitro group or a cyano group. $X^3$ represents a halogen atom. n is an integer of from 1 to 3.

$R^{40}$-$Z^6$-$CH_{(2-m)}(X^3)_m R^{41}$   Formula (8)

In the above formula, $R^4$ represents an aryl group or a substituted aryl group. $R^{41}$ represents the following group or a halogen. $Z^6$ represents —C(=O)—, —C(=S)— or —$SO_2$—. $X^3$ represents a halogen atom. m is 1 or 2.

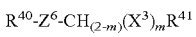

In the above formulae, $R^{42}$ and $R^{43}$ represent each an alkyl group, a substituted alkyl group, analkenyl group, a substituted alkenyl group, an aryl group or a substituted aryl group. $R^{44}$ has the same meaning as $R^{36}$ in the formula (6)

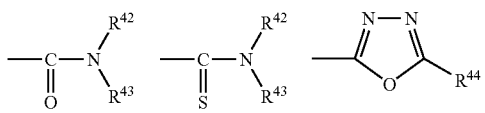

Formula (9)

In the above formula, $R^{45}$ represents an optionally substituted aryl group or a heterocyclic group. $R^{46}$ represents a trihaloalkyl group or a trihalolakenyl group having from 1 to 3 carbon atoms p is 1, 2, or 3.

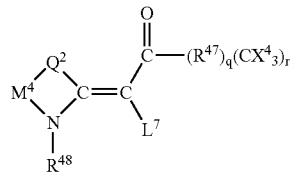

Formula (10)

The above formula (10) shows a carbonylmethylene heterocyclic compound having a trihalogenomethyl group. $L^7$ represents a hydrogen atom or a substituent of CO—$(R^{47})_q$ $(C(X^4)_3)_r$. $Q^2$ represents a sulfur, cerenium or oxygen atom, a dialkylmethylene group, an alken-1,2-ylene group, a 1,2-phenylene group or an N—R group. $M^4$ represents a substituted or unsubstituted alkylene group or alkenylene group or a 1,2-arylene group. $R^{48}$ represents an alkyl group, an aralkyl group or an alkoxyalkyl group. $R^{47}$ represents a carbon ring or heterocyclic divalent aromatic group. $X^4$ represents a chlorine, bromine or iodine atom. In the case where q is 0, r is 1, or in the case where q is 1, r is 1 or 2.

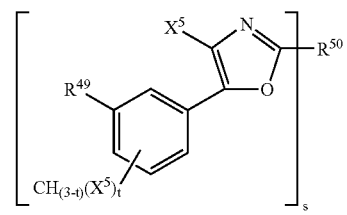

Formula (11)

The above formula (10) shows a 4-halogeno-5-(halogenomethyl-phenyl)-oxazole derivative. $X^5$ represents a halogen atom. t is an integer of from 1 to 3. s is an integer of from 1 to 4. $R^{49}$ represents a hydrogen atom or a $CH_{3-t}X^5$ group. $R^{50}$ is an optionally substituted unsaturated organic group having a valency s.

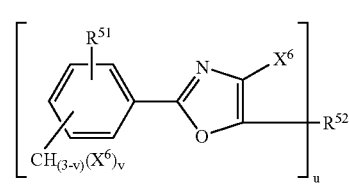

Formula (12)

The above formula (12) shows a 2-(halogenomethyl-phenyl)-4-halogeno-oxazole derivative. $X^6$ represents a halogen atom. v is an integer of from 1 to 3. u is an integer of from 1 to 4. $R^{51}$ represents a hydrogen atom or a $CH_{3-v}X^6$ group. $R^{52}$ is an optionally substituted unsaturated organic group having a valency u.

Particular examples of the compounds having a carbon-halogen bond include compounds described in Wakabayashi et al., Full. Chem. Soc. Japan, 42, 2924 (1969) such as 2-phenyl-4,6-bis(tirchloromethyl)-S-triazine, 2-(p-chlorophenyl)-4,6-bis(tirchloromethyl)-S-triazine, 2-(p-tolyl)-4,6-bis(tirchloromethyl)-S-triazine, 2-(p-methoxyphenyl)-4,6-bis(tirchloromethyl)-S-triazine, 2-(2',4'-dichlorophenyl)-4,6-bis(tirchloromethyl)-S-triazine, 2,4,6-tris(trichloromethyl)-S-triazine, 2-methyl-4,6-bis(tirchloromethyl)-S-triazine, 2-n-nonyl-4,6-bis(tirchloromethyl)-S-triazine and 2-(α,α,β- trichloroethyl)-4,6-bis(trichloromethyl)-S-triazine. Furthermore, citation may be made of compounds described in British Patent 1388492 such as 2-styryl-4,6-bis(trichloromethyl)-S-triazine, 2-(p-metylstyryl)-4,6-bis(trichloromethyl)-S-triazine, 2-(p-methoxystyryl)-4,6-bis (trichloromethyl)-S-triazine and 2-(p-methoxystyryl)-4-amino-6-trichloromethyl-S-triazine, compounds described in JP-A-53-133428 such as 2-(4-methoxy-naphth-1-yl)-4,6-bis-trichloromethyl-S-trizaine, 2-(4-ethoxy-naphth-1-yl)-4,6-bis-trichloromethyl-S-trizaine, 2-[4-(2-ethoxyethyl)-napht-1-yl]-4,6-bis-trichloromethyl-S-trizaine, 2-(4,7-dimethoxy-naphth-1-yl)-4,6-bis-trichloromethyl-S-trizaine and 2-(acenaphth-5-yl)-4,6-bis-trichloromethyl-S-trizaine, and compounds described in German Patent 3337024 such as the following compounds.

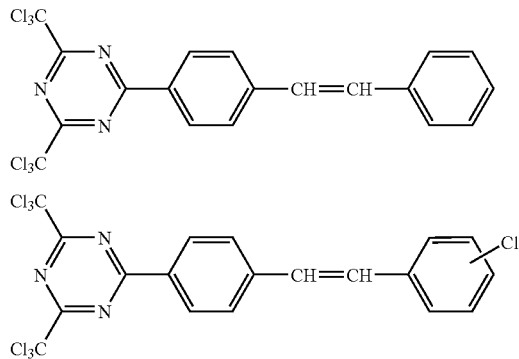

Moreover, citation can be made of compounds reported by F. C. Schaefer et al., J. Org. Chem. 29, 1527 (1964) such as 2-methyl-4,6-bis(tribromomethyl)-S-triazine, 2,4,6-tris(tribromomethyl)-S-triazine, 2,4,6-tris(dibromomethyl)-S-triazine, 2-amino-4-methyl-6-tribromomethyl-S-triazine and 2-methoxy-4-methyl-6-trichloromethyl-S-triazine. Furthermore, compounds described in JP-A-62-58241 such as the following compounds can be cited.

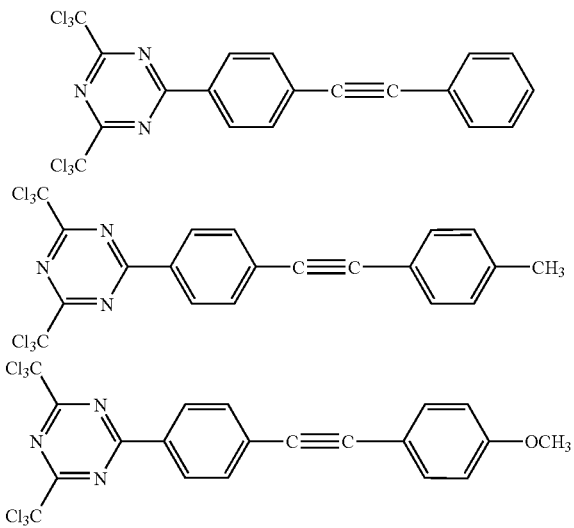

Furthermore compounds described in JP-A-5-281728 such as the following compounds can be cited.

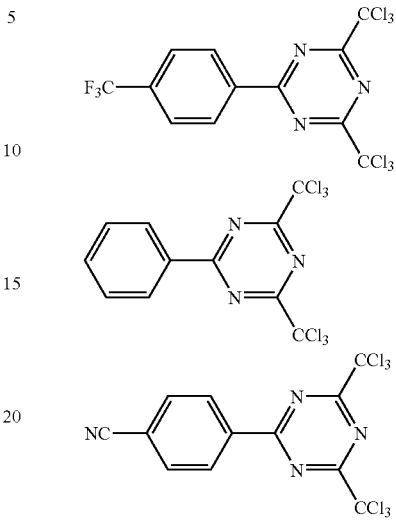

Moreover, citation can be made of compounds which can be easily synthesized by a person skilled in the art in accordance with a synthesis method reported by M. P. Hutt, E. F. Elslager and L. M. Herbel, Journal of Heterocyclic chemistry, vol. 7 (No. 3), p. 511 (1970), such as the following compounds.

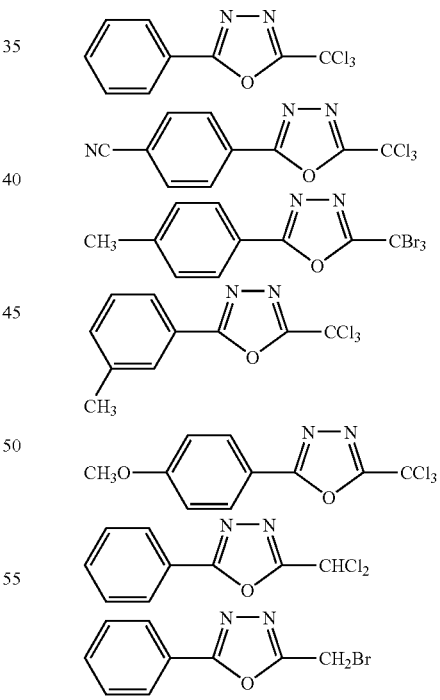

(1) Azo Compound

Preferable examples of the azo compound (1) to be used as the radical initiator in the invention include 2,2'-azobisisobutyronitrile, 2,2'-azobispropionitrile, 1,1'-azobis(cyclohexane-1-carbonitrile), 2,2'-azobis(2-methylbutyronitrile), 2,2'-azobis(2,4-dimethylvaleronitrile), 2,2'-azobis(4-methoxy-2, 4-dimethylvaleronitrile), 4,4'-azobis(4-cyanovaleric acid), methyl 2,2'-azobisisobutyrate, 2,2'-azobis(2-methylpropionamidoxime), 2,2'-azobis[2-(2-imidazolin-2-yl)propane], 2,2'-azobis{2-methyl-N-[1,1-bis(hydroxymethyl)-2-hydroxyethyl]propionamide}, 2,2'-azobis[2-methyl-N-(2-hydroxmethyl)propionamide], 2,2'-azobis(N-butyl-2-methylpropionamide), 2,2'-azobis(N-cyclohexyl-2-methylpropionamide), 2,2'-azobis[N-(2-propenyl)-2-methylpropionamide] and 2,2'-azobis(2,4,4-trimethylpentane).

Still preferable examples of the radical initiator in the invention include the above-described aromatic ketones (a), onium salt compounds (b), organic peroxides (c), hexaarylbiimidazole compounds (e), metallocene compounds (i) and compounds having a carbon-halogen bond (k). Examples of the most desirable compounds include aromatic iodonium salts, aromatic sulfonium salts, titanocene compounds and trihalomethyl-S-triazine compounds represented by the formula (6).

Such a radical initiator can be added at a rate of form 0.1 to 50% by mass, preferably from 0.5 to 30% by mass and particularly preferably from 5 to 20% by mass, based on the total solid matters in the recording layer.

In the invention, either a single radical initiator or a mixture of two or more thereof may be appropriately employed.

[(C) Photothermal Converting Agent (Infrared Absorbing Agent)]

It is preferable to add a photothermal converting agent (C), which absorbs light at a specific wavelength and converts it into heat energy, to the recording layer of the lithographic printing plate precursor according to the invention. By exposure at the wavelength absorbable by this photothermal converting agent, the radical-emission reaction of the above-described radical initiator and the polymerization of the above-described specific polyurethane compound (A) and the polymerizable compound (D) as will be described hereinafter can be promoted.

Examples of the photothermal converting agent include publicly known spectral sensitization colorants and dyes and pigments absorbing light and interacting the radical initiator. Depending on the wavelength absorbable by this photothermal converting agent, the lithographic printing plate precursor according to the invention can response to rays over a broad scope including UV rays, visible rays and infrared rays to form an image.

<Spectral Sensitization Colorant or Dye>

Examples of the spectral sensitization colorant or dye being preferable as the photothermal converting agent to be used in the invention include polynuclear aromatic compounds (for example, pyrene, perylene and triphenylene), xanthenes (for example, fluorescein, eosin, erythrosine, Rhodamine Band rose bengal), cyanines (for example, thiacarbocyanine and oxacarbocyanine), merocyanines (for example, merocyanine and carbomerocyanine), thiazines (for example, thionine, methylene blue and toluidine blue), acridines (for example, acridine orange, chloflavin and acriflavin), phthalocyanines (for example, phthalocyanine and metal phthalocyanine), porphyrines (for example, tetraphenyl porphyrine and central metal-substituted porphyrine), chlorophyls (for example, chlorophyl, chlorophyline, central metal-substituted chlorophyl), metal complexes (for example, the following compound), anthraquinones (for example, anthraquinone) and squariums (for example, squarium).

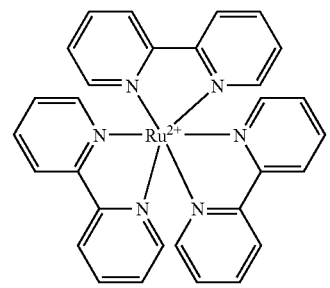

Still preferable examples of the spectral sensitization colorant or dye include styryl colorants described in JP-B-37-13034 such as:

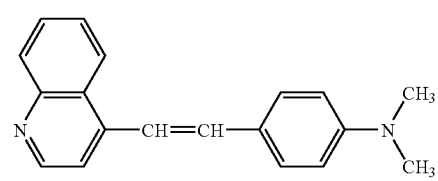

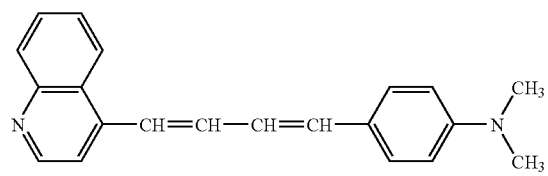

Cationic dyes described in JP-A-62-143044 such as:

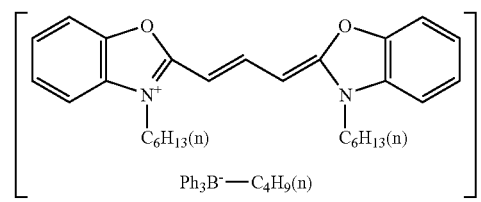

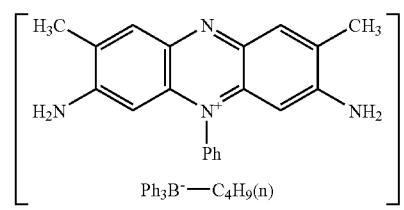

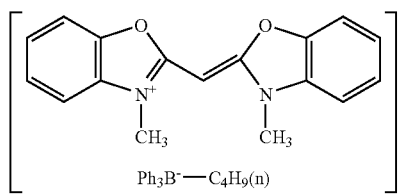
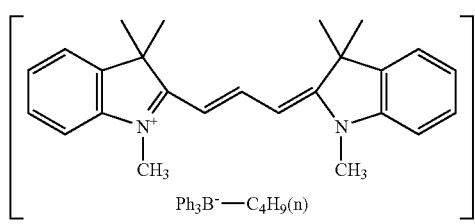
Quinoxalinium salts described in JP-B-59-24147 such as:
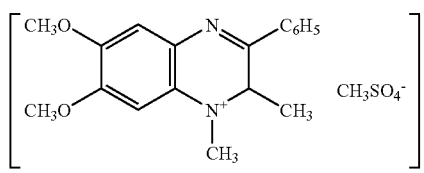
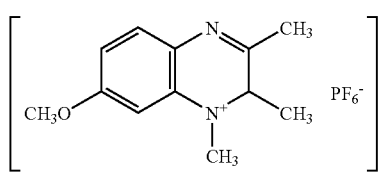
New methylene blue compounds described in JP-A-64-33104 such as:
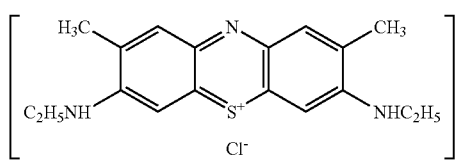
Anthraquinones described in JP-A-64-56767 such as:
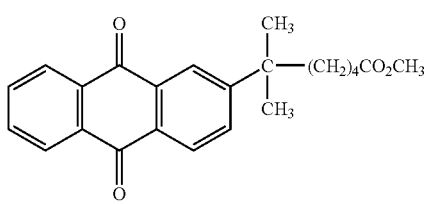
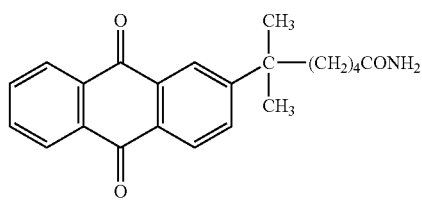
Benzoxanthene dyes described in JP-A-2-1714 and acridines described in JP-A-2-226148 and JP-A-2-226149 such as:
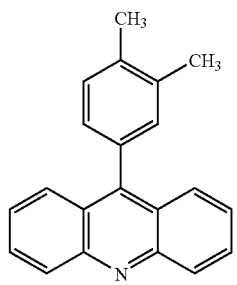
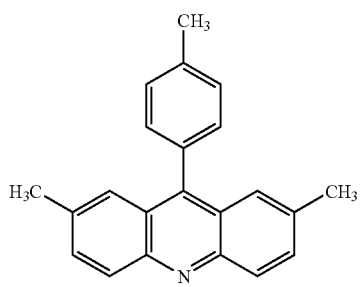
Pyrilium salts described in JP-B-40-28499 such as:
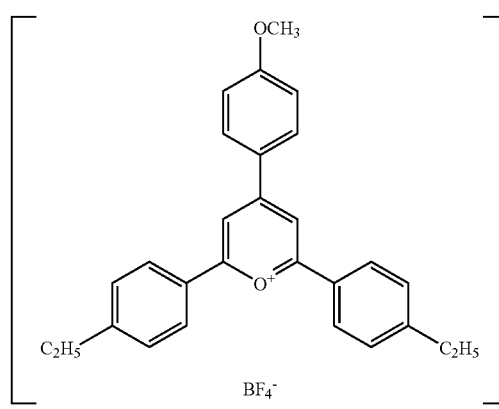

-continued
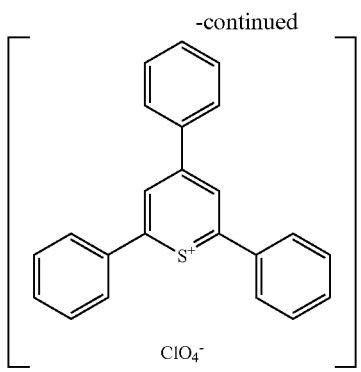
Cyanines described in JP-B-46-42363 such as:
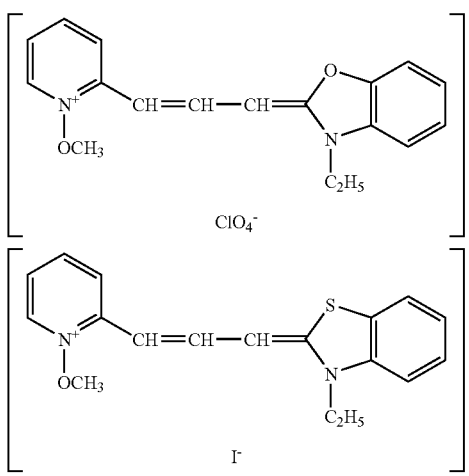
Benzofuran colorants described in JP-A-2-63053 such as:
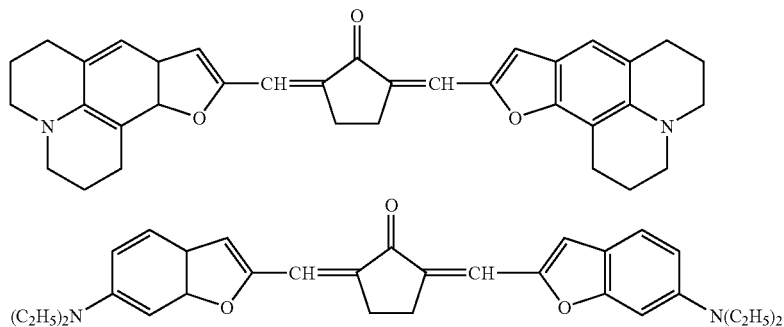
Conjugated ketone colorants described in JP-A-2-85858 and JP-A-2-216154 such as:
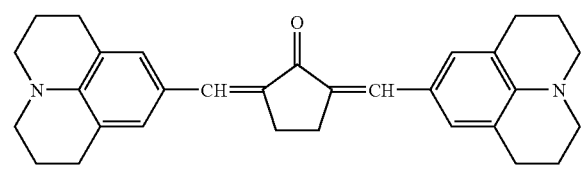
-continued
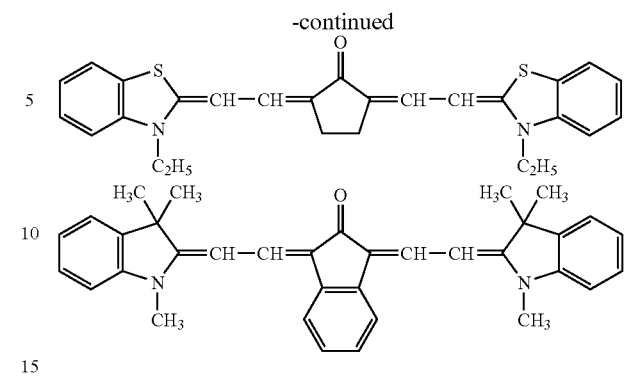
Colorants described in JP-A-57-10605 and azocinnamylidene derivatives described in JP-B-2-30321 such as:
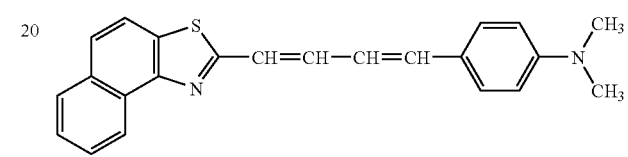
Cyanine colorants described in JP-A-1-287105 such as:
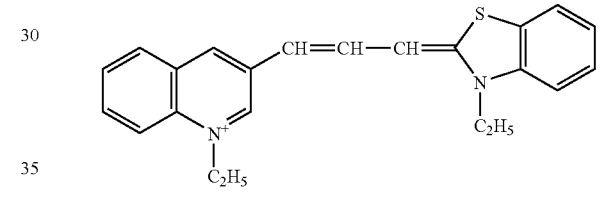
-continued

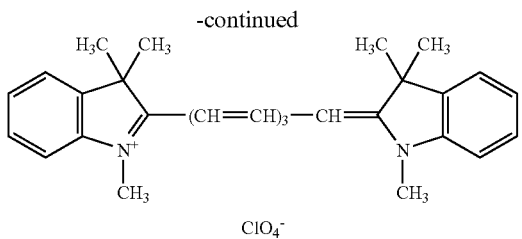

Xanthene colorants described in JP-A-62-31844, JP-A-62-31848 and JP-A-62-143043 such as:

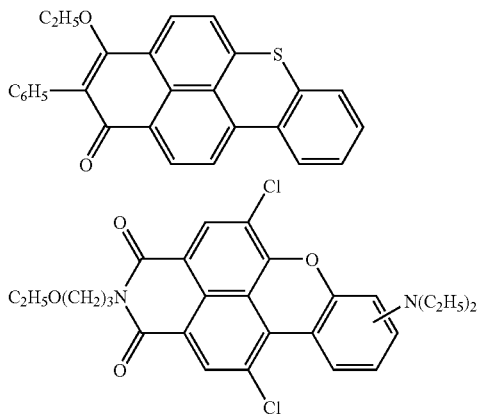

Aminostyryl ketones described in JP-B-59-28325 such as:

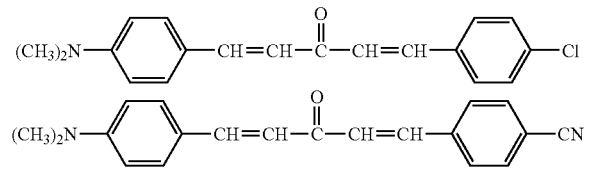

Colorants represented by the following formulae (13) to (15) as described in JP-A-2-179643.

Formula (13)

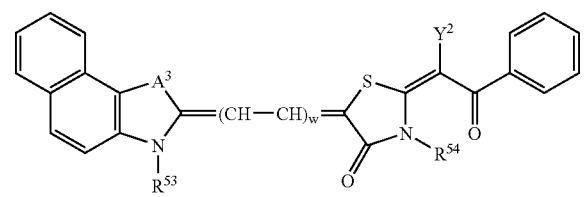

Formula (14)

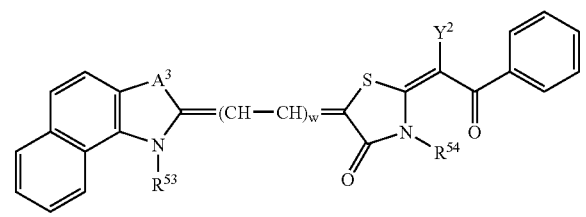

Formula (15)

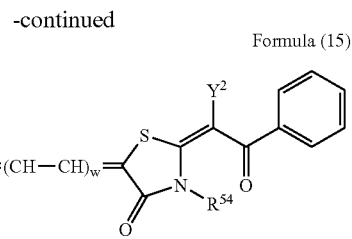

In the above formula, $A^3$ represents an oxygen atom, a sulfur atom, a selenium atom, a tellurium atom, an alkyl- or aryl-substituted nitrogen atom or a dialkyl-substituted carbon atom. $Y^2$ represents a hydrogen atom, an alkyl group, a substituted alkyl group, an aryl group, a substituted aryl group, an aralkyl group, an acyl group or a substituted alkoxycarbonyl group. $R^{53}$ and $R^{54}$ represent each a hydrogen atom, an alkyl group having from 1 to 18 carbon atoms, or a substituted alkyl group having form 1 to 18 carbon atoms substituted by —$OR^{55}$, —$(CH_2CH_2O)_w$—$R^{55}$, a halogen atom (F, Cl, Br or I) or a group represented by the following formula (wherein $R^{55}$ represents a hydrogen atom or an alkyl group having from 1 to 10 carbon atoms; $B^1$ represents a dialkylamino group, a hydroxyl group, an acyloxy group, a halogen atom or a nitro group; and w is an integer of from 0 to 4).

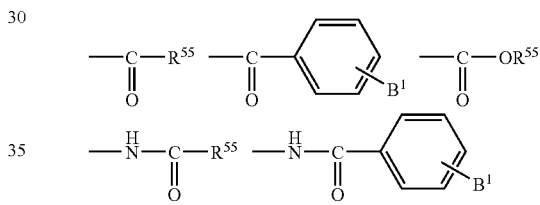

Merocyanine colorants represented by the following formula (16) which are described in JP-A-2-244050.

Formula (16)

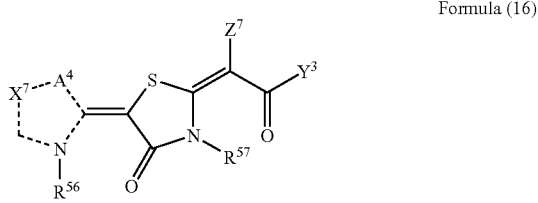

In the above formula, $R^{56}$ and $R^{57}$ independently represent each a hydrogen atom, an alkyl group, a substituted alkyl group, an alkoxycarbonyl group, an aryl group, a substituted aryl group or an aralkyl group. $A^4$ represents an oxygen atom, a sulfur atom, a selenium atom, a tellurium atom, an alkyl- or aryl-substituted nitrogen atom or a dialkyl-substituted carbon atom. $X^7$ represents a nonmetal atom required in forming a nitrogen-containing 5-membered heterocyclic group. $Y^3$ represents a substituted phenyl group, an unsubstituted or substituted polynuclear aromatic ring or an unsubstituted or substituted aromatic heteroring. $Z^7$ represents a hydrogen atom, an alkyl group, a substituted alkyl group, an aryl group, a substituted aryl group, an aralkyl group, an alkoxy group, an alkylthio group, an arylthio group, a substituted amino group, an acyl group or an alkoxycarbonyl group. Alternatively, $Z^7$ may be bonded to $Y^3$ to form a ring. Preferable examples thereof include the following compounds.

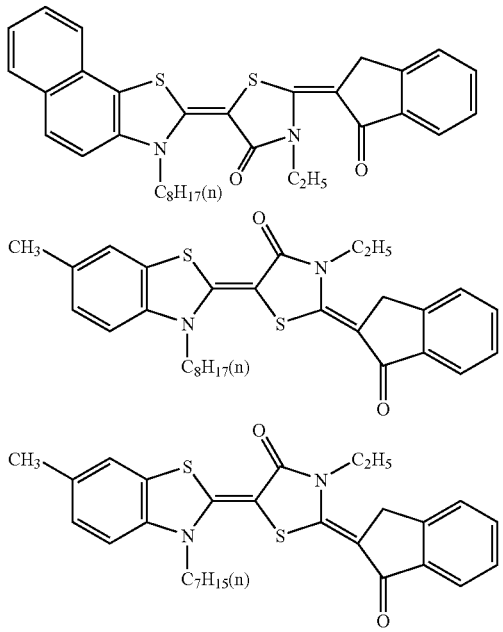

Merocyanine colorants represented by the following formula (17) which are described in JP-B-59-28326.

Formula (17)

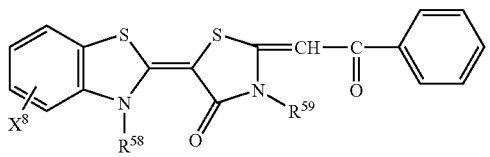

In the above formula, $R^{58}$ and $R^{59}$ independently represent each a hydrogen atom, an alkyl group, a substituted alkyl group, an aryl group, a substituted aryl group or an aralkyl group, which may be the same or different. $X^8$ represents a substituent having a Hammett's value (a) of from −0.9 to +0.5.

Merocyanine colorants represented by the following formula (18) which are described in JP-A-59-89303.

Formula (18)

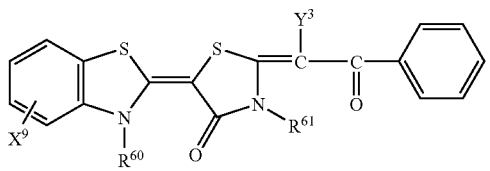

In the above formula, $R^{60}$ and $R^{61}$ independently represent each a hydrogen atom, an alkyl group, a substituted alkyl group, an aryl group, a substituted aryl group or an aralkyl group. $X^9$ represents a substituent having a Hammett's value (σ) of from −0.9 to +0.5. $Y^4$ represents a hydrogen atom, an alkyl group, a substituted alkyl group, an aryl group, a substituted aryl group, an aralkyl group, an acyl group or an alkoxycarbonyl group. Preferable examples thereof include the following compounds.

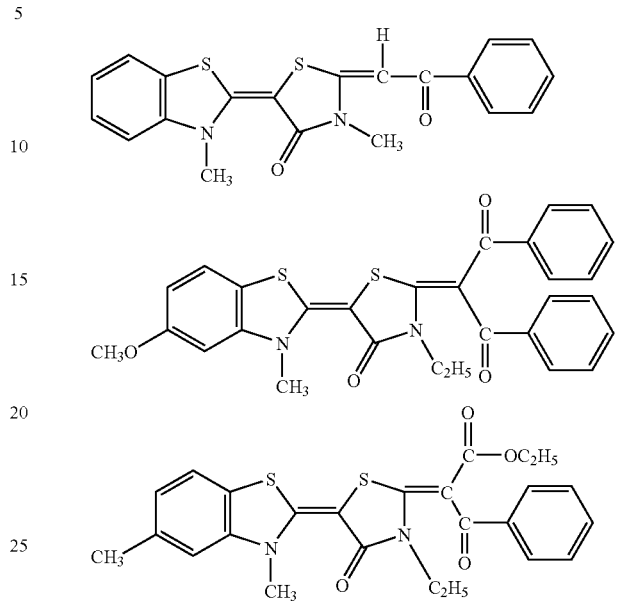

Merocyanine colorants represented by the following formula (19) which are described in JP-6-269047.

Formula (19)

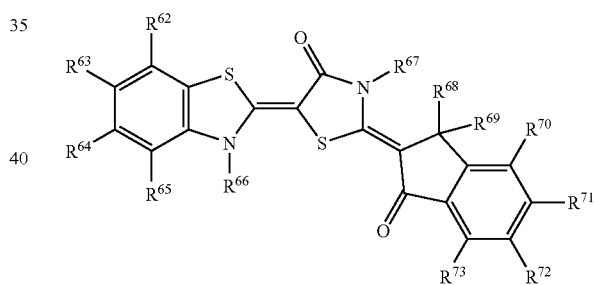

In the above formula, $R^{62}$, $R^{63}$, $R^{64}$, $R^{65}$, $R^{70}$, $R^{71}$, $R^{72}$ and $R^{73}$ independently represent each a hydrogen atom, a halogen atom, an alkyl group, a substituted alkyl group, an aryl group, a substituted aryl group, an hydroxyl group, a substituted oxy group, a mercapto group, a substituted thio group, an amino group, a substituted amino group, a substituted carbonyl group, a sulfo group, a sulfonate group, a substituted sulfinyl group, a substituted sulfonyl group, a phosphono group, a substituted phosphono group, a phosphonate group, a substituted phosphonate group, a cayno group or a nitro group. Alternatively, $R^{62}$ and $R^{63}$, $R^{63}$ and $R^{64}$, $R^{64}$ and $R^{65}$, $R^{70}$ and $R^{71}$, $R^{71}$ and $R^{72}$, or $R^{72}$ and $R^{73}$ may be bonded to each other to form an aliphatic or aromatic ring. $R^{66}$ represents a hydrogen atom, an alkyl group, a substituted alkyl group, an aryl group or a substituted aryl group. $R^{67}$ represents a substituted or unsubstituted alkenylalkyl group or a substituted or unsubstituted alkynylalkyl group. $R^{68}$ and $R^{69}$ independently represent each a hydrogen atom, a halogen atom, an alkyl group, a substituted alkyl group, an aryl group, a substituted aryl group or a substituted carbonyl group. Preferable examples thereof include the following compounds.

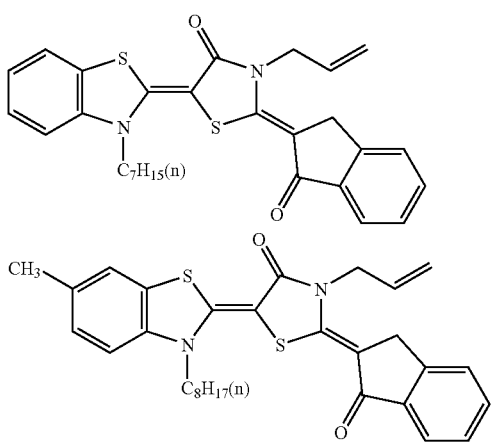

Benzopyran colorants represented by the following formula (20) which are described in JP-A-7-164583.

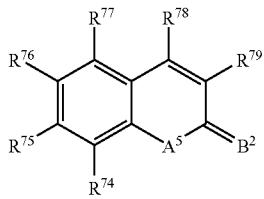

Formula (20)

In the above formula, $R^{74}$ to $R^{77}$ independently represent each a hydrogen atom, a halogen atom, an alkyl group, an aryl group, a hydroxyl group, an alkoxy group or an amino group. Alternatively, $R^{74}$ to $R^{77}$ may each form a ring consisting of nonmetal atoms together with the carbon atom to which it can be attached. $R^{78}$ represents an alkyl group, an aryl group, a hetero aromatic group, a cyano group, an alkoxy group, a carboxy group or an alkenyl group. $R^{79}$ is the same group as represented by $R^{78}$ or $-Z^7-R^{78}$ (wherein $Z^7$ represents a carbonyl group, a sulfonyl group, a sulfinyl group or an arylenedicarbonyl group). Alternatively, $R^{78}$ and $R^{79}$ may form a ring consisting of nonmetal atoms. $A^5$ represents an O atom, an S atom, NH or a substituted N atom. $B^2$ represents an O atom or a $=C(G^7)(G^8)$ group (wherein $G^7$ and $G^8$ may be the same or different and each represents a hydrogen atom, a cyano group, an alkoxycarbonyl group, an aryloxycarbonyl group, an acyl group, an arylcarbonyl group, an alkylthio group, an arylthio group, an alkylsulfonyl group, an arylsulfonyl group or a fluorosulfonyl group, provided that $G^7$ and $G^8$ do not represent hydrogen atoms at the same time. Alternatively, $G^7$ and G 8 may form a ring consisting of nonmetal atoms together with the carbon atom.

Moreover, use may be appropriately made of the following photothermal converting agent (dyes or pigments). Preferable examples of dyes include cyanine dyes described in, for example, JP-A-58-125246, JP-A-59-84356, JP-A-59-202829, JP-A-60-78787 and so on, and cyanine dyes described in British Patent 434,875 and so on.

Further, it is preferable to use near infrared absorption sensitizers described in U.S. Pat. No. 5,156,938, substituted arylbenzo(thio)pyrylium salts described in U.S. Pat. No. 3,881,924, trimethine thiapyrylium salts described in JP-A-57-142645 (U.S. Pat. No. 4,327,169), pyrylium compounds described in JP-A-58-181051, JP-A-58-220143, JP-A-59-41363, JP-A-59-84248, JP-A-59-84249, JP-A-59-146063 and JP-A-59-146061, cyanine colorants described in JP-A-59-216146, pentamethine pyrylium compounds described in U.S. Pat. No. 4,283,475, and pyrylium compounds described in JP-B-5-13514 and JP-B-5-19702.

Furthermore, near infrared absorption dyes represented by the formulae (I) and (II) in U.S. Pat. No. 4,756,993 and phthalocyanine dyes described in EP 916513A2 can be cited as preferable dyes.

Moreover, it is appropriate to use anionic photothermal converting agents described in Japanese Patent Application 10-79912. The term "anionic photothermal converting agent" means a colorant which substantially absorbs infrared rays and has not a cation structure but an anion structure in its mother nucleus. Examples thereof include (a) anionic metal complexes, (b) anionic carbon blacks, (c) anionic phthalocyanines, and (d) compounds represented by the following formula (21). The counter ion in such an anionic photothermal converting agent is a monovalent cation including proton or a polyvalent cation.

Formula (21)

$$[G^9-M^5-G^{10}]_m \ (X^{10})^+$$

The anionic metal complex (a) as described above means a compound serving as an anion as the whole, i.e., the central atom and the ligand in the complex substantially absorbing light.

The anionic carbon black (b) means a carbon black to which an anionic group such as a sulfonate, carboxylate orphosphonate group is attached as a substituent. To introduce such a group into carbon black, use may be made of, for example, a procedure of oxidizing carbon black with a definite acid as described in KABON BURAKKU BINRAN, 3rd ed., p. 12 edited by Kabon Brakku Kyokai, 1995, April 5, published by Kabon Brakku Kyokai).

The anionic phthalocyanine (c) means a compound in which such an anionic group as described with respect to the above (b) is attached to a phthalocyanine skeleton as a substituent and which serves as an anion as the whole.

Next, the compound (d) represented by the formula (21) will be described in greater detail. In the above-described formula (21), $G^9$ represents an anionic substituent and $G^{10}$ represents a neutral substituent. $(X^{10})^+$ represents a 1- to -m valent cation including proton wherein m is an integer of from 1 to 6. $M^5$ represents a conjugation chain optionally having a substituent or a cyclic structure. The conjugation chain $M^5$ can be represented by the following formula.

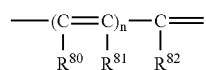

In the above formula, $R^{80}$, $R^{81}$ and $R^{82}$ independently represent each a hydrogen atom, a halogen atom, a cyano group, an alkyl group, an aryl group, an alkenyl group, an alkynyl group, a carbonyl group, a thio group, a sulfonyl group, a sulfinyl group, an oxy group or an amino group. Alternatively, $R^{80}$, $R^{81}$ and $R^{82}$ may be bonded to each other to from a cyclic structure. n is an integer of from 1 to 8.

Among the anionic photothermal converting agents represented by the above-described formula (21), the following compounds IRA-1 to IRA-5 are preferably employed.

IRA-1

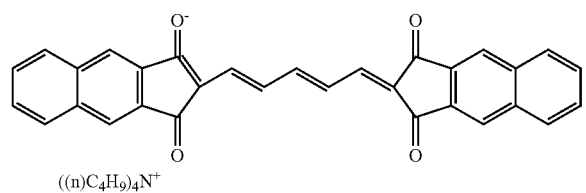

IRA-2
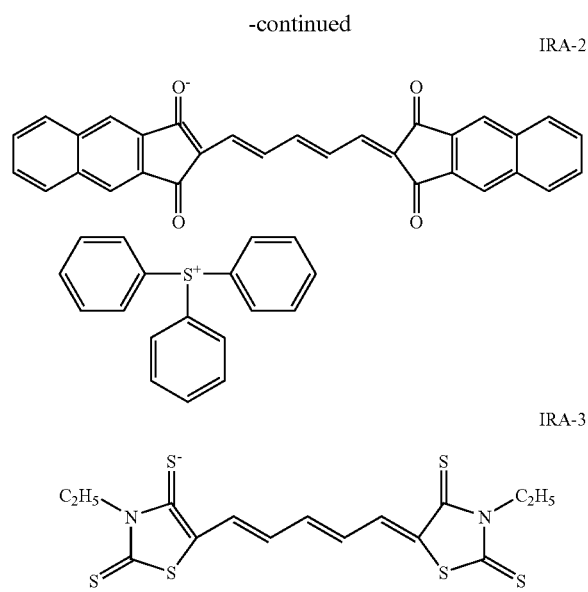
IRA-3
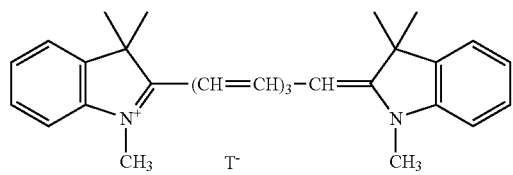
IRA-4
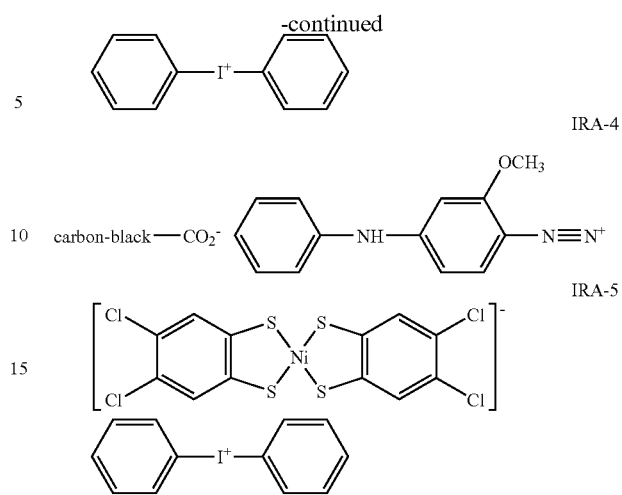
IRA-5
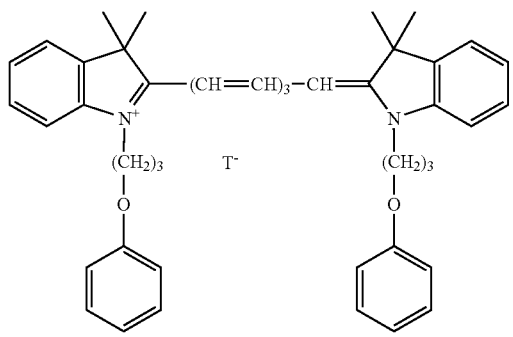
It is also preferable to use cationic photothermal converting agents represented by the following formulae IRC-1 to IRC-44.
IRC-1 IRC-2
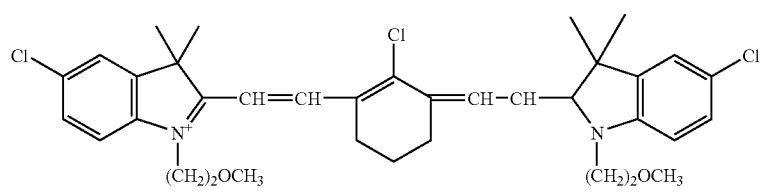
IRC-3
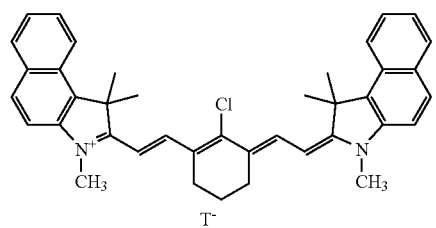
IRC-4 IRC-5
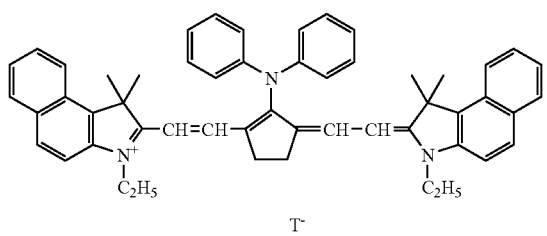

-continued
IRC-6
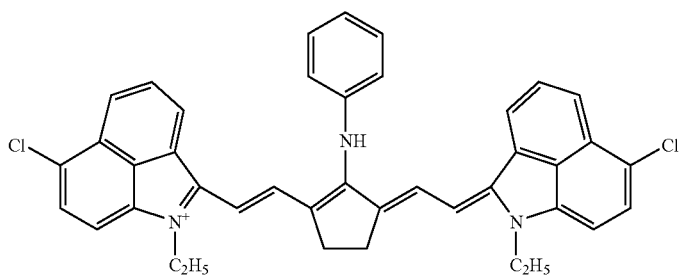
T⁻
IRC-7
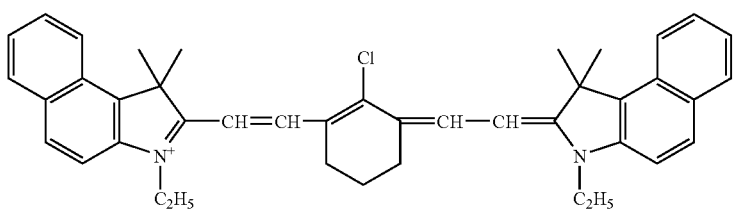
T⁻
IRC-8
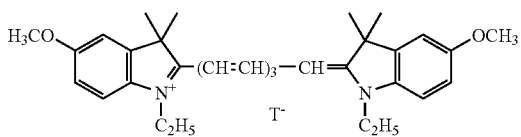
IRC-9
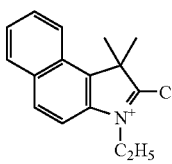
IRC-10
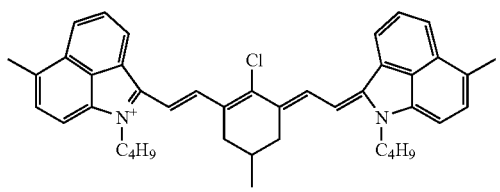
T⁻
IRC-11
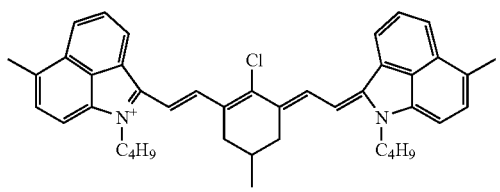
T⁻
IRC-12
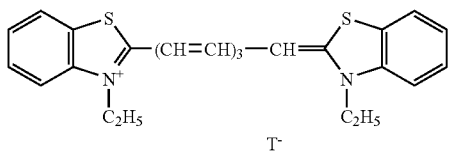
T⁻
IRC-13
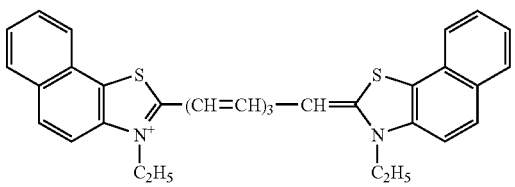
T⁻
IRC-14
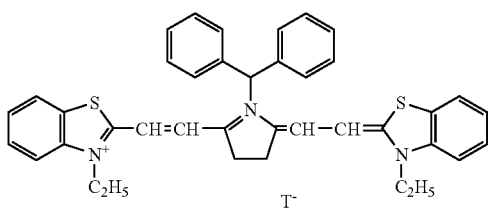
T⁻
IRC-15
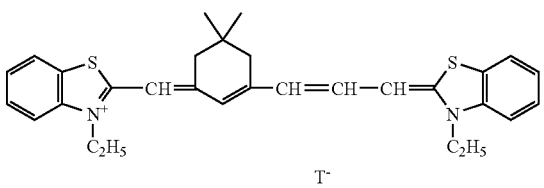
T⁻

-continued
IRC-16
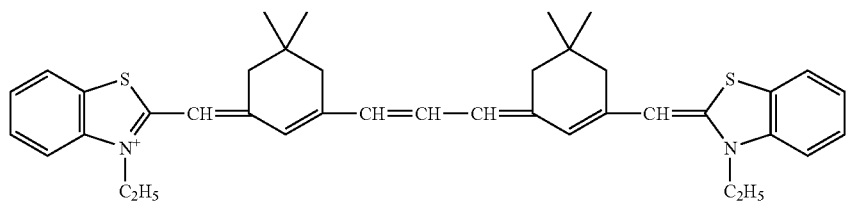
T⁻
IRC-17
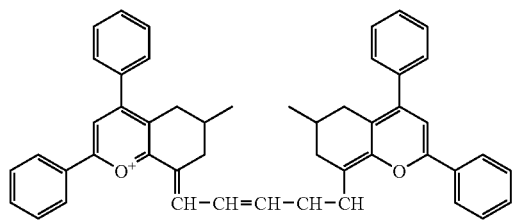
T⁻
IRC-18
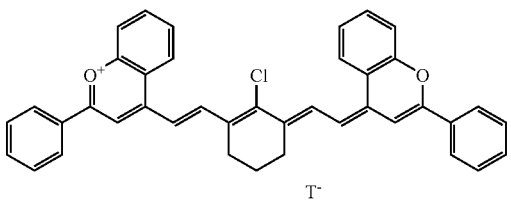
T⁻
IRC-19
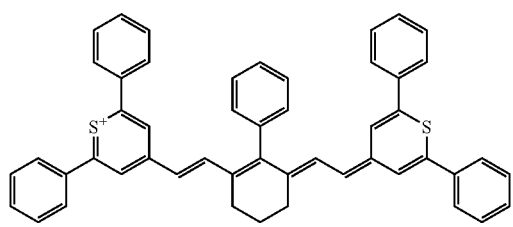
IRC-20
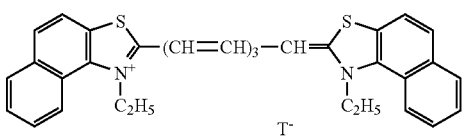
T⁻
IRC-21
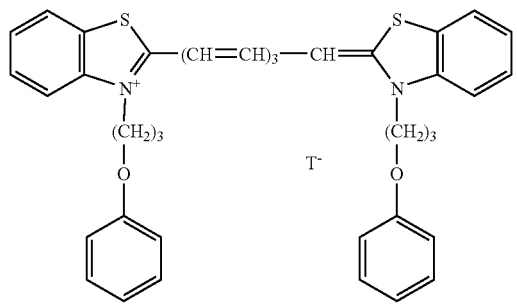
T⁻
IRC-22
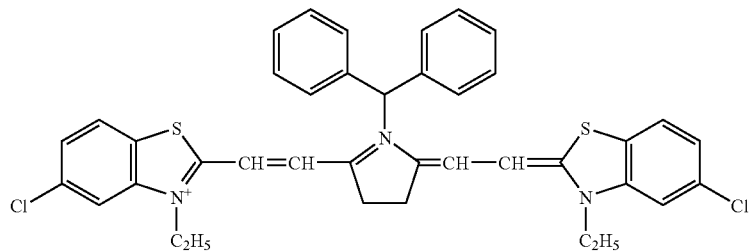
T⁻

-continued
IRC-23
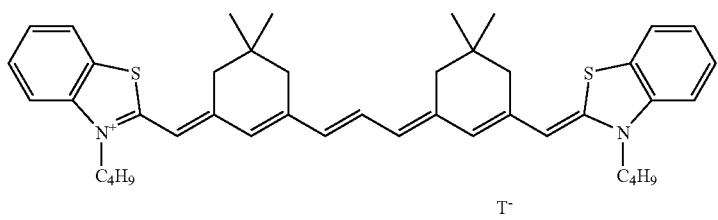
T⁻
IRC-24
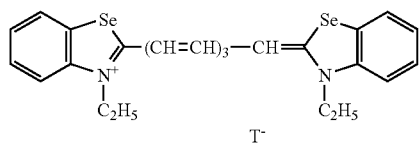
T⁻
IRC-25
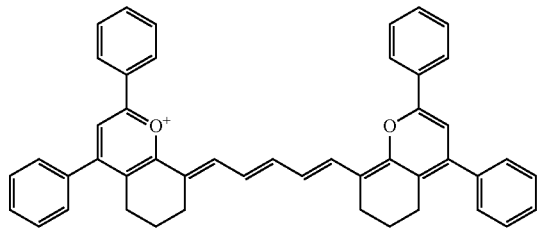
T⁻
IRC-26
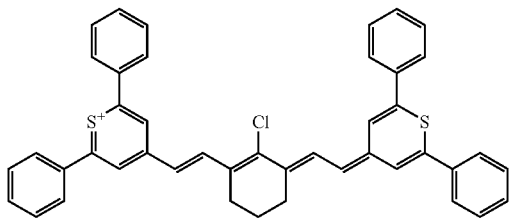
T⁻
IRC-27
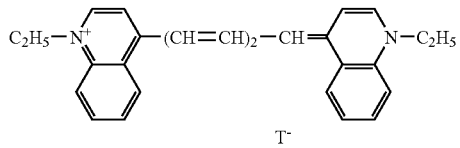
T⁻
IRC-28
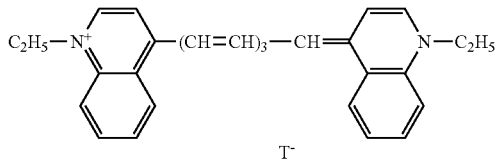
T⁻
IRC-29
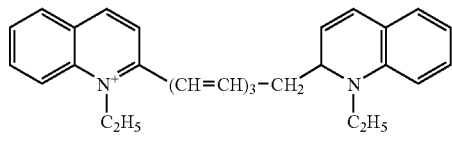
T⁻
IRC-30
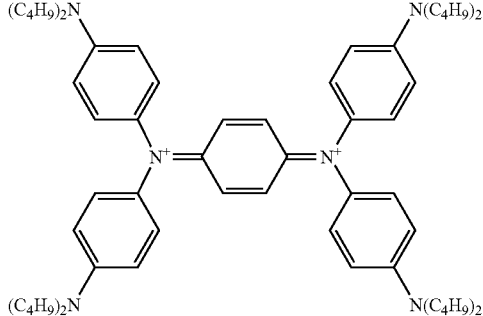
2T⁻
IRC-31
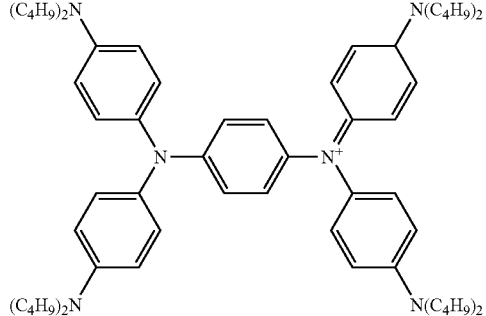
T⁻

-continued
IRC-32
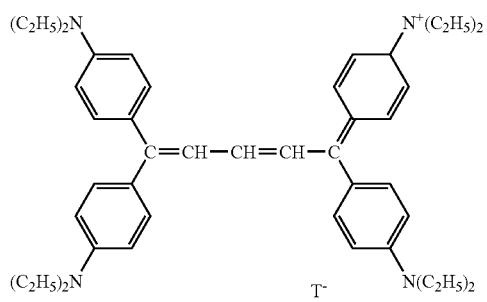
IRC-33
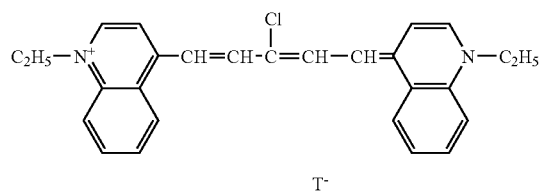
IRC-34
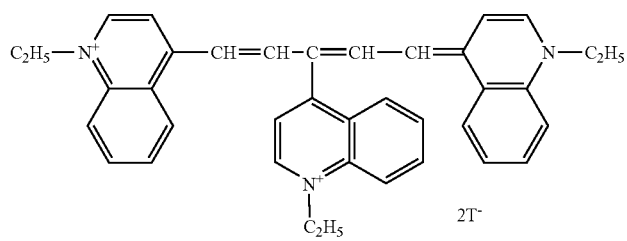
IRC-35
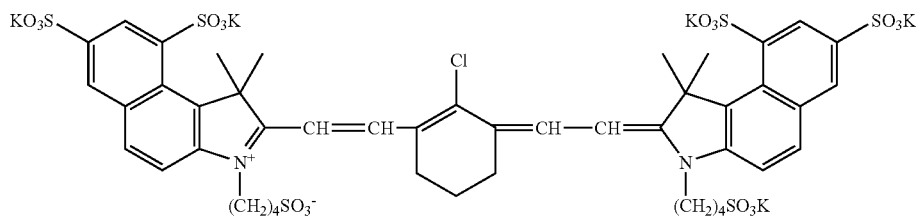
IRC-36
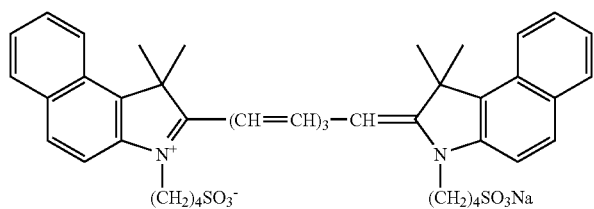
IRC-37
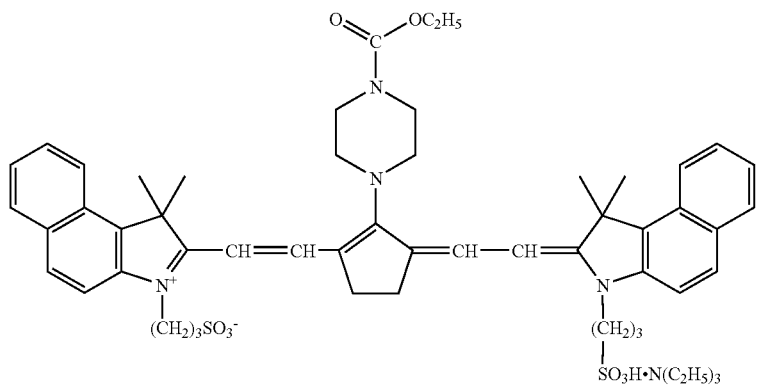

-continued

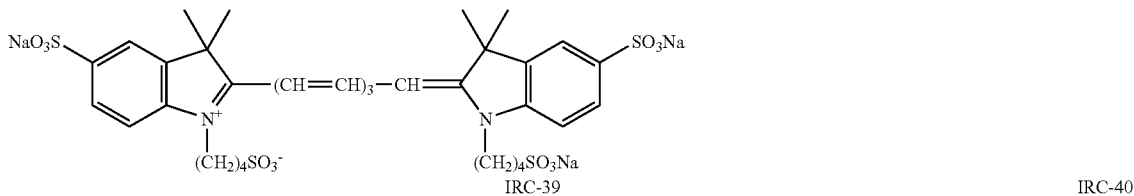
IRC-38

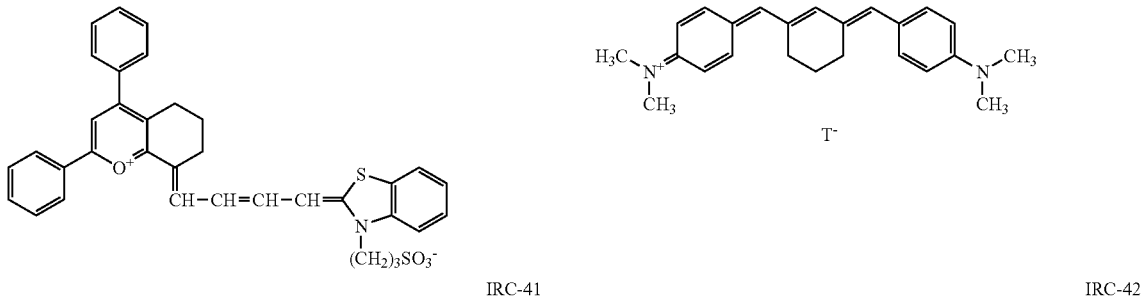
IRC-39
IRC-40

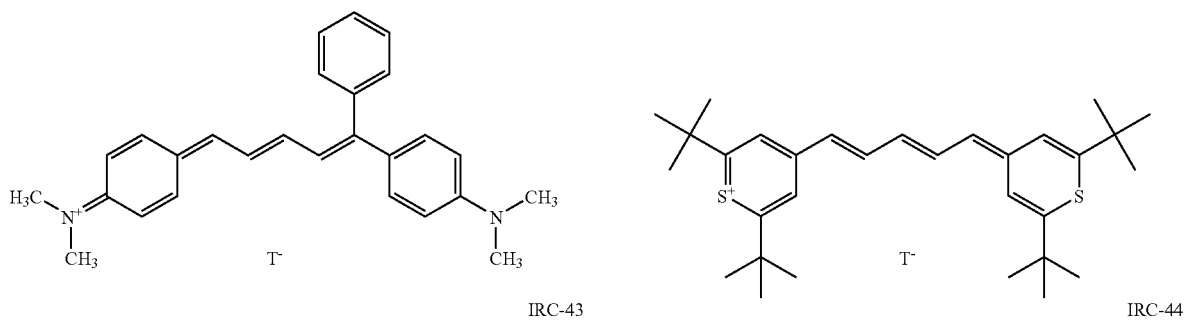
IRC-41
IRC-42

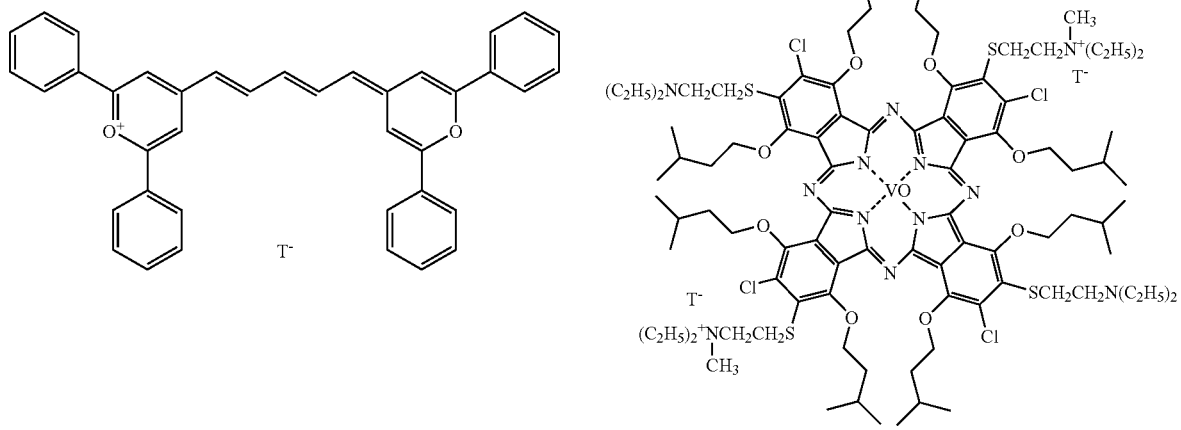
IRC-43
IRC-44

In the above structural formulae, $T^-$ represents a monovalent counter anion, preferably a halogen anion ($F^-$, $Cl^-$, $Br^-$, $I^-$), a Lewis acid anion ($BF_4^-$, $PF_6^-$, $SbCl_6^-$, $ClO_4^-$), an alkylsulfonate anion or an arylsulfonate anion.

The alkyl group in the above-described alkylsulfonic acid means a linear, branched or cyclic alkyl group having 1 to 20 carbon atoms. Particular examples thereof include such as a methyl group, an ethyl group, a propyl group, a butyl group, a pentyl group, a hexyl group, a heptyl group, an octyl group, a nonyl group, a decyl group, an undecyl group, a dodecyl group, a tridecyl group, a hexadecyl group, an octadecnyl group, an eicosyl group, an isopropyl group, an isobutyl group, a s-butyl group, a t-butyl group, an isopentyl group, a neopentyl group, a 1-methylbutyl group, an isohexyl group, a 2-ethylhexyl group, a 2-methylhexyl group, a cyclohexyl group, a cyclopentyl group and a 2-norbornyl group. Among these groups, linear alkyl groups having from 1 to 12 carbon atoms, branched alkyl groups having from 3 to 12 carbon atoms and cyclic alkyl groups having from 5 to 10 carbon atoms are preferred.

The aryl group in the above-described arylsulfonic acid means a group made of one benzene ring, a group made of 2 or three benzene rings fused together or a group made of a benzene ring and an unsaturated 5-membered ring fused together. Particular examples thereof include a phenyl group, a naphthyl group, an anthryl group, a phenanthryl group, an indenyl group, an acctonaphthenyl group and a fluorenyl group. Among them, a phenyl group and a naphthyl group are still preferred.

Moreover, nonionic photothermal converting agents represented by the following formulae IRN-1 to IRN-9 can be appropriately used.

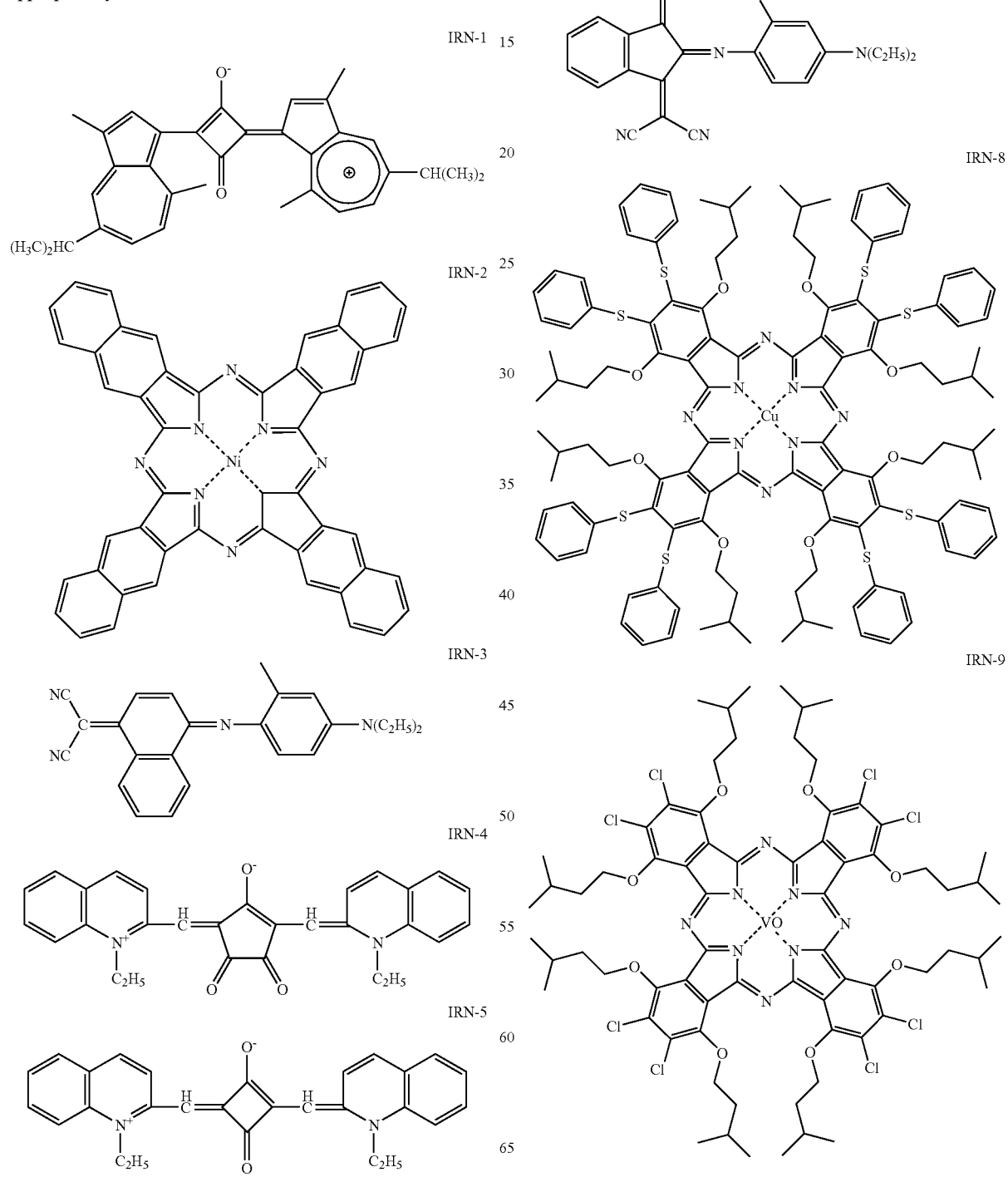

Among the compounds cited above by way of example, IRA-1 is preferable as an anionic photothermal converting agent, IRC-7, IRC-30, IRC-40 and IRC-42 are preferable as cationic photothermal converting agents, and IRN-9 is preferable as a nonionic photothermal converting agent.

<Pigment>

As examples of the pigment to be used in the invention, commercially available pigments and pigments described in *Color Index* (C.I.) *Binran, Saishin Ganryo Binran* (ed. by Nippon Ganryo Gijutsu Kyokai, 1977), *Saishin Ganryo Oyo Gijutsu* (CMC Shuppan, 1986) and *Insatsu Inki Gijutsu* (CMC Shuppan, 1984) maybe cited.

Concerning the types of the pigments, use can be made of black pigments, yellow pigments, orange pigments, brown pigments, red pigments, purple pigments, blue pigments, green pigments, fluorescent pigments, metallic powder pigments, and polymer-binding colorants. More specifically speaking, use can be made of insoluble azo pigments, azo lake pigments, condensed azo pigments, chelate azo pigments, phthalocyanine-type pigments, anthraquinone-type pigments, perylene and perylene-type pigments, thioindigo-type pigments, quinacridone-type pigments, dioxazine-type pigments, isoindolinone-type pigments, quinophthalone-type pigments, underglaze lake pigments, azine pigments, nitroso pigments, nitro pigments, natural pigments, fluorescent pigments, inorganic pigments, carbon black and so on. Among these pigments, carbon black is preferred.

Such a pigment may be used without any surface treatment. Alternatively, it may be surface-treated before using. As the surface-treatment method, a method of coating the surface with a resin or a wax, a method of attaching a surfactant, a method of bonding a reactive substance (for example, a silane coupling agent, an epoxy compound, a polyisocyanate or the like) to the surface of the pigment, etc. may be suggested. These surface-treatment methods are reported by *Kinzoku Sekken no Seishitu to Oyo* (Saiwai Shobo), *Insatsu Inki Gijutsu* (CMC Shuppan, 1984) and *Saishin Ganryo Oyo Gijutsu* (CMC Shuppan, 1986).

The particle diameter of the pigment preferably ranges from 0.01 to 10 μm, still preferably from 0.05 to 1 μm and particularly preferably from 0.1 to 1 μm. It is undesirable, from the viewpoint of the stability of the dispersion in a coating solution of the image recording layer, that the particle diameter of the pigment is less than 0.01 μm. On the other hand, it is undesirable from the viewpoint of the uniformity of the image recording layer that the particle diameter thereof exceeds 10 μm.

To disperse the pigment, use can be made of a publicly known dispersion technique having been employed in producing inks, toners, etc. Examples of a dispersing machine include an ultrasonic disperser, a sand mill, an attritor, a pearl mill, a super mill, a ball mill, an impeller, a disperser, a KD mill, a colloid mill, a dynatron, a three-roll mill, a pressure kneader and so on. Details are described in *Saishin Ganryo Oyo Gijutsu* (CMC Shuppan, 1986).

Although the above-described photothermal converting agent may be added together with other components directly to a composition to be used as the recording layer, it is also possible that another layer adjacent to the recording layer separately is formed and the photothermal converting agent is added thereto.

In forming the recording layer, it is preferable that the optical density ranges from 0.1 to 0.3 at the absorption maximum of the recording layer within the wavelength range of from 300 to 1200 nm. In the case where the optical density does not fall within this range, the sensitivity is liable to lower. Since the optical density is determined depending on the addition level of the photothermal converting agent and the thickness of the recording layer, a definite optical density can be achieved by controlling these factors. The optical density of the recording layer can be measured by a conventional method. Examples of the measurement method include a method wherein a recording layer having such a thickness as being appropriately determined within a range so as to give a coating dose after drying required as a lithographic printing plate is formed on a transparent or white support and the optical density thereof is measured with a scanning optical densitometer, and a method wherein a recording layer is formed on a reflective support made of aluminum etc. and the reflection density is measured.

[(D) Polymerizable Compound]

From the viewpoints of film-hardening performance and printing tolerance, it is preferable to add a polymerizable compound (D), which induces and promotes a polymerization reaction using radicals emitted from the above-described radical initiator as an initiator, to the recording layer of the lithographic printing plate precursor according to the invention.

The polymerizable compound to be used in the invention is selected from the group consisting of compounds having at least one, preferably two or more ethylenically unsaturated bonds. Such compounds, which have been widely known in the art, can be employed in the invention without specific restriction. These compounds involve those having chemical forms of, for example, monomers, prepolymers (i.e., dimers, termers and oligomers), mixtures thereof and copolymers thereof. Examples of the monomers and copolymers thereof include unsaturated carboxylic acids (for example, acrylic acid, methacrylic acid, itaconic acid, crotonic acid, isocrotonic acid, maleic acid, etc.), esters thereof and amides thereof. It is preferable to use unsaturated esters of carboxylic acids with aliphatic polyhydric alcohols and amides of unsaturated carboxylic acids with aliphatic polyvalent amine compounds. Moreover, use may be appropriately made of addition reaction products of unsaturated carboxylic acid esters or amides having a nucleophilic substituent such as a hydroxyl group, an amino group or a mercapto group with monofunctional or polyfunctional isocyanates or epoxy compounds, dehydrocondensation products thereof with monofunctional or polyfunctional carboxylic acids, etc. In addition, it is also appropriate to use addition reaction products of unsaturated carboxylic acid esters or amides having an electrophilic substituent such as an isocyanate group or an epoxy group with monohydric or polyhydric alcohols, amides or thiols and substitution reaction products of unsaturated carboxylic acid esters or amides having a leaving substituent such as a halogen group or a tosyloxy group with monohydric or polyhydric alcohols, amines or thiols. As further examples, it is also possible to employ compounds prepared by substituting the unsaturated carboxylic acids as described above by unsaturated phosphonic acid, styrene, vinyl ether or the like.

As Particular examples of the monomers of the esters of aliphatic polyhydric alcohol compounds with unsaturated carboxylic acids, citation may be made of acrylic acid esters, e.g., ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl)ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl)isocyanurate and polyester acrylate oligomers.

Examples of methacrylic acid esters include tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy) phenyl]dimethylmethane and bis[p-(methacryloxyethoxy) phenyl]dimethylmethane.

Examples of itaconic acid esters include ethylene glycol diitaconate, propylene glycol diitaconate, 1,3-butanediol diitaconate, 1,4-butanediol diitaconate, tetramethylene glycol diitaconate, pentaerythritol diitaconate and sobritol tetraitaconate. Examples of crotonic acid esters include ethyleneglycol dicrotonate, tetramethylene glycol dicrotonate, pentaerythritol dicrotonate and sorbitol tetracrotonate. Examples of isocrotonic acid esters include ethyleneglycol diisocrotonate, pentaerythritol diisocrotonate and sorbitol tetraisocrotonate. Examples of maleic acid esters include ethyleneglycol dimaleate, triethylene glycol dimaleate, pentaerythritol dimaleate and sorbitol tetramaleate.

As other examples of the esters, use may be appropriately made of aliphatic alcohol type esters described in JP-B-46-27926, JP-B-51-47334 and JP-A-57-196231, those having an aromatic skeleton described in JP-A-59-5240, JP-A-59-5241 and JP-A-2-226149, those having an amino group described in JP-A-1-165613, etc. Furthermore, it is also possible to use mixtures of the ester monomers as described above.

Particular examples of the monomers of amides of aliphatic polyvalent amine compounds with unsaturated carboxylic acids include methylene bis-acrylamide, methylene bis-methacrylamide, 1,6-hexamethyelne bis-acrylamide, 1,6-hexamethyelne bis-methacrylamide, diethylenetriamine trisacrylamide, xylyene bisacrylamide, xylylene bis-methacrylamide, etc. Other preferable examples of amide-type monomers include those having a cyclohexylene structure described in JP-B-54-21726.

Also, a urethane-based addition-polymerizable compound produced by using the addition reaction between isocyanate and a hydroxyl group can be appropriately used. Particular examples thereof include vinylurethane compounds having two or more polymerizable vinyl groups per molecule, which are obtained by adding a vinyl monomer having a hydroxyl group as represented by the following formula to a polyisocyanate compound having two or more isocyanate groups per molecule, as described in, for example, JP-B-48-41708.

$$CH_2=C(R^4)COOCH_2CH(R^5)OH \quad \text{Formula}$$

wherein $R^4$ and $R^5$ represent each H or $CH_3$.

Moreover, use may be appropriately made of urethane acrylates described in JP-A-51-37193, JP-B-2-32293 and JP-B-2-16765, urethane compounds having an ethylene oxide-type skeleton described in JP-B-58-49860, JP-B-56-17654, JP-B-62-39417 and JP-B-62-39418, etc. Furthermore, heat-sensitive compositions having highly favorable hardening reaction speed can be obtained by using addition-polymerizable compounds having an amino structure or a sulfide structure in the molecule described in JP-A-63-277653, JP-A-63-260909 and JP-A-1-105238.

Additional examples of the polymerizable compound include polyester acrylates and polyfunctional acrylates and methacrylates such as epoxyacrylates obtained by reacting epoxy resins with (meth)acrylic acid which are described in JP-A-48-64138, JP-B-49-43191 and JP-B-52-30490. Furthermore, specific unsaturated compounds described in JP-B-46-43946, JP-B-1-40337 and JP-B-1-40336 and vinylphosphonic acid type compounds described in JP-A-2-25493 may be cited. In some cases, moreover, it is appropriate to use a structure having a perfluoroalkyl group as described in JP-A-61-22048. It is also possible to use light-hardening monomers and oligomers reported in *Nippon Secchaku Kyokai-shi*, vol.20, No. 7, pp. 300-308 (1984).

Details in using such a polymerizable compound (i.e., it structure, either using alone or combinedly, the addition level, etc.) can be arbitrarily selected depending on the purpose of use, for example, design of the performance of the a recording material of the lithographic printing plate precursor according to the invention. For example, selection may be made from the following viewpoints. Concerning the photosensitization speed, it is preferable to employ a structure containing much unsaturated groups per molecule (preferably being bifunctional or higher in many cases). To elevate the strength in the image part (i.e., the hardened film), a trifunctional or higher compound is preferable. It is also effective to use a combination of compounds having different functional valencies and different polymerizable groups (for example, an acrylic acid ester, a methacrylic acid ester, a styrene-type compound and a vinyl ether-type compound) so as to control both of the photosensitivity and the strength. Although a compound having a high molecular weight and a highly hydrophobic compound are favorable from the viewpoint of photosensitization speed and film strength, these compounds are sometimes undesirable with respects to development speed and deposition from a developing solution. Considering compatibility with other components in the recording layer (for example, a binder polymer, an initiator and a colorant) and dispersion properties, it is highly important to appropriately select and use an addition-polymerizable compound. For example, the compatibility can be improved in some cases by using a compound with a low purity or a combination of two or more compounds. It is also possible to select a specific structure in order to enhance the adhesiveness to a substrate or an overcoat layer as will be described hereinafter. Concerning the composition ratio of the polymerizable compound in the recording layer, a higher ratio is the better from the viewpoint of sensitivity. However, an excessively large content of the polymerizable compound would result in undesirable phase separation, some problems in the production process due to the adhesiveness of the composition (for example, transfer of the sensitive components and troubles in the production due to adhesion), and deposition from a developing solution. From these points of view, it is preferable that the content of the polymerizable composition ranges from 5 to 80% by mass, still preferably from 25 to 75% by mass, based on the nonvolatile components in the recording layer. Either one polymerizable compound or two or more thereof may be used. In using the polymerizable compound, moreover, its structure, composition and addition level can be appropriately selected from the viewpoints of the degree of polymerization initiation to oxygen, resolution, fogging, change in refraction index, surface adhesiveness and so on. It is also possible in some cases to employ such a layer structure and coating method as forming undercoating or overcoating.

[(E) Binder Polymer]

The lithographic printing plate precursor according to the invention may contain a binder polymer in the recording layer in order to, for example, improve its film properties. As the binder polymer, it is preferable to use a linear organic high-molecular weight polymer. As such a "linear organic high-molecular weight polymer", use can be made of an arbitrary one known in public. It is preferable to select a linear organic high-molecular weight polymer which is soluble or swellable in water or a weakly alkaline aqueous solution and, therefore, usable in development with water or a weakly alkaline aqueous solution. A linear organic high-molecular weight polymer is appropriately selected and employed not only as a film-forming agent in the composition but also as a developing agent with water, a weakly alkaline aqueous solution or an organic solvent. In case of using a water-soluble organic high-molecular weight polymer, for example, development can be performed with water. Examples of such linear organic high-molecular weight polymer include addition polymers having a carboxylate group in a side chain such as those described in JP-A-59-44615, JP-B-54-34327, JP-B-58-12577, JP-B-54-25957, JP-A-54-92723, JP-A-59-53836 and JP-A-59-71048, namely, methacrylic acid copolymers, acrylic acid copolymers, itaconic acid copolymers, crotonic acid copolymers, maleic acid copolymers, partly esterified maleic acid copolymers and so on. Similarly, acidic cellulose derivatives having a carboxylate group in a side chain may be cited. Moreover, products obtained by adding cyclic acid anhydrides to addition polymers having hydroxyl groups are useful too.

Among the binder polymers as described above, (meth) acrylic resins having an allyl group and a carboxyl group in side chain and alkali-soluble resins having a double bond in side chain, which are described in JP-A-2000-187322, JP-A-2002-62648, Japanese Patent Application 2001-253217, Japanese Patent Application 2002-287920, JP-A-2002-62648, etc., are excellent in the balance among film strength, sensitivity and development characteristics and, therefore, adequately usable.

As other examples of the binder polymer, urethane-based binder polymers having an acid group described in JP-B-7-12004, JP-B-7-120041, JP-B-7-120042, JP-B-8-12424, JP-A-63-287944, JP-A-63-287947, JP-A-1-271741, Japanese Patent Application 10-116232, etc. are excellent in strength and, therefore, advantageous in printing tolerance and exposure suitability at low doses.

In addition, polyvinylpyrrolidone, polyethylene oxide, etc. are useful as a water-soluble linear organic polymer. To elevate the strength of a hardened film, alcohol-soluble nylons, 2,2-bis-(4-hydroxyphenyl)-propane/epichlorohydrin polyether, etc. are also useful.

The weight-average molecular weight of the polymer to be used in the invention is preferably 5,000 or more, still preferably from 10,000 to 300,000. Its number-average molecular weight is preferably 1,000 or more and still preferably form 2,000 to 2,500,000. The polydispersion degree (weight-average molecular weight/number-average molecular weight) is preferably 1 or more, still preferably from 1.1 to 10.

Although such a polymer may be a random polymer, a block polymer, a graft polymer or the like, a random polymer is preferred.

The polymer to be used in the invention can be synthesized by a conventionally known method. Examples of the solvent to be used in the synthesis include tetrahydrofruan, ethylene dichloride, cyclohexanone, methyl ethyl ketone, acetone, methanol, ethanol, ethylene glycol monomethyl ether, ethylene glycol monoethyl ether, 2-methoxyethyl acetate, diethylene glycol dimethyl ether, 1-methoxy-2-propanol, 1-methoxy-2-propyl acetate, N,N-dimethylformamide, N,N-dimethylacetamide, toluene, ethyl acetate, methyl lactate, ethyl lactate, dimethyl sulfoxide and water. Either one of these solvents or a mixture of two or more thereof may be used.

As a radical polymerization initiator for synthesizing the polymer to be used in the invention, use can be made of publicly known compounds such as azo initiators and peroxide initiators.

The binder polymer to be used in the invention may be a single compound. Alternatively, use may be made of a mixture thereof.

As described above, the content of the binder polymer (E) in the recording layer of the lithographic printing plate precursor according to the invention is preferably not more than 90% by mass, still preferably not more than 70% by mass, based on the total polymer compounds including the specific polyurethane compound (A).

[Construction of Lithographic Printing Plate Precursor]

The lithographic printing plate precursor according to the invention can be produced by dissolving the above components in a solvent to give a coating solution for the recording layer and then applying it to an appropriate support. Moreover, various additives, a backcoat layer, an intermediate layer, a protective layer and so on, each as will described hereinafter, can be similarly formed depending on the purpose.

The recording layer of the lithographic printing plate precursor according to the invention may contain a dye showing large absorption in the visible light region as an image coloring agent. Particular examples thereof include Oil Yellow #101, Oil Yellow #103, Oil Pink #312, Oil Green BG, Oil Blue BOS, Oil Blue #603, Oil Black BY, Oil Black BS and Oil Black T-505 (manufactured by Orient Chemical Industries, Ltd.), Victoria Blue, Crystal Violet (CI42555), Methyl Violet (CI42535), Ethyl Violet, Rhodamine B (CI45170B), Malachite Green (CI42000), Methylene Blue (CI52015), etc. and dyes described in JP-A-62-293247. Moreover, use may be appropriately made of pigments such as phthalocyanine pigments, azopigments, carbon black and titanium oxide.

It is preferable to add such a coloring agent after forming an image, since an image part can be easily distinguished from a nonimage part. The addition level thereof ranges from 0.01 to 10% by mass based on the total solid content in the coating solution for the recording layer.

It is preferable in the invention to add a small amount of a thermal polymerization initiator to inhibit the unnecessary thermal polymerization of the polymerizable compound during the production or storage of the coating solution for the recording layer. Appropriate examples of the thermal polymerization inhibitor include hydroquinone, p-methoxyphenol, di-t-butyl-p-cresol, pyrogallol, t-butyl catechol, benzoquinone, 4,4'-thiobis(3-methyl-6-t-butylphenol), 2,2'-methylenebis(4-methyl-6-t-butylphenol) and N-nitrosophenylhydroxyamine primary cerium salt. It is preferable to add the thermal polymerization initiator in an amount of from about 0.01% by mass to about 5% by mass based on the total solid content in the coating solution for the recording layer. If necessary, a higher fatty acid derivative such as behenic acid or behenic acid amide, which is localized on the surface of the recording layer in the course of drying following the application, may be added to prevent the oxidative inhibition of the polymerization. It is preferable that the content of the higher fatty acid derivative ranges from about 0.1% by mass to about 10% by mass based on the total solid content in the coating solution for the recording layer.

To establish favorable treatment stability under development conditions over a wide range, it is also possible to add a nonionic surfactant (for example, those described in JP-A-62-251740 and JP-A-3-208514) or an amphoteric surfactant (for example, those described in JP-A-59-121044 and JP-A-4-13149).

Particular examples of the nonionic surfactant include sorbitan tristearate, sorbitan monopalmitate, sorbitan trioleate, stearic acid monoglyceride and polyoxyethylene nonyl phenyl ether.

Particular examples of the amphoteric surfactant include alkyldi(aminoethyl)glycines, alkylpolyaminoethylglycine hydrochlorides, 2-alkyl-N-carboxyethyl-N-hydroxyethylimidazoliniumbetaines, N-tetradecy-N,N-betains (for example, AMOGEN manufactured by Daiichi Kogyo).

The above-described nonionic surfactant or amphoteric surfactant is added in an amount preferably from 0.05 to 15% by mass, still preferably from 0.1 to 5% by mass, based on the total solid content in the coating solution for the recording layer.

Furthermore, the coating solution for the recording layer according to the invention may contain a plasticizer, if necessary, to impart film flexibility and so on. For example, use can be made of polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, etc.

The recording layer of the lithographic printing plate precursor according to the invention may be formed usually by dissolving the components of the recording layer as described above and additional components required in the coating solution in a solvent and coating on an appropriate support. Examples of the solvent to be used herein include ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethyl urea, N-methylpyrrolidone, dimethyl sulfoxide, sulfolane, γ-butyrolactone, toluene and water, though the invention is not restricted thereto. Either one of these solvents or a mixture thereof may be used. The concentration of the above-described components (total solid matters including additives) in the solvent appropriately ranges from 1 to 50% by mass.

It is generally preferable that the coating dose (solid content) of the recording layer on the support after drying ranges from about 0.5 to about 5.0 g/m$^2$. As the coating dose decreases, the apparent sensitivity is elevated but the film properties of the recording layer are worsened.

Coating may be performed by various methods such as bar coater coating, spin coating, spray coating, curtain coating, dip coating, air knife coating, blade coating and roll coating.

To improve coating properties, the coating solution for the recording layer according to the invention may further contain a surfactant such as a fluorine-base surfactant as described in JP-A-62-170950. The addition level thereof preferably ranges from 0.01 to 1% by mass, still preferably from 0.05 to 0.5% by mass, based on the total solid content in the coating solution for the recording layer.

(Support)

The support to be used in the lithographic printing plate precursor according to the invention is not particularly restricted, so long as it is a sheet type material having a high dimensional stability. Examples thereof include papers, papers having plastics (for example, polyethylene, polypropylene, polystyrene, etc.) laminated thereon, metal sheets (for example, aluminum, zinc, copper, etc.), plastic films (for example, cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, polyvinyl acetal, etc.) and so on. Such a support may be a sheet made of a single component such as a resin film or a metal sheet. Alternatively, it may be a laminate made of two or more materials. For example, papers or plastic films having the above metals laminated or evaporated thereon and laminate sheets composed of plastic films of different types fall within the category thereof.

As the above-described support, polyester films and aluminum sheets are preferable. In particular, aluminum sheets are preferable because of being excellent in dimensional stability and relatively less expensive. Appropriate examples of the aluminum sheets are pure aluminum sheets and alloy sheets comprising aluminum as the main component together with a different element in a trace amount. Moreover, it is also possible to use a plastic film having aluminum laminated or evaporated thereon. Examples of the different element contained in the aluminum alloys include silicon, iron, manganese, copper, magnesium, chromium, zinc, bismuth, nickel, titanium and so on. The content of such a different element in an alloy is 10% by weight at the largest. Although pure aluminum is appropriate as the aluminum to be used in the invention, completely pure aluminum can be hardly produced from the viewpoint of refining techniques. Thus, use may be made of one containing a small amount of a different element. That is to say, the aluminum sheet to be applied in the invention is not restricted in its composition but aluminum sheets having been publicly known and used can be appropriately employed.

The thickness of the above-described aluminum sheet ranges from about 0.1 to 0.6 mm, preferably from 0.15 to 0.4 mm and particularly preferably from 0.2 to 0.3 mm.

Before roughening the surface of the aluminum sheet, a degreasing treatment is carried out to remove a rolling-mill oil from the surface with the use of, for example, a surfactant, an organic solvent or an aqueous alkali solution.

The treatment for roughening the aluminum sheet surface can be carried out by various methods, for example, a mechanical roughening method, an electrochemical surface roughening method and a method of chemically solubilizing the surface selectively. As the mechanical roughening method, use can be made of publicly known methods such as the ball grinding method, the brush grinding method, the blast grinding method and the buff grinding method. As the electrochemical surface roughening method, use may be made of a roughening method which is carried out in a hydrochloric acid or nitric acid electrolytic solution under an alternating current or a direct current. It is also possible to use a combination of these methods as disclosed in JP-A-54-63902.

If desired, the thus surface-roughened aluminum sheet may be further subjected to alkali etching and neutralization followed by anodic oxidation to improve the water retention properties and the abrasion resistance of the surface. As the electrolyte to be employed in the anodic oxidation of the aluminum sheet, use may be made of various electrolytes forming a porous oxidation film. In general, sulfuric acid, phosphoric acid, oxalic acid, chromic acid or a mixture of these acids is used. The concentration of such an electrolyte may be appropriately determined depending on the type of the electrolyte.

The treatment conditions for the anodic oxidation cannot be determined in general since they vary depending on the electrolyte employed. In general, it is appropriate that the concentration of the electrolyte solution ranges from 1 to 80% by mass, the solution temperature ranges from 5 to 70° C., the current density ranges from 5 to 60 A/dm$^2$, the voltage ranges from 1 to 100 V and the electrolysis time ranges from 10 sec to 5 min.

It is appropriate that the amount of the anodic oxidation film is 1.0 g/m$^2$ or more, still preferably from 2.0 to 6.0 g/m$^2$. In the case where the amount of the anodic oxidation film is less than 1.0 g/m$^2$, only insufficient printing tolerance is obtained or scuffs are frequently formed on the non-image part of the lithographic printing plate and thus so-called "scuff-soiling" (i.e., an ink adheres to scuffs during printing) frequently occurs.

Although the anodic oxidation treatment is carried out on the face to be used in the printing of the support of the lithographic printing plate, it is a common practice to form an anodic oxidation film of 0.01 to 3 g/m$^2$ on the opposite face too by the back turn of electric flux lines.

After the above-described anodic oxidation treatment, the surface of the support is subjected to hydrophilization by using a conventionally known method. The hydrophilization may be carried out by the method with the use of an alkali metal silicate (for example, an aqueous sodium silicate solution) as disclosed by U.S. Pat. No. 2,714,066, U.S. Pat. No. 3,181,461, U.S. Pat. No. 3,280,734 and U.S. Pat. No. 3,902,734. In this method, the support is soaked in an aqueous sodium silicate solution or electrolyzed. Alternatively, use may be made of the method of treating with potassium fluorozirconate as disclosed by JP-B-36-22063 or the method of treating with polyvinylphosphonic acid as disclosed by U.S. Pat. No. 3,276,868, U.S. Pat. No. 4,153,461 and U.S. Pat. No. 4,689,272.

Among these methods, it is particularly preferable in the invention to hydrophilize with the use of a silicate. Next, the silicate treatment will be illustrated.

The anodic oxidation film of the aluminum sheet having been treated as described above is soaked in an aqueous solution, which contains from 0.1 to 30% by mass (preferably from 0.5 to 10% by mass) of an alkali metal silicate and has a pH value of 10 to 13 at 25° C., at 15 to 80° C. for 0.5 to 120 sec. When the pH value of the aqueous alkali metal silicate solution is lower than 10, the solution would set to gel. When the pH value thereof is higher than 13.0, the anodic oxidation film is dissolved. As the alkali metal silicate to be employed in the invention, use may be made of sodium silicate, potassium silicate, lithium silicate and the like. Examples of a hydroxide to be used for elevating the pH value of the aqueous alkali metal silicate solution include sodium hydroxide, potassium hydroxide, lithium hydroxide and soon. The treatment solution as described above may further contain an alkaline earth metal salt or a group IVB metal salt. Examples of the alkaline earth metal salt include water-soluble salts, e.g., nitrates such as calcium nitrate, strontium nitrate, magnesium nitrate and barium nitrate, sulfates, hydrochlorides, phosphates, acetates, oxalates and borates. Examples of the group IVB metal salt include titanium tetrachloride, titanium trichloride, titanium potassium fluoride, titanium potassium oxalate, titanium sulfate, titanium tetraiodide, zirconium chloride oxide, zirconium dioxide, zirconium oxychloride, zirconium tetrachloride and so on. Either one of these alkaline earth metal salts and group IVB metal salts or a combination of two or more thereof may be used. Such a metal salt is used preferably in an amount of from 0.01 to 10% by mass, still preferably from 0.05 to 5.0% by mass.

By the silicate treatment, the hydrophilic nature of the aluminum sheet surface is further improved. As a result, an ink hardly adheres to the non-image part during printing and thus the stain-proof performance is improved.

(Backcoat Layer)

On the back face of the support, a backcoat is formed if necessary. As the backcoat, it is preferable to use coating layers made of an organic polymer compound described in JP-A-5-45885 or a metal oxide obtained by hydrolyzing and polycondensing an organic or inorganic metal compound described in JP-A-6-35174.

Among these coating layers, a coating layer made of metal oxide obtained from a silicon alkoxy compound such as Si(OCH$_3$)$_4$, Si(OC$_2$H$_5$)$_4$, SI(OC$_3$H$_7$)$_4$ or Si(OC$_4$H$_9$)$_4$ is particularly preferable, since such a material is easily available at a low cost and the coating layer is excellent in development tolerance.

(Intermediate Layer)

To improve adhesion between the recording layer and the substrate or stain resistance, the lithographic printing plate precursor according to the invention may have an intermediate layer. Particular examples of the intermediate layer include those described in JP-B-50-7481, JP-A-54-72104, JP-A-59-101651, JP-A-60-149491, JP-A-60-232998, JP-A-3-56177, JP-A-4-282637, JP-A-5-16558, JP-A-5-246171, JP-A-7-159983, JP-A-7-314937, JP-A-8-202025, JP-A-8-320551, JP-A-9-34104, JP-A-9-236911, JP-A-9-269593, JP-A-10-69092, JP-A-10-115931, JP-A-10-161317, JP-A-10-260536, JP-A-10-282682, JP-A-11-84674, Japanese Patent Application 8-225335, Japanese Patent Application 8-270098, Japanese Patent Application 9-195863, Japanese Patent Application 9-195864, Japanese Patent Application 9-89646, Japanese Patent Application 9-106068, Japanese Patent Application 9-183834, Japanese Patent Application 9-264311, Japanese Patent Application 9-127232, Japanese Patent Application 9-245419, Japanese Patent Application 10-127602, Japanese Patent Application 10-170202, Japanese Patent Application 11-36377, Japanese Patent Application 11-165861, Japanese Patent Application 11-284091, Japanese Patent Application 2000-14697 and so on.

(Protective Layer)

Because of being usually exposed in the atmosphere, it is preferable that the lithographic printing plate precursor according to the invention further has a protective layer on the above-described recording layer. The protective layer prevents the recording layer from the invasion of low-molecular weight compounds such as oxygen and basic substances which occur in the atmosphere and inhibit the image formation reaction proceeding in the photosensitive layer due to the exposure, thereby enables the exposure in the atmosphere. Accordingly, it is required that such a protective layer has a low permeability for the low-molecular weight compounds such as oxygen but a high permeability for light to be used in the exposure, is excellent in the adhesion to the recording layer and can be easily removed in the development step following the exposure. Concerning such a protective layer, devices have been made as reported in detail in U.S. Pat. No. 3,458,311 and JP-A-55-49729. As materials usable in the protective layer, it is favorable to employ, for example, water-soluble polymer compounds having relatively high crystallinity. More specifically speaking, there have been known water-soluble polymers such as polyvinyl alcohol, polyvinylpyrrolidone, acidic celluloses, gelatin, gum arabic and polyacrylic acid. Among these polymers, the most desirable results in fundamental properties (oxygen-blocking, removal in development, etc.) can be obtained by using polyvinyl alcohol as the main component. The polyvinyl alcohol to be used in the protective layer may be partly substituted by an ester, an ether or acetal, so long as it carries unsubstituted vinyl alcohol units for achieving the required oxygen-blocking properties and solubility in water. Similarly, it may partly have another comonomer. Particular examples of the polyvinyl alcohol include those which are hydrolyzed to an extent of 71 to 100% and have a molecular weight of from 300 to 2400. More specifically speaking, use can be made of PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613, L-8, etc. each manufactured by KURARAY.

The components (the type of PVA, use of additive(s)), coating dose, etc. of the protective layer are selected by taking the oxygen-blocking properties and development removal as well as fogging, adhesiveness and scuff resistance into consideration. In general, a higher hydrolysis ratio of the employed PVA (i.e., the higher content of the unsubstituted vinyl alcohol units in the protective layer) brings about the higher oxygen-blocking properties, which is advantageous from the viewpoint of sensitivity. When the oxygen-blocking properties are extremely elevated, however, there arise some problems such as the occurrence of an unnecessary polymerization during production or storage and unnecessary fogging or line thickening during exposure of the image. In addition, the adhesiveness to the image part and the scuff resistance are highly important factors in handling. That is to say, when a hydrophilic layer made of a water-soluble polymer is laminated upon a lipophilic recording layer, the insufficient adhesive force frequently causes film separation and the separated part induces troubles such as film hardening failure due to the inhibition of the polymerization by oxygen. To overcome this problem, various proposals have been made to improve the pressure-sensitive adhesion between these two layers. For example, U.S. Pat. No. 292,501 and U.S. Pat. No. 44,563 report that a sufficient pressure-sensitive adhesion can be achieved by mixing a hydrophilic polymer mainly comprising polyvinyl alcohol with 20 to 60% by mass of an acrylic emulsion, a water-insoluble vinylpyrrolidone/vinyl acetate copolymer, etc. and laminating on the polymerization layer.

Any of these publicly known techniques are applicable to the protective layer in the invention. Methods of coating the protective layer are described in, for example, U.S. Pat. No. 3,458,311 and JP-A-55-49729.

(Exposure, Development and Printing)

The lithographic printing plate precursor according to the invention is usable in infrared laser recording. Also, it is usable in heat recording with the use of an ultraviolet light lamp or a thermal head. It is preferable in the invention that the image exposure is performed by using a solid laser or a semiconductor laser radiating infrared rays of 760 nm to 1200 nm in wavelength are preferable.

After the completion of the infrared laser exposure, the lithographic printing plate precursor according to the invention is developed preferably with water or an alkaline aqueous solution.

In the case of using an alkaline aqueous solution as the developing solution, a publicly known aqueous alkali solution can be used as a developing solution and an auxiliary solution for the lithographic printing plate precursor according to the invention. Examples thereof include inorganic alkali salts such as sodium silicate, potassium silicate, sodium tertiary phosphate, potassium tertiary phosphate, ammonium tertiary phosphate, sodium secondary phosphate, potassium secondary phosphate, ammonium secondary phosphate, sodium carbonate, potassium carbonate, ammonium carbonate, sodium hydrogencarbonate, potassium hydrogencarbonate, ammonium hydrogencarbonate, sodium borate, potassium borate, ammonium borate, sodium hydroxide, ammonium hydroxide, potassium hydroxide and lithium hydroxide. Also, use can be made of organic alkali agents such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine and pyridine.

Either one of these alkali agents or a combination of two or more thereof may be used.

In the case of developing with the use of an automatic developing machine, it is known that a large amount of lithographic printing plate precursors can be processed over a long period of time without exchanging the developing solution in the development tank by adding the same solution as the development solution or an aqueous solution (an auxiliary solution) having a higher alkali strength than the developing solution to the developing solution. This auxiliary method is preferably usable in the invention too.

To accelerate or regulate the development characteristics, facilitate the dispersion of development residues and enhance the compatibility of the image part of the printing plate with an ink, various surfactants, organic solvents, etc. can be added to the developing solution and the auxiliary solution, if necessary. Preferable examples of the surfactants include anionic, cationic, nonionic and amphoteric surfactants. Preferable examples of the organic solvents include benzyl alcohol and the like. It is also preferable to add polyethylene glycol or its derivative, propylene glycol or its derivative, etc. Moreover, it is possible to add a nonreducing sugar such as arabit, sorbit or mannit.

Furthermore, an inorganic salt reducing agent such as hydroquinone, resorcin, sodium sulfite, sodium hydrogensulfite, potassium sulfite or potassium hydrogen sulfite, an organic carboxylic acid, a defoaming agent or a softener for hard water can be added to the developing solution and the auxiliary solution, if necessary.

After developed by using the above-described developing solution and auxiliary solution, the printing plate is post-treated with washing water, a rinsing solution containing a surfactant etc. and a grease desensitization solution containing gum arabic and a starch derivative. In the case of using the lithographic printing plate precursor according to the invention, the post-treatment can be carried out by combining these procedures.

In recent years, automatic developing machines for printing plates have been widely employed in the fields of plate making and printing to rationalize and standardize the plate making operations. Such an automatic developing machine, which usually consists of a developing part and a post-treatment part, has a unit transporting a printing plate material, tanks for respective treating solutions and a spraying unit. An exposed printing plate is horizontally transported while respective treating solutions are pumped and sprayed thereto from spray nozzles, thereby effecting the development. Recently, there is also known a process wherein a printing plate precursor is transported and treated in the state of being soaked in a treating solution tank filled up with a treating solution with the use of a submerged guide roll or the like. In such an automatic process, an auxiliary solution can be added to each treating solution depending on the treatment amount and the operation time. It is also possible to automatically replenish a treating solution by detecting the electrical conductivity with a sensor.

Moreover, use can be made of a so-called disposable treating process wherein the treatment is carried out by using a substantially unused treating solution.

The lithographic printing plate thus obtained is coated with a grease desensitization gum, if desired, and then subjected to the printing step. In the case where a lithographic printing plate having an enhanced printing tolerance is required, it is subjected to burning.

In the case of subjecting the lithographic printing plate to burning, it is preferable to treat the printing plate with a face-controlling solution described in JP-B-61-2518, JP-B-55-28062, JP-A-62-31859 and JP-A-61-169655 before burning.

The treatment may be carried out by, for example, putting the face-controlling solution on a sponge or an absorbent cotton and coating on the lithographic printing plate, soaking the printing plate in a vat filled up with the face-controlling solution for coating, or by using an automatic coater. Still preferable results can be obtained by uniforming the coating dose with a squeezer or a squeezer roller after the completion of the coating.

It is generally appropriate that the coating dose of the face-controlling solution ranges from 0.03 to 0.8 $g/^2$ (dry mass).

After drying if needed, the lithographic printing plate coated with the face-controlling solution is heated to a high temperature by using a burning processor (for example, Burning Processor:BP-100 manufactured by Fuji Photo Film). In this step, it is preferable that the heating is carried out at a temperature of from 180 to 300° C. for 1 to 20 minutes, though the conditions vary depending on the components constituting an image.

After the burning treatment, the lithographic printing plate is optionally subjected to the treatments commonly employed in the art, for example, washing with water and degumming. In the case of using a face-controlling agent containing a water-soluble polymer compound etc., so-called grease-desensitization treatments such as degumming can be omitted.

The lithographic printing plate thus obtained can be used in multisheet printing by using an offset printer etc.

[Polymerizable Composition]

The polymerizable composition according to the invention is characterized by containing: (A) a polyurethane compound soluble or swellable in water or an aqueous alkali solution which is obtained by reacting at least one diol compound having an unsaturated bond in the main chain and having a molecular weight of 500 or more with at least one polyisocyanate compound; (B) a radical initiator; and (C) a photothermal converting agent.

It is preferable to add a polymerizable compound (D), which induces and promotes a polymerization reaction using radicals emitted from the above-described radical initiator as an initiator, to the polymerizable composition according to the invention. Moreover, a binder polymer (E) may be added thereto if necessary so as to, for example, improve film properties.

The polymerizable composition is appropriately usable as the recording layer of the lithographic printing plate precursor as described above. Furthermore, it is usable for purposes over a wide range including three-dimensional photomolding, holography, image recording materials such as colorproofs, photoresists and color filters, inks, coatings, adhesives and so on.

Details and preferred embodiment of each of the above-described components (A) to (E) contained in the polymerizable composition according to the invention are the same as described above with respect to the lithographic printing plate precursor. A preferable addition level of each component varies from use to use. Thus, it can be arbitrarily designed. Such a polymerizable composition may be optionally mixed with other additives appropriate for use and employed.

EXAMPLES

Next, the invention will be illustrated in greater detail by reference to the following Examples. However, it is to be understood that the invention is not construed as being restricted thereto.

Synthesis Example 1

Specific Polyurethane Compound 1

In a 500 ml three-necked round bottom flask provided with a condenser and a stirrer, 6.9 g of 2,2-bis(hydroxymethyl) butanoic acid, 21.0 g of Poly bd R-15HT (manufactured by Idemitsu Petrochemical) and 5.4 g of tetraethylene glycol were dissolved in 100 ml of N,N-dimethylacetamide. After adding 21.0 g of 4,4-diphenylmthane diisocyanate, 3.5 g of 1,6-hexamethylene diisocyanate and 0.1 g of dibutyl tin dilaurate thereto, the obtained mixture was stirred under heating at 100° C. for 8 hours. Then it was diluted with 100 ml of N,N-dimetylformamide and 200 ml of methyl alcohol was added to treat excessive isocyanate.

The weight-average molecular weight (standard: polystyrene) of this product measured by gel permeation chromatography (GPC) was 80,000. Further, its carboxyl content (acid value) determined by titration was 1.00 meq/g.

Synthesis Examples 2 to 16

Specific Polyurethane Compounds 2 to 16

The procedure of the above Synthesis Example 1 was followed but starting with diisocyanate compounds and diol compounds listed in the following Table 1 to give specific polyurethane compounds 2 to 16 according to the invention.

The abbreviations for diisocyanate compounds and diol compounds given in Table 1 respectively have the following structures. PE-1, PE-5, BD-3 and BD-4 means the diol compounds cited above by way of example.

| Specific polyurethane compound | Diisocyanate compound employed (mol %) | Diol compound employed (mol %) | | Terminal structure | Weight-average molecular weight | Acid value (meq/g) |
|---|---|---|---|---|---|---|
| 1 | MDI HMDI (80 20) | BD-4 (Mw 1,000) (20) | DMPA TEG 52 28 | —OCH$_3$ | 80,000 | 1.00 |
| 2 | MDI (100) | BD-4 (Mw 1,000) (20) | DMPA TEG 52 28 | —OCH$_3$ | 95,000 | 0.9 |

-continued

| Specific polyurethane compound | Diisocyanate compound employed (mol %) | Diol compound employed (mol %) | Terminal structure | Weight-average molecular weight | Acid value (meq/g) |
|---|---|---|---|---|---|
| 3 | MDI HMDI (80 20) | BD-4 (Mw 2,000) DMPA TEG (10 50 30) |  | 55,000 | 0.95 |
| 4 | NDI (100) | BD-4 (Mw 10,000) DMPA (25 75) | —OCH₃ | 67,000 | 1.72 |
| 5 | MDI IPDI (80 20) | BD-4 (Mw 1,000) DMPA PPG (MW 1,000) (10 80 10) |  | 54,000 | 1.52 |
| 6 | HMDI (100) | BD-4 (Mw 1,000) DMPA TEG (25 50 25) | —OCH₃ | 82,000 | 1.00 |
| 7 | MDI HMDI (20 80) | BD-4 (Mw 1,000) DMPA TEG (20 50 30) | —OCH₃ | 79,000 | 0.95 |
| 8 | MDI HMDI (80 20) | BD-3 (Mw 1,000) DMPA TEG (20 52 28) | —OCH3 | 63,000 | 0.92 |
| 9 | MDI HMDI (80 20) | BD-4 (Mw 1,000) DMBA TEG (20 55 25) | —OCH₃ | 59,000 | 1.02 |
| 10 | MDI HMDI (80 20) | PPG (Mw 1,000) DMPA TEG (23 52 25) |  | 80,000 | 1.00 |
| 11 | MDI HMDI (80 20) | PE-1 (Mw 1,500) DMPA TEG (20 50 30) | —OCH₃ | 71,000 | 0.84 |
| 12 | MDI HMDI (70 30) | BD-4 (Mw 1,000) DMPA TEG (23 52 25) |  | 86,000 | 0.98 |
| 13 | MDI CDI (70 30) | BD-3 (Mw 1,000) DMPA TEG (20 55 25) | —OCH₃ | 64,000 | 1.12 |
| 14 | MDI HMDI (80 20) | PE-5 (Mw 1,500) DMBA TEG (20 65 15) | —OCH₃ | 49,000 | 0.96 |
| 15 | MDI HMDI (80 20) | BD-4 (Mw 1,000) DMPA (30 70) | —OCH₃ | 75,000 | 1.09 |
| 16 | MDI HMDI (80 20) | BD-4 (Mw 300) DMPA (40 60) | —OCH₃ | 82,000 | 1.21 |

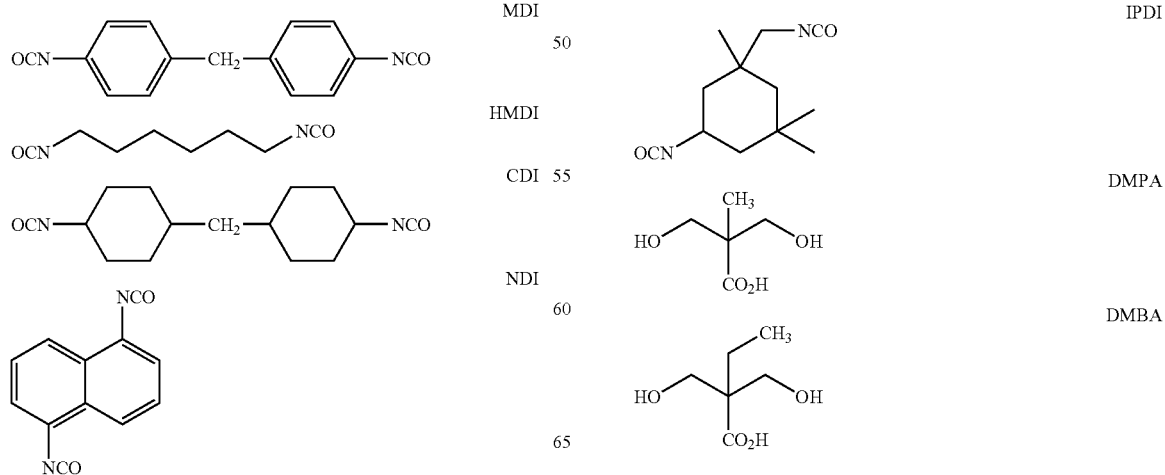

MDI

HMDI

CDI

NDI

-continued

IPDI

DMPA

DMBA

-continued

 TEG

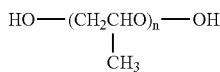 PPG (Construction of Support)

A JIS A1050 alloy melt containing 99.5% or more of aluminum together with 0.30% of Fe, 0.10% of Si, 0.02% of Ti and 0.013% of Cu was subjected to a cleaning treatment and then casted. The cleaning was carried out by degassing so as to eliminate unnecessary gases (hydrogen gas, etc.) in the melt and then treated with a ceramic tube filter. For the casting, the DC casting method was employed. The solidified ingot of 500 mm in plate thickness was faced to 10 mm from the surface and homogenized at 550° C. for 10 hours to prevent intermetal compounds from enlargement.

Next, it was hot-rolled at 400° C., annealed in a continuous annealing furnace at 500° C. for 60 seconds and then cold rolled to give an aluminum plate of 0.3 mm in thickness. To control the coarseness of the rolling mill, the center line average surface roughness Ra after cold milling was controlled to 0.2 μm. Next, it was treated with a tension leveler to improve planarity.

Next, a surface treatment was performed to give a lithographic support. To remove the rolling mill oil from the surface, the aluminum plate was degreased with a 10% aqueous solution of sodium aluminate at 50° C. for 30 seconds and neutralized with a 30% aqueous solution of sulfuric acid at 50° C. for 30 seconds followed by desmutting.

Then the support was subjected to surface roughening (i.e., so called sandblasting) to improve the adhesion between the support and the recording layer and impart water retention properties to a non-image part. An aqueous solution containing 1% of nitric acid and 0.5% of aluminum nitrate was maintained at 45° C. and, while pouring an aluminum web into the aqueous solution, the plate was roughened by electrolysis by using an indirect feeder cell at a current density of 20 A/dm$^2$ and a sinusoidal alternate current (duty ratio 1:1) at an anodic electricity of 240 C/dm$^2$. Next, it was etched with a 10% aqueous solution of sodium aluminate at 50° C. for 30 seconds and neutralized with a 30% aqueous solution of sulfuric acid at 50° C. for 30 seconds followed by desmutting.

To further improve abrasion resistance, chemical resistance and water retention, an oxidation film was formed on the support by anodic oxidation. Using a 20% aqueous solution of sulfuric acid at 35° C. as an electrolyte, the aluminum web was passed through the electrolyte and electrolyzed with direct current at 14 A/dm$^2$ from an indirect feeder cell, thereby giving an anodic oxidation film of 2.5 g/m$^2$.

Examples 1 to 6, Comparative Examples 1 and 2

(Formation of Recording Layer)

A coating solution for the recording layer of the following composition was prepared and coated to the aluminum support constructed above by using a wire bar. Then it was dried at 110° C. for 45 seconds by a hot air dryer. After drying, the coating dose was from 1.2 to 1.3 g/m$^2$.

Next, a coating solution for the overcoat layer of the following composition was coated by using a slide hopper and dried at 120° C. for 75 seconds by a hot air dryer. After drying, the coating dose of the overcoat layer was from 2.3 g/m$^2$.

<Coating Solution for Recording Layer 1>

| | |
|---|---|
| component (A): specific polyurethane compound (compound listed in Table 3) | 2.00 g |
| component (B): radical initiator "S-1" | 0.35 g |
| component (C): photothermal converting agent "IR-1" | 0.08 g |
| component (D): polymerizable compound (compound listed in Table 3) | 2.00 g |
| Victoria Blue naphthalenesulfonate | 0.04 g |
| fluorine-type surfactant (Megafac F-176, manufactured by Dainippon Ink and Chemicals Inc.) | 0.01 g |
| methyl ethyl ketone | 9.0 g |
| methanol | 10.0 g |
| 1-methoxy-2-propanol | 8.0 g |

<Coating Solution for Overcoat Layer>

| | |
|---|---|
| polyvinyl alcohol (degree of saponification 98.5% by mol, degree of polymerization 500) | 2.5 g |
| polyvinyl pyrrolidone (K30, manufactured by Tokyo Kasei Kogyo Co., Ltd., molecular weight 40,000) | 0.5 g |
| nonionic surfactant (EMAREX NP-10, manufactured by Nippon Emulsion) | 0.05 g |
| ion-exchange water | 96.95 g |

(Exposure)

The obtained negative lithographic printing plate precursors were each exposed by using a Trendsetter 3244VX (manufactured by Creo) equipped with a water-cooled 40W infrared semiconductor laser at an energy output of 9W, at outer drum rotation speed of 210 rpm, a plate energy of 100 mJ/cm$^2$ and at a resolution of 2400 dpi.

(Development)

After the exposure, the development treatment was carried out with the use of an automatic developing machine Stablon 900N (manufactured by Fuji Photo Film). As the developing solutions (both of feed solution and auxiliary solution), use was made of DV-2 (manufactured by Fuji Photo Film) diluted with water at 1:4. The temperature of the developing bath was 30° C. As the finisher, use was made of FN-6 (manufactured by Fuji Photo Film) diluted with water at 1:1 (pH=10.8).

[Evaluation of Printing Tolerance]

Using the lithographic printing plate thus obtained, printing was performed by a Printer R201 (manufactured by Rholand) using an ink GEOS-G (N) (manufactured by Dainippon Ink and Chemicals). Solid image parts of the prints were observed and the printing tolerance was evaluated based on the number of paper sheets having been printed before squeeze out of the ink. A larger number of paper sheets indicates the higher printing tolerance. Table 3 summarizes the results.

[Evaluation of Sensitivity]

Based on the line width, laser output and loss and scanning speed in an optical system of the image obtained by the above exposure (infrared lasers of 830 to 850 nm in wavelength) and development, energy amount required in recording was calculated. A smaller value indicates a higher sensitivity. Table 3 summarizes the results.

TABLE 3

| | Specific polyurethane compound | Polymerizable compound | Sensitivity (mJ/cm$^2$) | Printing tolerance (×10$^4$ sheets) |
|---|---|---|---|---|
| Ex. 1 | 1 | M-1 | 70 | 6.2 |
| Ex. 2 | 1 | M-2 | 60 | 7.2 |
| Ex. 3 | 1 | M-3 | 50 | 8.5 |
| Ex. 4 | 2 | M-2 | 60 | 9.1 |
| Ex. 5 | 5 | M-2 | 55 | 7.3 |
| Ex. 6 | 10 | M-3 | 50 | 7.5 |
| C. Ex. 1 | P-1 | M-1 | 100 | 3.2 |
| C. Ex. 2 | P-1 | M-2 | 100 | 2.7 |

According to the results shown in the above Table 3, it is understood that the lithographic printing plate precursors of Examples 1 to 6 with the use of the specific polyurethane compounds according to the invention are excellent in sensitivity and printing tolerance. In contrast, it is confirmed that the lithographic printing plate precursors of Comparative Examples 1 and 2 with the use of another polymer as the substitute for the specific polyurethane compound according to the invention are inferior in sensitivity and printing tolerance.

The (A) specific polyurethane compounds according to the invention (A) employed in the Examples are the specific urethane compounds synthesized in the above Synthesis Examples 1 to 16, while the polymers (P-1) to (P-3) other than the specific polyurethane compounds according to the invention employed in Comparative Examples have the following structures.

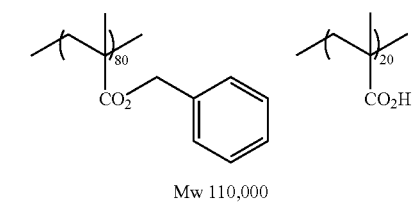

(P-1)

Mw 110,000

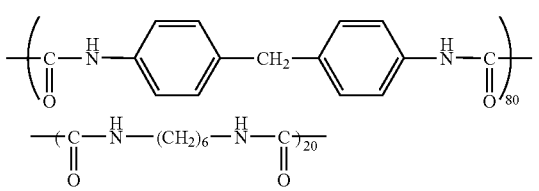

(P-2)

Mw 98,000

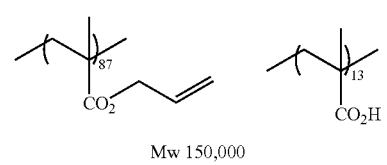

(P-3)

Mw 150,000

The structures of the (B) radical initiators according to the invention (S-1) to (S-6) employed in Examples are as follows.

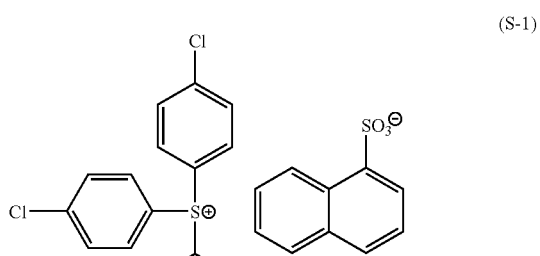

(S-1)

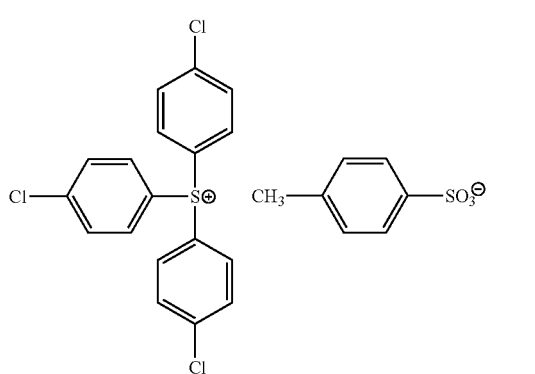

(S-2)

(S-3)

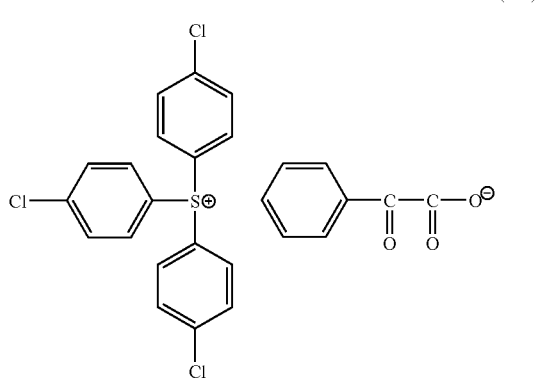

(S-4)

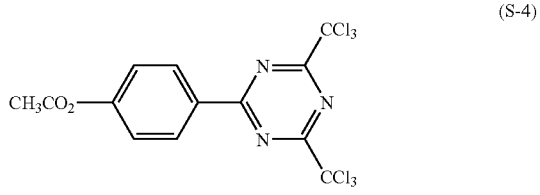

(S-5)

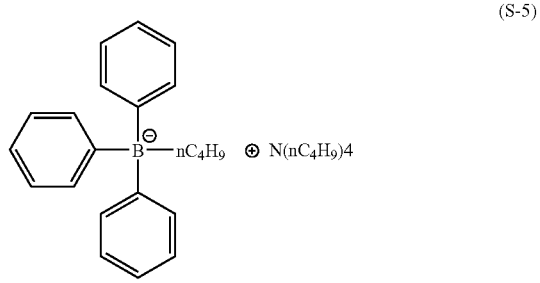

-continued

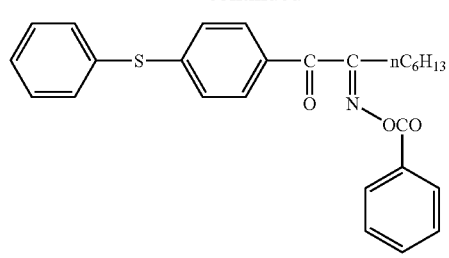
(S-6)

The structures of the (C) photothermal converting agents according to the invention (IR-1) to (IR-3) employed in Examples are as follows.

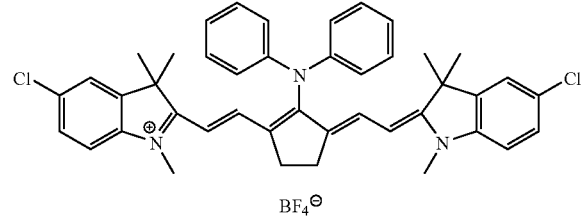
(IR-1)

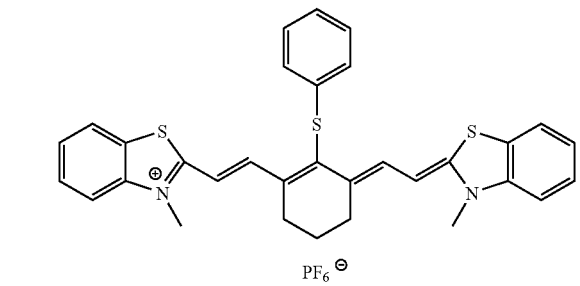
(IR-2)

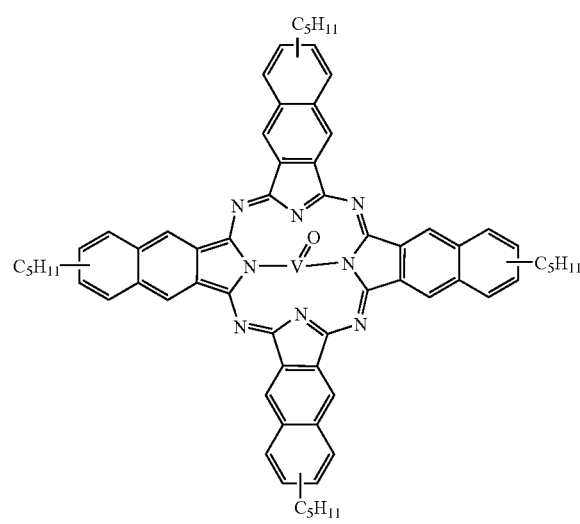
(IR-3)

The structures of the (D) polymerizable compounds according to the invention (M-1) to (M-3) employed in Examples are as follows.

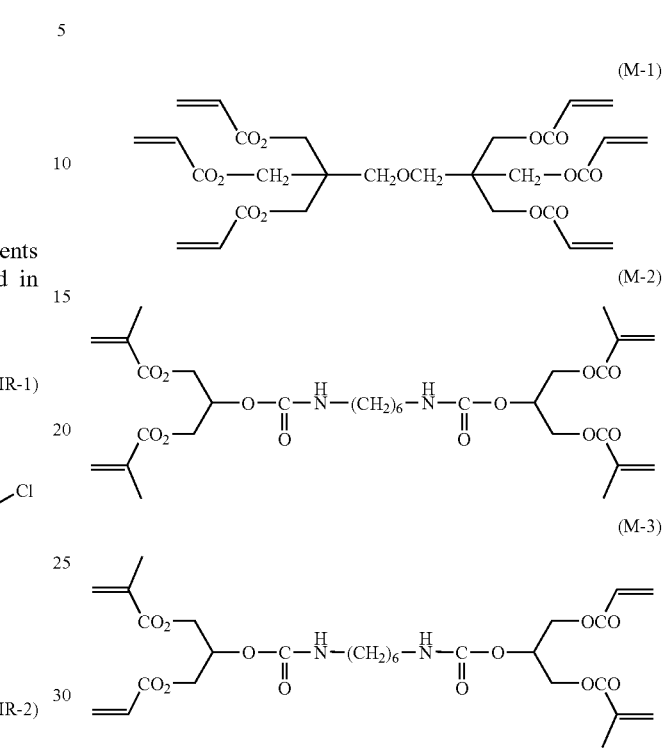
(M-1)

(M-2)

(M-3)

[Examples 7 to 13, Comparative Examples 3, 4]

(Formation of Undercoat Layer)

A coating solution for the undercoat layer of the following composition was coated to the same aluminum support as in Example 1 by using a wire bar. Then it was dried at 90° C. for 30 seconds by a hot air dryer. After drying, the coating dose was from 10 mg/m².

<Undercoat Solution>

| | |
|---|---|
| β-alanine | 0.1 g |
| phenylphosphonic acid | 0.1 g |
| methanol | 40 g |
| purified water | 60 g |

(Formation of Recording Layer)

A coating solution for the recording layer 2 of the following composition was prepared and coated to the aluminum support, which had been undercoated as described above, by using a wire bar. Then it was dried at 115° C. for 45 seconds by a hot air dryer to form a recording layer. After drying, the coating dose was from 1.2 to 1.3 g/m². Next, the same coating solution for the overcoat layer as in Example 1 was coated by using a slide hopper and dried at 120° C. for 75 seconds by a hot air dryer. After drying, the coating dose of the overcoat layer was from 2.3 g/m².

<Coating Solution for Recording Layer 2>

| | |
|---|---|
| component (A): specific polyurethane compound (compound listed in Table 4) | 2.10 g |
| component (B): radical initiator "S-2" | 0.35 g |
| component (C): photothermal converting agent "IR-1" | 0.08 g |
| component (D): polymerizable compound (compound listed in Table 4) | 1.90 g |
| Victoria Blue naphthalenesulfonate | 0.04 g |
| fluorine-type surfactant (Megafac F-176, manufactured by Dainippon Ink and Chemicals Inc.) | 0.01 g |
| methyl ethyl ketone | 9.0 g |
| methanol | 10.0 g |
| 1-methoxy-2-propanol | 8.0 g |

(Exposure and Development)

The obtained negative lithographic printing plate precursors were each exposed by using infrared lasers and developed as in Example 1 to give a lithographic printing plate.

[Evaluation of Printing Tolerance, Stain Resistance in Non-image Part and Storage Stability]

The photosensitive lithographic printing plates thus obtained were loaded on a printing press LITHRONE (manufactured by Komori Co.) and printing was carried out by using a black ink DIC-GEOS(N) (manufactured by Dainippon Ink and Chemicals). Then the number of paper sheets printed while sustaining a sufficient ink density were observed with the naked eye and thus the printing tolerance and the stain resistance in non-image parts were evaluated.

Further, the obtained lithographic printing plates were stored at 60° C. for 3 days, at 45° C. and a relative humidity (RH) of 75% for 3 days. After these forced time courses, printing was made in the same manner and the printing tolerance and the stain resistance in non-image parts were evaluated. Table 4 summarizes the results.

TABLE 4

| | Specific | | Printing tolerance/stain resistance in non-image part | | |
|---|---|---|---|---|---|
| | polyurethane compound | Polymerizable compound | No forced time course | 3 days at 60° C. | 3 days at 45° C., 75% RH |
| Ex. 7 | 1 | M-1 | $9.5 \times 10^4$ no stain | $9.5 \times 10^4$ no stain | $9.5 \times 10^4$ no stain |
| Ex. 8 | 1 | M-2 | $9.5 \times 10^4$ no stain | $9.5 \times 10^4$ no stain | $9.5 \times 10^4$ no stain |
| Ex. 9 | 1 | M-3 | $9.5 \times 10^4$ no stain | $9.5 \times 10^4$ no stain | $9.5 \times 10^4$ no stain |
| Ex. 10 | 6 | M-2 | $7.0 \times 10^4$ no stain | $7.0 \times 10^4$ no stain | $7.0 \times 10^4$ no stain |
| Ex. 11 | 7 | M-2 | $8.0 \times 10^4$ no stain | $8.0 \times 10^4$ no stain | $8.0 \times 10^4$ no stain |
| Ex. 12 | 11 | M-2 | $6.0 \times 10^4$ no stain | $6.0 \times 10^4$ no stain | $6.0 \times 10^4$ no stain |
| Ex. 13 | 14 | M-3 | $9.7 \times 10^4$ no stain | $9.7 \times 10^4$ no stain | $9.7 \times 10^4$ no stain |
| C. Ex. 3 | P-1 | M-2 | $4.0 \times 10^4$ no stain | $4.0 \times 10^4$ no stain | $3.5 \times 10^4$ no stain |
| C. Ex. 4 | P-2 | M-2 | $5.0 \times 10^4$ no stain | $5.0 \times 10^4$ no stain | $2.5 \times 10^4$ no stain |

According to the results shown in the above Table 4, it is understood that the lithographic printing plate precursors of Examples 7 to 13 with the use of the specific polyurethane compounds according to the invention are excellent in printing tolerance and stain resistance in non-image parts, as well as storage stability after forced time courses. In contrast, it is confirmed that the lithographic printing plate precursors of Comparative Examples 3 and 4 with the use of other polymers as the substitute for the specific polyurethane compound according to the invention are inferior insensitivity, printing tolerance and storage stability.

Examples 14 to 22, Comparative Examples 5 and 6

On the same support as in Example 1, an undercoat layer made of a liquid composition (a sol solution) of the SG method prepared by the following manner was formed.

<Sol Solution Composition>

| | |
|---|---|
| methanol | 130 g |
| water | 20 g |
| 85% by mass phosphoric acid | 16 g |
| tetraethoxysilane | 50 g |
| 3-methacryloxypropyltrimethoxysilane | 60 g |

The above sol solution composition was mixed by stirring. After about 5 minutes, heat generation was observed. After reacting for 60 minutes, the reaction mixture was transferred into another container and 3000 g of methanol was added to give a sol solution.

This sol solution was diluted with methanol/ethylene glycol (9/1 by mass) and coated to the same support as in Example 1 to give a coating dose (in terms of Si) of 30 mg/m² on the support. After drying at 100° C. for 1 minute, an undercoat layer was formed.

(Formation of Recording Layer)

A coating solution for the recording layer 3 of the following composition was prepared and coated to the aluminum support, which had been undercoated as described above, by using a wire bar. Then it was dried at 115° C. for 45 seconds by a hot air dryer to form a recording layer. After drying, the coating dose was from 1.2 to 1.3 g/m². Next, the same coating solution for the overcoat layer as in Example 1 was coated by using a slide hopper and dried at 120° C. for 75 seconds by a hot air dryer. After drying, the coating dose of the overcoat layer was from 2.3 g/m².

<Coating Solution for Recording Layer 3>

| | |
|---|---|
| component (A): specific polyurethane compound (compound listed in Table 5) | 2.00 g |
| component (B): radical initiator (compound listed in Table 5) | 0.35 g |
| component (C): photothermal converting agent (compound listed in Table 5) | 0.08 g |
| component (D): polymerizable compound "M-1" | 2.00 g |
| Victoria Blue naphthalenesulfonate | 0.04 g |
| fluorine-type surfactant (Megafac F-176, manufactured by Dainippon Ink and Chemicals Inc.) | 0.01 g |
| methyl ethyl ketone | 9.0 g |
| methanol | 10.0 g |
| 1-methoxy-2-propanol | 8.0 g |

(Exposure and Development)

The obtained negative lithographic printing plate precursors were each exposed by using infrared lasers and developed as in Example 1 to give a lithographic printing plate.

[Evaluation of Sensitivity, Printing Tolerance, Stain Resistance in Non-image Part and Storage Stability]

The photosensitive lithographic printing plates thus obtained were subjected to the evaluation of sensitivity as in Example 1.

Moreover, the photosensitive lithographic printing plates thus obtained were subjected to the evaluation of printing tolerance and stain resistance in non-image parts (storage stability) as in Example 7. Table 5 summarizes the results.

using a slide hopper and dried at 120° C. for 75 seconds by a hot air dryer. After drying, the coating dose of the overcoat layer was from 2.3 g/m². <Coating Solution for Recording Layer 4>

TABLE 5

|  | Specific polyurethane compound | Polymerizable compound | Radical initiator | Sensitivity (mJ/cm²) | No forced time course | 3 days at 60° C. | 3 days at 45° C., 75% RH |
|---|---|---|---|---|---|---|---|
| Ex. 14 | 1 | S-2 | IR-1 | 40 | $10.0 \times 10^4$ no stain | $10.0 \times 10^4$ no stain | $10.0 \times 10^4$ no stain |
| Ex. 15 | 1 | S-4 | IR-1 | 40 | $8.0 \times 10^4$ no stain | $8.0 \times 10^4$ no stain | $8.0 \times 10^4$ no stain |
| Ex. 16 | 1 | S-4 | IR-2 | 40 | $8.5 \times 10^4$ no stain | $8.5 \times 10^4$ no stain | $8.5 \times 10^4$ no stain |
| Ex. 17 | 1 | S-5 | IR-3 | 45 | $8.5 \times 10^4$ no stain | $8.5 \times 10^4$ no stain | $8.5 \times 10^4$ no stain |
| Ex. 18 | 1 | S-6 | IR-1 | 40 | $8.0 \times 10^4$ no stain | $8.0 \times 10^4$ no stain | $8.0 \times 10^4$ no stain |
| Ex. 19 | 10 | S-2 | IR-1 | 38 | $12.0 \times 10^4$ no stain | $12.0 \times 10^4$ no stain | $12.0 \times 10^4$ no stain |
| Ex. 20 | 12 | S-2 | IR-1 | 38 | $10.0 \times 10^4$ no stain | $10.0 \times 10^4$ no stain | $10.0 \times 10^4$ no stain |
| Ex. 21 | 15 | S-2 | IR-1 | 40 | $11.0 \times 10^4$ no stain | $10.0 \times 10^4$ no stain | $11.0 \times 10^4$ no stain |
| Ex. 22 | 16 | S-2 | IR-1 | 45 | $8.0 \times 10^4$ no stain | $8.0 \times 10^4$ no stain | $8.0 \times 10^4$ no stain |
| C. Ex. 5 | P-2 | S-4 | IR-1 | 50 | $6.0 \times 10^4$ no stain | $6.0 \times 10^4$ no stain | $3.5 \times 10^4$ no stain |
| C. Ex. 6 | P-2 | S-4 | IR-2 | 55 | $3.0 \times 10^4$ no stain | $3.0 \times 10^4$ no stain | $3.0 \times 10^4$ no stain |

According to the results shown in the above Table 5, it is understood that the lithographic printing plate precursors of Examples 14 to 21 with the use of the specific polyurethane compounds according to the invention are excellent in sensitivity, printing tolerance and stain resistance in non-image parts, as well as storage stability after forced time courses. In contrast, it is confirmed that the lithographic printing plate precursors of Comparative Examples 5 and 6 with the use of other polymers as the substitute for the specific polyurethane compound according to the invention are inferior in sensitivity, printing tolerance and storage stability.

Examples 23 to 26, Comparative Example 7

The same aluminum support as in Example 1 was treated with silicate to ensure hydrophilic nature in non-image parts of the printing plate. The treatment was carried out by passing an aluminum web through a 1.5% aqueous solution of No. 3 sodium silicate maintained at 70° C. while controlling the contact time to 15 seconds, followed by washing with water. The coating dose of Si was 10 mg/m². The center line surface roughness (Ra) of the support thus constructed was 0.25 μm.

(Formation of Recording Layer)

A coating solution for the recording layer 4 of the following composition was prepared and coated to the aluminum support, which had been undercoated as described above, by using a wire bar. Then it was dried at 115° C. for 45 seconds by a hot air dryer to form a recording layer. After drying, the coating dose was from 1.2 to 1.3 g/m². Next, the same coating solution for the overcoat layer as in Example 1 was coated by

| | |
|---|---|
| component (A): specific polyurethane compound (compound listed in Table 6) | 2.10 g |
| component (B): radical initiator "S-1" | 0.40 g |
| component (C): photothermal converting agent "IR-1" | 0.06 g |
| component (D): polymerizable compound "M-2" | 1.80 g |
| sensitization aid "Z-1" | 0.08 g |
| Victoria Blue naphthalenesulfonate | 0.04 g |
| fluorine-type surfactant (Megafac F-176, manufactured by Dainippon Ink and Chemicals Inc.) | 0.01 g |
| methyl ethyl ketone | 9.0 g |
| methanol | 10.0 g |
| 1-methoxy-2-propanol | 8.0 g |

(Exposure and Development)

The obtained negative lithographic printing plate precursors were each exposed by using infrared lasers and developed as in Example 1 to give a lithographic printing plate.

[Evaluation of Printing Tolerance and Sensitivity]

The photosensitive lithographic printing plates thus obtained were subjected to the evaluation of printing tolerance and sensitivity as in Example 1. Table 6 summarizes the results.

TABLE 6

| | Specific polyurethane compound | Sensitivity (mJ/cm²) | Printing tolerance (×10⁴ sheets) |
|---|---|---|---|
| Ex. 23 | 1 | 70 | 8.5 |
| Ex. 24 | 8 | 65 | 8.3 |
| Ex. 25 | 10 | 55 | 8.5 |
| Ex. 26 | 15 | 60 | 8.2 |
| C. Ex. 7 | P-3 | 110 | 4.2 |

According to the results shown in the above Table 6, it is understood that the lithographic printing plate precursors of Examples 23 to 26 with the use of the specific polyurethane compounds according to the invention are excellent in sensitivity and printing tolerance. In contrast, it is confirmed that the lithographic printing plate precursor of Comparative Example 7 with the use of another polymer as the substitute for the specific polyurethane compound according to the invention are inferior in sensitivity and printing tolerance.

According to the invention, it is possible to obtain a lithographic printing plate precursor which is excellent in sensitivity, storage stability, printing tolerance and development properties, and a polymerizable composition which is useful in image recording materials and so on.

Next, the another embodiment of the invention will be illustrated in greater detail by reference to the following Examples. However, it is to be understood that the invention is not construed as being restricted thereto. In the following Examples, the polymerizable composition according to the invention was applied to the recording layer of a lithographic printing plate precursor and the lithographic printing plate precursor was subjected to the evaluation. Then the evaluation results were referred to as the evaluation results of the polymerizable composition according to the invention.

Synthesis Example

Synthesis of Specific Polyurethane Resin 2-1

11.4 g of 2,2-bis(hydroxymethyl)propionic acid and 15.0 g of polypropylene glycol (weight-average molecular weight 1,000) were dissolved in 65 mL of N,N-dimethylacetamide. After adding 3.5 g of hexamethylene diisocyanate, 21.0 g of 4,4'-methylenebis (phenylisocyanate) and 8 mg of dibutyl tin dilaurate thereto, the obtained mixture was heated to 90° C. and reacted for 8 hours. Then it was cooled to room temperature and diluted by adding 150 mL of methyl ethyl ketone. Subsequently, 5.0 g of glycidyl methacrylate, 0.01 g of p-methoxyphenol and 1.12 g of tetrabutylammonium bromide were added and the mixture was heated to 80° C. and reacted for 10 hours to give a reaction product.

The weight-average molecular weight (standard: polystyrene) of this product measured by gel permeation chromatography (GPC) was 80,000. Further, it was confirmed by $^1$H-NMR and $^{13}$C-NMR that this reaction product was specific polyurethane resin 2-1 as listed in the following Table 2-2.

The procedure of the above Synthesis Example was followed to give specific polyurethane compound Nos.2-2 to 2-21 having the compositions (% by mol) as listed in the following Tables 2-2 to 2-4. In the specific polyurethane compound Nos.2-2 to 2-21 listed in the following Tables 2-2 to 2-4, an isocyanate compound and a diol compound were employed at a composition ratio of 1:1, each 100% by mol.

TABLE 2

| Resin no. | Composition ratio (mol %) | Weight-average molecular weight |

TABLE 2-continued
| Resin no. | Composition ratio (mol %) | | Weight-average molecular weight |
|---|---|---|---|
| 2-3 | 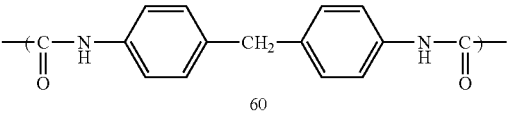 60 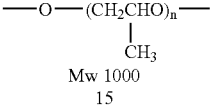 15 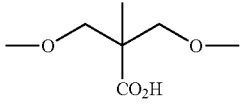 45 | 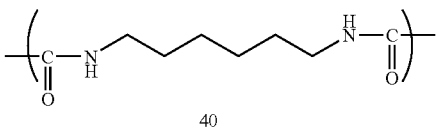 40 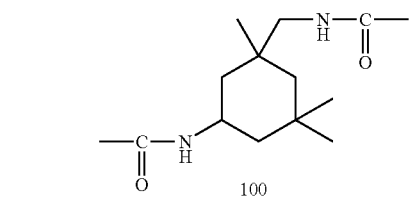 50 | 78,000 |
| 2-4 |  100 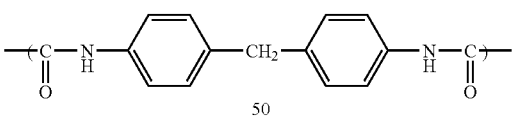 60 | 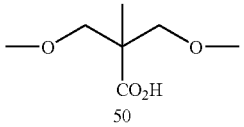 50 | 52,000 |
| 2-5 | 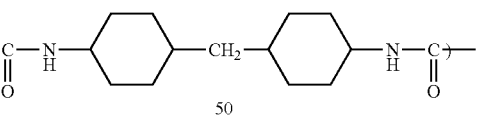 50 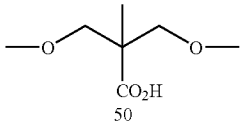 20 | 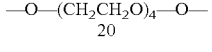 50 | 102,000 |

TABLE 2-continued
| Resin no. | Composition ratio (mol %) | Weight-average molecular weight |
|---|---|---|
| 2-6 | 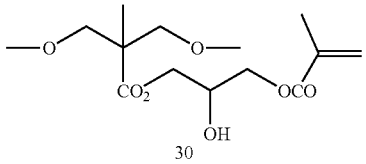 | 72,000 |
| 2-7 | 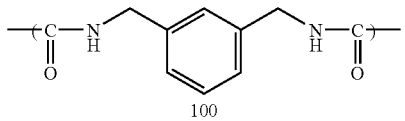 | 110,000 |

TABLE 2-3

| Resin no. | Composition ratio (mol %) | | |
|---|---|---|---|
| 2-8 | [structure: —C(=O)—NH—C₆H₄—CH₂—C₆H₄—NH—C(=O)—] 80 | [structure: —C(=O)—NH—(CH₂)₆—NH—C(=O)—] 20 | —O—(CH₂CH₂O)ₐ—(CH₂CHO)ᵦ—(CH₂CH₂O)ᶜ— <br> │CH₃ <br> Mw 1500, 15 |
| 2-9 | [structure: —C(=O)—NH—C₆H₄—CH₂—C₆H₄—NH—C(=O)—] 100 | | —O—(CH₂CHO)ₙ— <br> │CH₃ <br> Mw 1000, 10 |
| 2-10 | [structure: —C(=O)—NH—C₆H₄—CH₂—C₆H₄—NH—C(=O)—] 80 | [structure: —C(=O)—NH—(CH₂)₈—NH—C(=O)—] 20 | —O—(CH₂CHO)ₙ— <br> │CH₃ <br> Mw 1000, 15 |
| 2-11 | [structure: —C(=O)—NH—C₆H₁₀—CH₂—C₆H₁₀—NH—C(=O)—] 100 | | —(CH₂CH₂O)₄—O— 20 |
| 2-12 | [structure: —C(=O)—NH—C₆H₄—CH₂—C₆H₄—NH—C(=O)—] 50 | [structure: —C(=O)—NH—C₆H₁₀—CH₂—C₆H₁₀—NH—C(=O)—] 50 | —O—(CH₂)₂—[O—C(=O)—(CH₂)₅]ₙ—O— <br> Mw 1500, 10 |
| 2-13 | [structure: m-xylylene bis-amide] 100 | | |

TABLE 2-3-continued
| 2-14 | 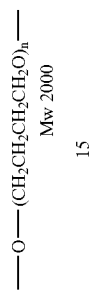 | 100 | —O—(CH₂CH₂CH₂CH₂O)ₙ— Mw 2000 | 15 |
| Resin no. | Composition ratio (mol %) | | | Weight-average molecular weight |
|---|---|---|---|---|
| 2-8 | 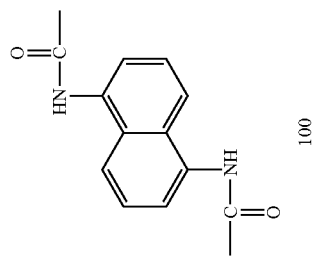 | | | 76,000 |
| 2-9 | | | | 112,000 |
| 2-10 | | | | 80,000 |

TABLE 2-3-continued

| | | | |
|---|---|---|---|
| 2-11 | (structure) 40 | (structure) 60 | 69,000 |
| 2-12 | (structure) 50 | (structure) 30 | 86,000 |
| 2-13 | (structure) 45 | (structure) 45 | 70,000 |
| 2-14 | (structure) 45 | (structure) 40 | 96,000 |

TABLE 2-4

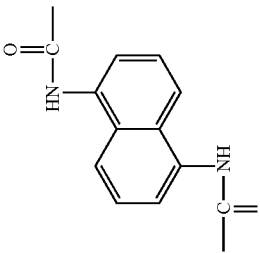

TABLE 2-4-continued

| | | |
|---|---|---|
| 2-18 | [structure with CO₂H 40, ethyl, methoxymethyl groups] — [cyclohexane with CO₂ ester, OH, 60, CH₂-OCO-isopropenyl] | 45,000 |
| 2-19 | [structure with CO₂H 40, methyl, methoxymethyl groups] — [cyclohexane with CO₂ ester, OH, 30, CH₂-OCO-isopropenyl] | 69,000 |
| 2-20 | [structure with CO₂H 45, methyl, methoxymethyl groups] — [cyclohexane with CO₂ ester, OH, 45, CH₂-OCO-isopropenyl] | 50,000 |
| 2-21 | [structure with CO₂H 45, ethyl, methoxymethyl groups] — [cyclohexane with CO₂ ester, OH, 45, CH₂-OCO-allyl] | 89,000 |

Examples 2-1 to 2-6, Comparative Examples 2-1 and 2-2

(Construction of Support)

A JIS A1050 alloy melt containing 99.5% or more of aluminum together with 0.30% of Fe, 0.10% of Si, 0.02% of Ti and 0.013% of Cu was subjected to a cleaning treatment and then casted. The cleaning was carried out by degassing so as to eliminate unnecessary gases (hydrogen gas, etc.) in the melt and then treated with a ceramic tube filter. For the casting, the DC casting method was employed. The solidified ingot of 500 mm in plate thickness was faced to 10 mm from the surface and homogenized at 550° C. for 10 hours to prevent intermetal compounds from enlargement.

Next, it was hot-rolled at 400° C., annealed in a continuous annealing furnace at 500° C. for 60 seconds and then cold rolled to give an aluminum plate of 0.3 mm in thickness. To control the coarseness of the rolling mill, the center line average surface roughness Ra after cold milling was controlled to 0.2 μm. Next, it was treated with a tension leveler to improve planarity.

Next, a surface treatment was performed to give a lithographic support.

To remove the rolling mill oil from the surface, the aluminum plate was degreased with a 10% aqueous solution of sodium aluminate at 50° C. for 30 seconds and neutralized with a 30% aqueous solution of sulfuric acid at 50° C. for 30 seconds followed by desmutting.

Then the support was subjected to surface roughening (i.e., so called sandblasting) to improve the adhesion between the support and the recording layer and impart water retention properties to a non-image part. An aqueous solution containing 1% of nitric acid and 0.5% of aluminum nitrate was maintained at 45° C. and, while pouring an aluminum web into the aqueous solution, the plate was roughened by electrolysis by using an indirect feeder cell at a current density of 20 A/dm² and a sinusoidal alternate current (duty ratio 1:1) at an anodic electricity of 240 C/dm². Next, it was etched with a 10% aqueous solution of sodium aluminate at 50° C. for 30 seconds and neutralized with a 30% aqueous solution of sulfuric acid at 50° C. for 30 seconds followed by desmutting.

To further improve abrasion resistance, chemical resistance and water retention, an oxidation film was formed on the support by anodic oxidation. Using a 20% aqueous solution of sulfuric acid at 35° C. as an electrolyte, the aluminum web was passed through the electrolyte and electrolyzed with direct current at 14 A/dm² from an indirect feeder cell, thereby giving an anodic oxidation film of 2.5 g/m².

(Formation of Recording Layer)

A coating solution for the recording layer of the following composition was prepared and coated to the aluminum support constructed above by using a wire bar. Then it was dried at 115° C. for 45 seconds by a hot air dryer. After drying, the coating dose was from 1.2 to 1.3 g/m². Next, a coating solution for the overcoat layer of the following composition was coated by using a slide hopper and dried at 120° C. for 75 seconds by a hot air dryer. After drying, the coating dose of the overcoat layer was from 2.3 g/m².

<Coating Solution for Recording Layer 2-1>

| | |
|---|---|
| component (A'): specific polyurethane compound (compound listed in Table 5) | 2.00 g |
| component (B): radical initiator "S-1" | 0.35 g |
| component (D): polymerizable compound (compound listed in Table 5) | 2.00 g |
| component (C): infrared absorbing agent "IR-1" with the following structure | 0.08 g |
| Victoria Blue naphthalenesulfonate | 0.04 g |
| fluorine-type surfactant (Megafac F-176, manufactured by Dainippon Ink and Chemicals Inc.) | 0.01 g |
| methyl ethyl ketone | 9.0 g |
| methanol | 10.0 g |
| 1-methoxy-2-propanol | 8.0 g |

<Coating Solution for Overcoat Layer>

| | |
|---|---|
| polyvinyl alcohol (degree of saponification 98.5% by mol, degree of polymerization 500) | 2.5 g |
| polyvinyl pyrrolidone (K30, manufactured by Tokyo Kasei Kogyo Co., Ltd., molecular weight 40,000) | 0.5 g |
| nonionic surfactant (EMAREX NP-10, manufactured by Nippon Emulsion) | 0.05 g |
| ion-exchange water | 96.95 g |

The polyurethane resins employed in Examples are the polyurethane resins listed in the above Tables 2-2 to 2-4. The resin (P-1) corresponding to the component (A') in Comparative Examples has the following structure.

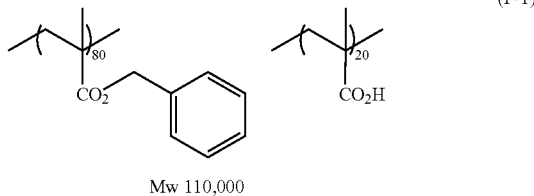

Mw 110,000

The radical initiator (S-1) employed in Examples and Comparative Examples has the following structure.

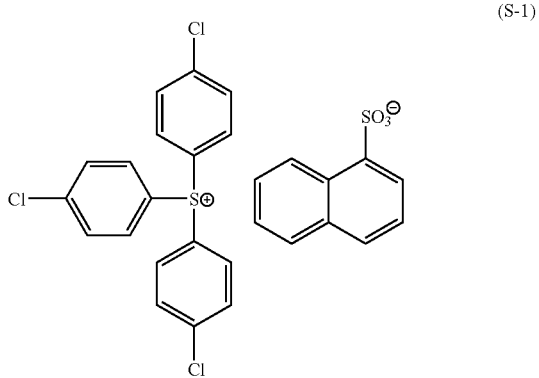

The infrared absorbing agent (IR-1) employed in Examples and Comparative Examples has the following structure.

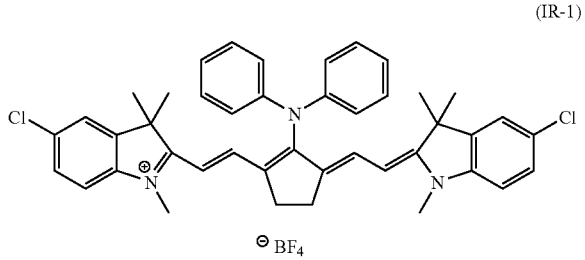
(IR-1)

The radical polymerizable compounds (M-1) to (M-3) employed in Examples and Comparative Examples have the following structures.

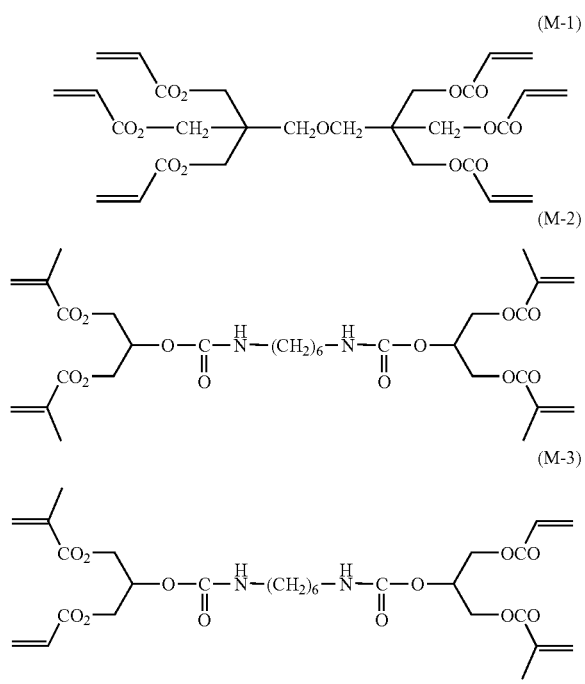

(Exposure)

The obtained negative lithographic printing plate precursors were each exposed by using a Trendsetter 3244VX (manufactured by Creo) equipped with a water-cooled 40W infrared semiconductor laser at an energy output of 9W, at outer drum rotation speed of 210 rpm, a plate energy of 100 mJ/cm$^2$ and at a resolution of 2400 dpi.

(Development)

After the exposure, the development treatment was carried out with the use of an automatic developing machine Stablon 900N (manufactured by Fuji Photo Film). As the developing solutions (both of feed solution and auxiliary solution), use was made of DV-2 (manufactured by Fuji Photo Film) diluted with water at 1:4. The temperature of the developing bath was 30° C. As the finisher, use was made of FN-6 (manufactured by Fuji Photo Film) diluted with water at 1:1 (pH=10.8).

[Evaluation of Printing Tolerance]

Using the lithographic printing plate thus obtained, printing was performed by a Printer R201 (manufactured by Rholand) using an ink GEOS-G (N) (manufactured by Dainippon Ink and Chemicals). Solid image parts of the prints were observed and the printing tolerance was evaluated based on the number of paper sheets having been printed before squeeze out of the ink. A larger number of paper sheets indicates the higher printing tolerance. Table 3 summarizes the results.

[Evaluation of Sensitivity]

Based on the line width, laser output and loss and scanning speed in an optical system of the image obtained by the above exposure (infrared lasers of about 830 to 850 nm in wavelength) and development, energy amount required in recording was calculated. A smaller value indicates a higher sensitivity. Table 2-5 summarizes the results.

TABLE 2-5

| | Component (A') | Component (D) | Sensitivity (mJ/cm$^2$) | Printing tolerance ($\times 10^4$ sheets) |
|---|---|---|---|---|
| Ex. 2-1 | 2-1 | M-1 | 70 | 6.2 |
| Ex. 2-2 | 2-1 | M-2 | 60 | 7.2 |
| Ex. 2-3 | 2-1 | M-3 | 50 | 8.5 |
| Ex. 2-4 | 2-2 | M-2 | 60 | 9.1 |
| Ex. 2-5 | 2-5 | M-2 | 55 | 7.3 |
| Ex. 2-6 | 2-3 | M-3 | 50 | 7.5 |
| C. Ex. 2-1 | P-1 | M-1 | 100 | 3.2 |
| C. Ex. 2-2 | P-1 | M-2 | 100 | 2.7 |

As Table 2-5 clearly shows, the lithographic printing plate precursors of Examples 2-1 to 2-6 with the use of the polymerizable compositions containing the specific polyurethane resins according to the invention are superior in sensitivity and printing tolerance to the lithographic printing plate precursors of Comparative Examples 2-1 and 2-2 free from the specific polyurethane resin.

Examples 2-7 to 2-13 and Comparative Examples 2-3 and 2-4

(Formation of Undercoat Layer)

A coating solution for the undercoat layer of the following composition was coated to the same aluminum support as in Example 2-1 by using a wire bar. Then it was dried at 90° C. for 30 seconds by a hot air dryer. After drying, the coating dose was from 10 mg/m$^2$.

<Undercoat Solution>

| | |
|---|---|
| β-alanine | 0.1 g |
| phenylphosphonic acid | 0.1 g |
| methanol | 40 g |
| purified water | 60 g |

(Formation of Recording Layer)

Next, a coating solution for the recording layer 2-2 of the following composition was prepared and coated to the aluminum support, which had been undercoated as described above, by using a wire bar. Then it was dried at 115° C. for 45 seconds by a hot air dryer to form a recording layer. After drying, the coating dose was from 1.2 to 1.3 g/m². Next, the same coating solution for the overcoat layer as in Example 2-1 was coated by using a slide hopper and dried at 120° C. for 75 seconds by a hot air dryer. After drying, the coating dose of the overcoat layer was from 2.3 g/m².

<Coating Solution for Recording Layer 2-2>

| | |
|---|---:|
| component (A'): specific polyurethane compound (compound listed in Table 2-6) | 2.10 g |
| component (B): radical initiator "S-2" | 0.35 g |
| component (D): polymerizable compound (compound listed in Table 2-6) | 1.90 g |
| component (C): infrared absorbing agent IR-1" | 0.08 g |
| Victoria Blue naphthalenesulfonate | 0.04 g |
| fluorine-type surfactant (Megafac F-176, manufactured by Dainippon Ink and Chemicals Inc.) | 0.01 g |
| methyl ethyl ketone | 9.0 g |
| methanol | 10.0 g |
| 1-methoxy-2-propanol | 8.0 g |

The resin (P-2) corresponding to the component (A') employed in Comparative Examples has the following structure.

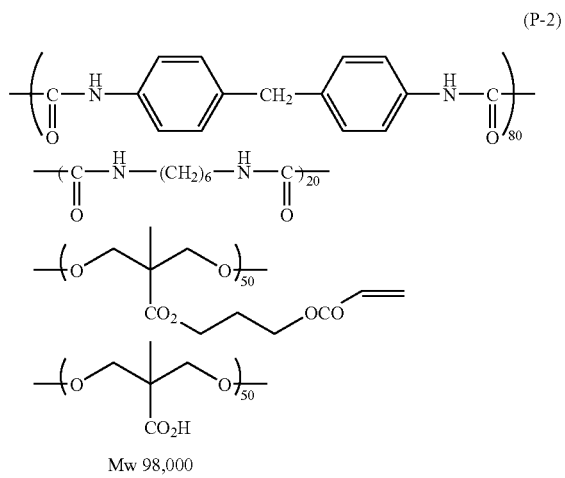

Mw 98,000

The radical initiator (S-2) employed in Examples and Comparative Examples has the following structure.

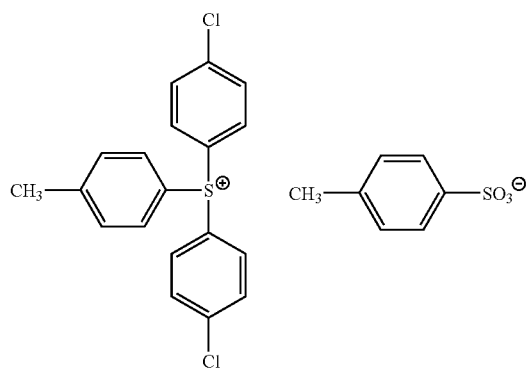

(Exposure and Development)

The obtained negative lithographic printing plate precursors were each exposed by using infrared lasers and developed as in Example 2-1 to give a lithographic printing plate.

[Evaluation of Printing Tolerance, Stain Resistance in Nonimage Part and Storage Stability]

The photosensitive lithographic printing plates thus obtained were loaded on a printing press LITHRONE (manufactured by Komori Co.) and printing was carried out by using a black ink DIC-GEOS(N) (manufactured by Dainippon Ink and Chemicals). Then the number of paper sheets printed while sustaining a sufficient ink density were observed with the naked eye and thus the printing tolerance and the stain resistance in non-image parts were evaluated.

Further, the obtained lithographic printing plates were stored at 60° C. for 3 days, at 45° C. and a relative humidity (RH) of 75% for 3 days. After these forced time courses, printing was made in the same manner and the printing tolerance and the stain resistance in non-image parts were evaluated. Table 2-6 summarizes the results.

TABLE 2-6

| | Specific poly-urethane compound | Polymerizable compound | Printing tolerance/stain resistance in non-image part | | |
|---|---|---|---|---|---|
| | | | No forced time course | 3 days at 60° C. | 3 days at 45° C., 75% RH |
| Ex. 2-7 | 2-1 | M-1 | $9.5 \times 10^4$ no stain | $9.5 \times 10^4$ no stain | $9.5 \times 10^4$ no stain |
| Ex. 2-8 | 2-1 | M-2 | $9.5 \times 10^4$ no stain | $9.5 \times 10^4$ no stain | $9.5 \times 10^4$ no stain |
| Ex. 2-9 | 2-1 | M-3 | $9.5 \times 10^4$ no stain | $9.5 \times 10^4$ no stain | $9.5 \times 10^4$ no stain |
| Ex. 2-10 | 2-7 | M-2 | $10.5 \times 10^4$ no stain | $10.5 \times 10^4$ no stain | $10.5 \times 10^4$ no stain |
| Ex. 2-11 | 2-9 | M-2 | $10.6 \times 10^4$ no stain | $10.6 \times 10^4$ no stain | $10.6 \times 10^4$ no stain |
| Ex. 2-12 | 2-11 | M-2 | $6.0 \times 10^4$ no stain | $6.0 \times 10^4$ no stain | $6.0 \times 10^4$ no stain |
| Ex. 2-13 | 2-14 | M-3 | $9.7 \times 10^4$ no stain | $9.7 \times 10^4$ no stain | $9.7 \times 10^4$ no stain |
| C. Ex. 2-3 | P-1 | M-2 | $4.0 \times 10^4$ no stain | $4.0 \times 10^4$ no stain | $3.5 \times 10^4$ no stain |
| C. Ex. 2-4 | P-2 | M-2 | $5.0 \times 10^4$ no stain | $5.0 \times 10^4$ no stain | $2.5 \times 10^4$ no stain |

As Table 2-6 clearly shows, the lithographic printing plate precursors of Examples 2-7 to 2-13 with the use of the polymerizable compositions containing the specific polyurethane compounds according to the invention in the recording layer are superior in printing tolerance, without showing any stain in the nonimage parts, and storage stability to the lithographic printing plate precursors of Comparative Examples 2-3 and 2-4 free from the specific polyurethane resin.

Examples 2-14 to 2-22, Comparative Examples 2-5 and 2-6

(Formation of Undercoat Layer)

On the same support as in Example 2-1, an undercoat layer made of a liquid composition (a sol solution) of the SG method prepared by the following manner was formed.

<Sol Solution Composition>

| | |
|---|---:|
| methanol | 130 g |
| water | 20 g |

-continued

| | |
|---|---|
| 85% by mass phosphoric acid | 16 g |
| tetraethoxysilane | 50 g |
| 3-methacryloxypropyltrimethoxysilane | 60 g |

The above sol solution composition was mixed by stirring. After about 5 minutes, heat generation was observed. After reacting for 60 minutes, the reaction mixture was transferred into another container and 3000 g of methanol was added to give a sol solution.

This sol solution was diluted with methanol/ethylene glycol (9/1 by mass) and coated to the same support as in Example 2-1 to give a coating dose (in terms of Si) of 30 mg/m² on the support. After drying at 100° C. for 1 minute, an undercoat layer was formed.

(Formation of Recording Layer)

A coating solution for the recording layer 2-3 of the following composition was prepared and coated to the aluminum support, which had been undercoated as described above, by using a wire bar. Then it was dried at 115° C. for 45 seconds by a hot air dryer to form a recording layer. After drying, the coating dose was from 1.2 to 1.3 g/m². Next, the same coating solution for the overcoat layer as in Example 2-1 was coated by using a slide hopper and dried at 120° C. for 75 seconds by a hot air dryer. After drying, the coating dose of the overcoat layer was from 2.3 g/m².

<Coating Solution for Recording Layer 2-3>

| | |
|---|---|
| component (A'): specific polyurethane compound (compound listed in Table 2-7) | 2.00 g |
| component (B): radical initiator (compound listed in Table 2-7) | 0.35 g |
| component (D): polymerizable compound "M-1" | 2.00 g |
| component (C): infrared absorbing agent (compound listed in Table 2-7) | 0.08 g |
| Victoria Blue naphthalenesulfonate | 0.04 g |
| fluorine-type surfactant (Megafac F-176, manufactured by Dainippon Ink and Chemicals Inc.) | 0.01 g |
| methyl ethyl ketone | 9.0 g |
| methanol | 10.0 g |
| 1-methoxy-2-propanol | 8.0 g |

The radical initiators (S-4) to (S-6) employed in Examples and Comparative Examples have the following structures.

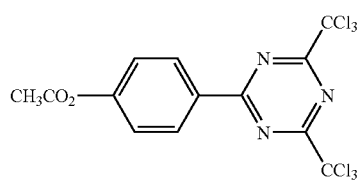
(S-4)

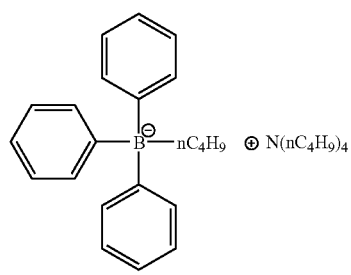
(S-5)

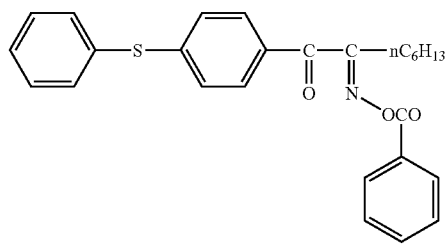
(S-6)

The infrared absorbing agents (IR-2) to (IR-3) employed in Examples and Comparative Examples have the following structures.

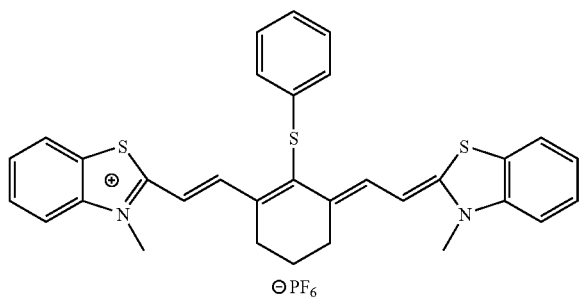
(IR-2)

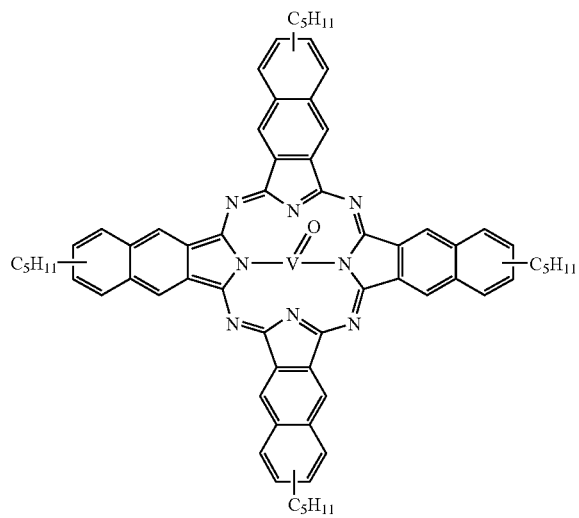
(IR-3)

(Exposure and Development)

The obtained negative lithographic printing plate precursors was exposed by using infrared lasers and developed as in Example 2-1 to give a lithographic printing plate.

[Evaluation of Stain Resistance in Non-image Part and STORAGE Stability]

The photosensitive lithographic printing plates thus obtained were subjected to the evaluation of sensitivity as in Example 2-1.

Moreover, the photosensitive lithographic printing plates thus obtained were subjected to the evaluation of stain resistance in non-image parts (storage stability) as in Example 2-7. Table 2-7 summarizes the results.

TABLE 2-7

| | Component (A') | Component (B) | Component (C) | Sensitivity (mJ/cm$^2$) | No forced time course | 3 days at 60° C. | 3 days at 45° C., 75% RH |
|---|---|---|---|---|---|---|---|
| Ex. 2-14 | 10 | S-2 | IR-1 | 40 | 10.0 × 10$^4$ no stain | 10.0 × 10$^4$ no stain | 10.0 × 10$^4$ no stain |
| Ex. 2-15 | 10 | S-4 | IR-1 | 40 | 8.0 × 10$^4$ no stain | 8.0 × 10$^4$ no stain | 8.0 × 10$^4$ no stain |
| Ex. 2-16 | 10 | S-4 | IR-2 | 40 | 8.5 × 10$^4$ no stain | 8.5 × 10$^4$ no stain | 8.5 × 10$^4$ no stain |
| Ex. 2-17 | 10 | S-5 | IR-3 | 45 | 8.5 × 10$^4$ no stain | 8.5 × 10$^4$ no stain | 8.5 × 10$^4$ no stain |
| Ex. 2-18 | 10 | S-6 | IR-1 | 40 | 8.0 × 10$^4$ no stain | 8.0 × 10$^4$ no stain | 8.0 × 10$^4$ no stain |
| Ex. 2-19 | 14 | S-2 | IR-1 | 38 | 12.0 × 10$^4$ no stain | 12.0 × 10$^4$ no stain | 12.0 × 10$^4$ no stain |
| Ex. 2-20 | 21 | S-2 | IR-1 | 38 | 10.0 × 10$^4$ no stain | 10.0 × 10$^4$ no stain | 10.0 × 10$^4$ no stain |
| Ex. 2-21 | 9 | S-2 | IR-1 | 38 | 11.0 × 10$^4$ no stain | 10.0 × 10$^4$ no stain | 11.0 × 10$^4$ no stain |
| Ex. 2-22 | 3 | S-2 | IR-1 | 45 | 8.0 × 10$^4$ no stain | 8.0 × 10$^4$ no stain | 8.0 × 10$^4$ no stain |
| C. Ex. 2-5 | P-2 | S-4 | IR-1 | 50 | 6.0 × 10$^4$ no stain | 6.0 × 10$^4$ no stain | 3.5 × 10$^4$ no stain |
| C. Ex. 2-6 | P-1 | S-4 | IR-2 | 55 | 3.0 × 10$^4$ no stain | 3.0 × 10$^4$ no stain | 3.0 × 10$^4$ no stain |

As Table 2-7 clearly shows, the lithographic printing plate precursors Examples 2-14 to 2-22 with the use of polymerizable compositions containing the specific polyurethane resins according to the invention in the recording layer are superior in printing tolerance and stain resistance, without showing any stain in non-image parts, as well as storage stability to the lithographic printing plate precursors of Comparative Examples 2-5 and 2-6 free from the specific polyurethane resin.

Examples 2-23 to 2-26, Comparative Example 2-7

(Formation of Undercoat Layer)

The same aluminum support as in Example 2-1 was treated with silicate to ensure hydrophilic nature in non-image parts of the printing plate. The treatment was carried out by passing an aluminum web through a 1.5% aqueous solution of No. 3 sodium silicate maintained at 70° C. while controlling the contact time to 15 seconds, followed by washing with water. The coating dose of Si was 10 mg/m$^2$. The center line surface roughness (Ra) of the support thus constructed was 0.25 μm.

(Formation of Recording Layer)

A coating solution for the recording layer 2-4 of the following composition was prepared and coated to the aluminum support, which had been undercoated as described above, by using a wire bar. Then it was dried at 115° C. for 45 seconds by a hot air dryer to form a recording layer. After drying, the coating dose was from 1.2 to 1.3 g/m$^2$. Next, the same coating solution for the overcoat layer as in Example 2-1 was coated by using a slide hopper and dried at 120° C. for 75 seconds by a hot air dryer. After drying, the coating dose of the overcoat layer was from 2.3 g/m$^2$.

<Coating Solution for Recording Layer 2-4>

| | |
|---|---|
| component (A'): specific polyurethane compound (compound listed in Table 2-8) | 2.10 g |
| component (B): radical initiator "S-1" | 0.40 g |
| component (D): polymerizable compound "M-2" | 1.80 g |
| component (C): infrared absorbing agent "IR-1" | 0.06 g |
| sensitization aid "Z-1" | 0.08 g |
| Victoria Blue naphthalenesulfonate | 0.04 g |
| fluorine-type surfactant (Megafac F-176, manufactured by Dainippon Ink and Chemicals Inc.) | 0.01 g |
| methyl ethyl ketone | 9.0 g |
| methanol | 10.0 g |
| 1-methoxy-2-propanol | 8.0 g |

The resin (P-3) corresponding to the component (A') employed in Comparative Example has the following structure.

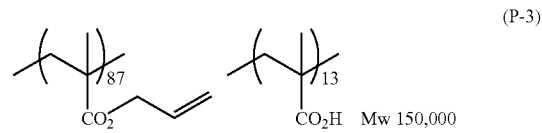

(P-3)

The sensitization aid (Z-1) employed in Examples and Comparative Example has the following structure.

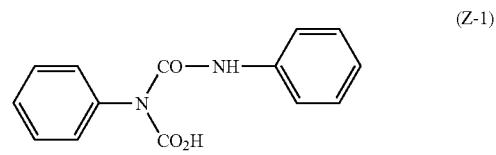

(Z-1)

(Exposure and Development)

The obtained negative lithographic printing plate precursors were each exposed by using infrared lasers and developed as in Example 2-1 to give a lithographic printing plate.

[Evaluation of Printing Tolerance and Sensitivity]

The photosensitive lithographic printing plates thus obtained were subjected to the evaluation of printing tolerance and sensitivity as in Example 2-1. Table 2-8 summarizes the results.

TABLE 2-8

| | Component (A') | Sensitivity (mJ/cm$^2$) | Printing tolerance (×10$^4$ sheets) |
|---|---|---|---|
| Ex. 2-23 | 1 | 70 | 8.5 |
| Ex. 2-24 | 5 | 65 | 8.3 |
| Ex. 2-25 | 7 | 55 | 9.0 |
| Ex. 2-26 | 12 | 50 | 9.2 |
| C. Ex. 2-7 | P-3 | 110 | 4.2 |

As Table 2-8 clearly shows, the lithographic printing plate precursors of Examples 2-23 to 2-26 with the use of the polymerizable compositions containing the specific polyurethane resins according to the invention in the recording layer are superior in printing tolerance and sensitivity to the lithographic printing plate precursor of Comparative Example 2-7 free from the specific polyurethane resin.

According to these Examples, it is understood that the polymerizable composition according to the another embodiment of the invention containing the polyurethane resin, which is soluble or swellable in water or an aqueous alkali solution and has a hydroxyl group and an unsaturated carbon-carbon bond in its side chain, is excellent in sensitivity, printing tolerance and storage stability. Thus, itis useful as the recording layer of lithographic printing plate precursors.

This application is based on Japanese Patent application JP 2003-204915, filed Jul. 31, 2003, and Japanese Patent application JP 2003-284335, filed Jul. 31, 2003, the entire contents of which are hereby incorporated by reference, the same as if set forth at length.

What is claimed is:

1. A lithographic printing plate precursor comprising a support and a recording layer, the recording layer containing:
   (A) a polyurethane compound soluble or swellable in water or an aqueous alkali solution which is obtained by reacting at least one polyolefin diol compound having an unsaturated bond in a main chain and having a molecular weight of 500 or more with at least one polyisocyanate compound; and
   (B) a radical initiator.

2. The lithographic printing plate precursor according to claim 1, wherein the recording layer further containins (D) a polymerizable compound.

3. The lithographic printing plate precursor according to claim 1, wherein the polyurethane compound (A) has 0.4 meq/g or more of a carboxyl group in its side chain.

4. The lithographic printing plate precursor according to claim 1, wherein the at least one polyolefin diol compound is selected from the group consisting of a polybutadiene diol and a polyisoprene diol.

5. A polymerizable composition containing:
   (A) a polyurethane compound soluble or swellable in water or an aqueous alkali solution which is obtained by reacting at least one polyolefin diol compound having an unsaturated bond in a main chain and having a molecular weight of 500 or more with at least one polyisocyanate compound;
   (B) a radical initiator; and
   (C) an infrared absorbing agent.

6. The polymerizable composition according to claim 5, further containing (D) a polymerizable compound.

7. The polymerizable composition according to claim 5, wherein the polyurethane compound (A) has 0.4 meq/g or more of a carboxyl group in its side chain.

8. The lithographic printing plate precursor according to claim 5, wherein the at least one polyolefin diol compound is selected from the group consisting of a polybutadiene diol and a polyisoprene diol.

9. A polymerizable composition containing:
   (A') a polyurethane resin which is soluble or swellable in water or an aqueous alkali solution and has a hydroxyl group and an unsaturated carbon-carbon bond in its side chain; and
   (B) a radical initiator,
   wherein the polyurethane resin (A') is obtained by adding an epoxy compound having an unsaturated carbon-carbon bond to a polyurethane resin having carboxyl group.

10. The polymerizable composition according to claim 9, further containing (D) a polymerizable compound.

11. The polymerizable composition according to claim 9, further containing (C) an infrared absorbing agent.

12. The polymerizable composition according to claim 9, wherein the polyurethane resin (A') has 0.4 meq/g or more of a carboxyl group in its side chain.

* * * * *